US007598751B2

(12) United States Patent
Collins, Jr. et al.

(10) Patent No.: US 7,598,751 B2
(45) Date of Patent: Oct. 6, 2009

(54) IMPEDANCE-BASED ARC FAULT DETERMINATION DEVICE (IADD) AND METHOD

(75) Inventors: Edward Randolph Collins, Jr., Seneca, SC (US); Timothy Lee Smith, Seneca, SC (US); Randall J. Emanuel, Charlotte, NC (US)

(73) Assignees: Clemson University Research Foundation, Clemson, SC (US); Duke Energy Carolinas, LLC, Charlotte, NC (US)

( * ) Notice: Subject to any disclaimer, the term of this patent is extended or adjusted under 35 U.S.C. 154(b) by 218 days.

(21) Appl. No.: 11/838,831

(22) Filed: Aug. 14, 2007

(65) Prior Publication Data

US 2008/0036472 A1 Feb. 14, 2008

Related U.S. Application Data

(60) Provisional application No. 60/837,537, filed on Aug. 14, 2006.

(51) Int. Cl.
*G01R 27/28* (2006.01)
*H02H 3/00* (2006.01)
(52) U.S. Cl. ...................................... 324/649; 361/79
(58) Field of Classification Search ................. 324/649; 361/79
See application file for complete search history.

(56) References Cited

U.S. PATENT DOCUMENTS

| 4,517,513 | A | * | 5/1985 | Brown ..................... 324/117 R |
|---|---|---|---|---|
| 6,449,568 | B1 | * | 9/2002 | Gerrish ........................ 702/60 |
| 6,466,031 | B1 | * | 10/2002 | Hu et al. ..................... 324/522 |
| 7,164,275 | B2 | | 1/2007 | Gasperi |
| 7,200,500 | B2 | * | 4/2007 | Larsson et al. ................ 702/64 |
| 7,526,392 | B2 | * | 4/2009 | Gasperi et al. ................ 702/60 |

OTHER PUBLICATIONS

Gasperi, et al.; "Method for AC Powerline Impedance Measurement"; IEEE 2007; pp. 1-4.

* cited by examiner

*Primary Examiner*—Vincent Q Nguyen
*Assistant Examiner*—Jeff Natalini
(74) *Attorney, Agent, or Firm*—Ballard Spahr Andrews & Ingersoll, LLP

(57) ABSTRACT

Embodiments according to the present invention provide an Impedance-based Arc-Fault Determination Device (IADD) and method that, when attached to an electrical node on the power system and through observations on voltage, current and phase shift with a step load change, determine the effective Thevenin equivalent circuit or Norton equivalent circuit at the point of test. The device and method determine the expected bolted fault current at the test location of interest, which enables calculation of incident energy and the assignment of a flash-hazard risk category.

36 Claims, 35 Drawing Sheets

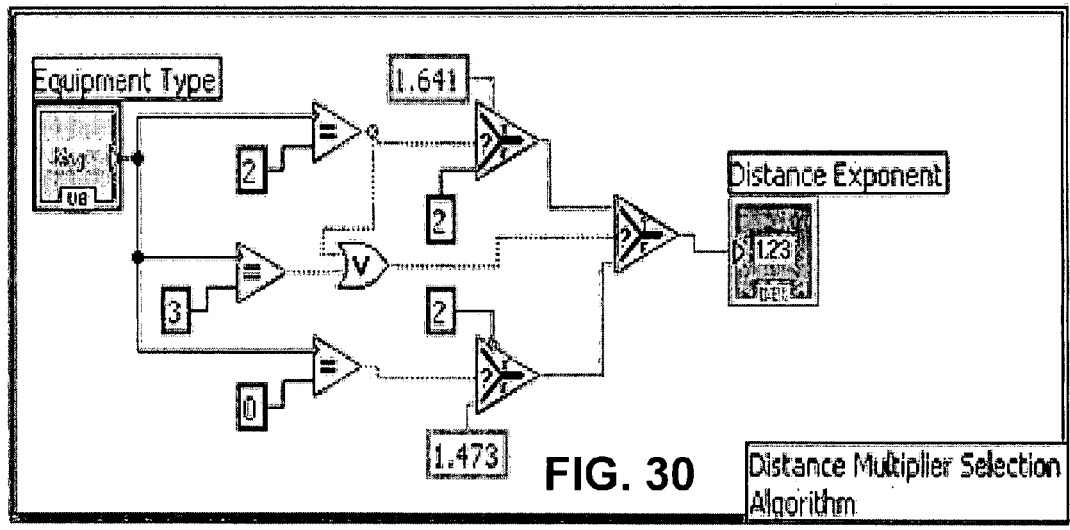
FIG. 30 Distance Multiplier Selection Algorithm
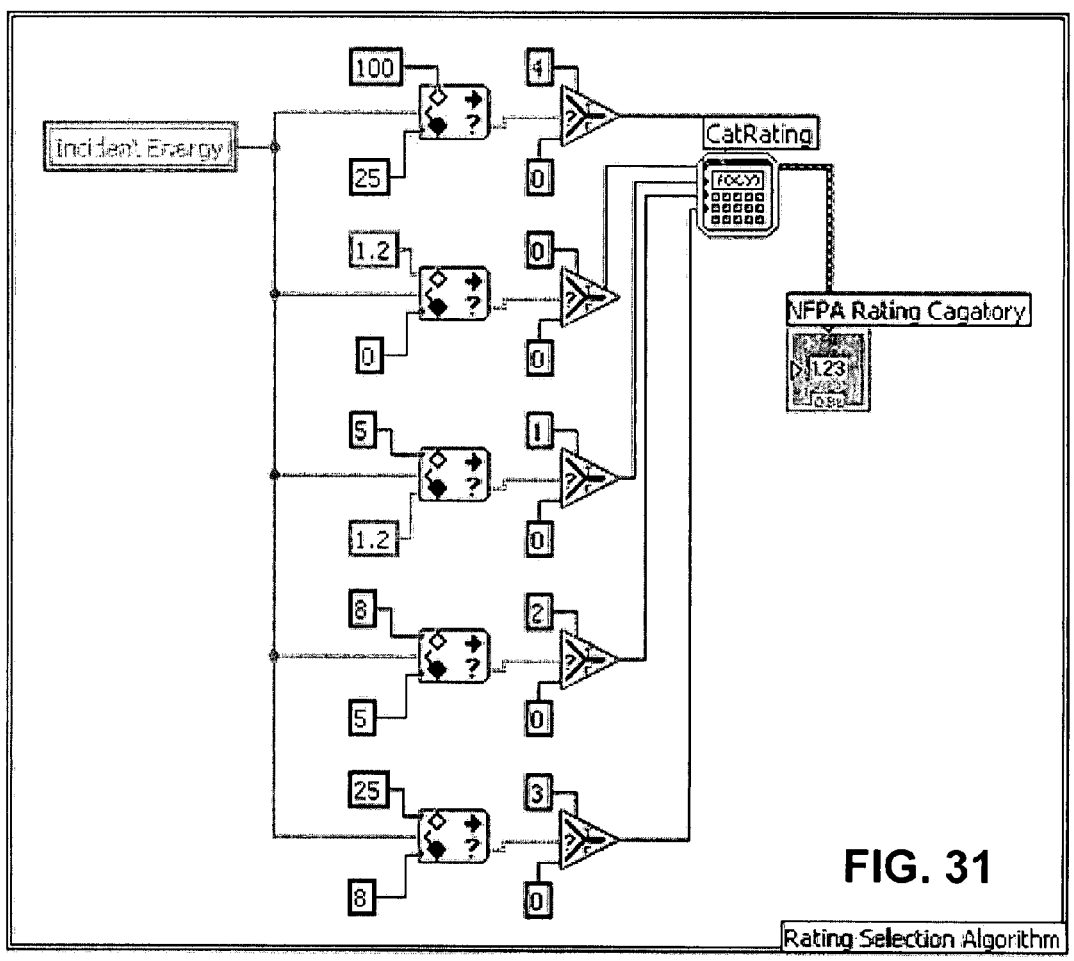
FIG. 31 Rating Selection Algorithm

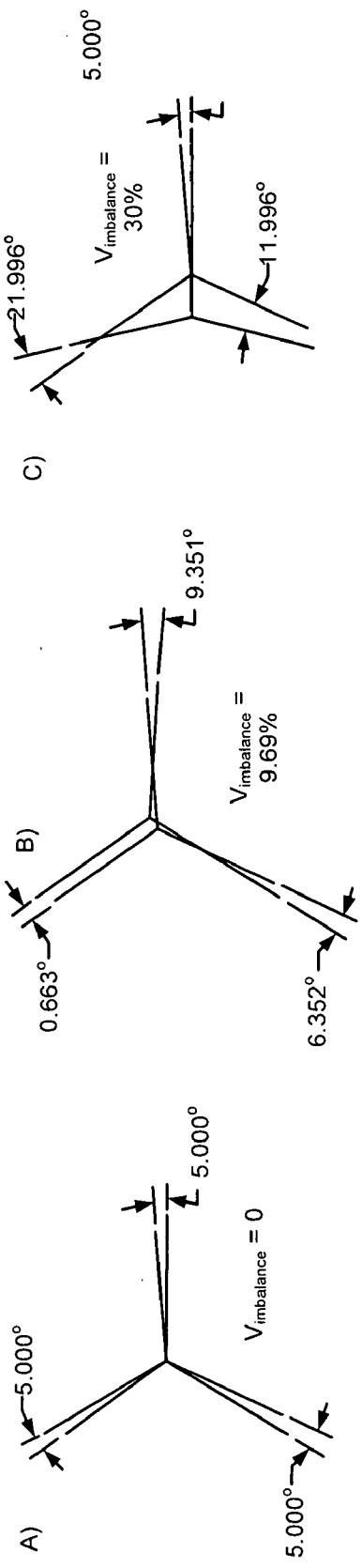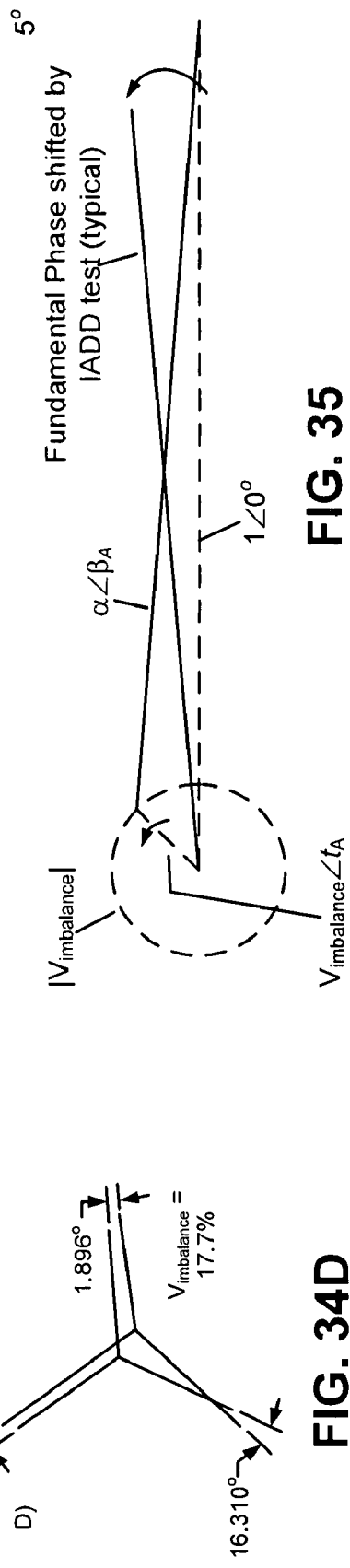
FIG. 34A
FIG. 34B
FIG. 34C
FIG. 34D
FIG. 35

IMPEDANCE-BASED ARC FAULT DETERMINATION DEVICE (IADD) AND METHOD

CROSS REFERENCE TO RELATED PATENT APPLICATIONS

This application claims priority to U.S. Provisional Application No. 60/837,537 filed Aug. 14, 2006, which is herein incorporated by reference in its entirety.

BACKGROUND

Between five and 10 times a day, an arc flash explosion occurs in electric equipment in the United States that sends a burn victim to a special burn center, according to statistics compiled by CapSchell, Inc., a Chicago-based research and consulting firm that specializes in preventing workplace injuries and deaths.

In response to these statistics and the obvious detrimental affects of arc fault incidents on workers, in the United States the Occupational Safety and Health Administration (OSHA) has begun enforcing recommendations by the National Electric Code (NEC) and National Fire Protection Association (NFPA) regarding employee safety procedures when work on energized systems must be performed. Admittedly, it is preferable and mandated that, when possible and practical, electrical systems are to be worked on in a zero energy state (ZES). However, this condition does not exist under all circumstances and sometimes work on energized systems is necessary.

The 2000 release of the NFPA's 70E document, incorporated herein by reference, recommended the use of personal protective equipment (PPE) based on the potential for exposure to heat energy radiated by electric arcs. NFPA 70E specifies the need for proper personal protective equipment (PPE), in all conditions where there is a possibility of harm induced due to electrical arcing. Previously, electric shock was thought to be the primary and most frequent type of injury sustained when working with electrical systems. A recent study conducted by the National Institute for Occupational Safety and Health on injuries sustained during work with electrical components points to the fact that a significant portion, approximately 40 percent, of these injuries were due to arc flash; an arc flash exposure may result in severe burns to the skin and, in some cases, death.

Burns are sustained due to exposure to a heat source, in this case the heat radiated from an electrical arc. Arcs have temperatures of around 35,000 degrees F. (19500° C.). Distance plays a role in the degree to which injury is sustained. The amount of energy absorbed by the skin at any given time is a function of the temperature of the heat source and the distance from this source to exposed skin. In this case, incident energy is typically calculated in cal/cm$^2$. An energy density of 1.2 cal/cm$^2$ is sufficient exposure to result in second degree burns on exposed human skin.

In 2002, the NEC 70-2002 document, incorporated herein by reference, further expanded on this requirement by mandating that all electrical services that can be accessed while energized be labeled with the hazard category as defined by the NFPA. However, neither document has yet to specify the method by which these values are to be calculated. In response to this fact, the Institute of Electrical and Electronic Engineers (IEEE), in 2004, issued Standard 1584, fully incorporated herein by reference and made a part hereof. IEEE 1584 gives the electric power industry a way to gauge arc-flash hazards. It lets designers and facility operators determine arc-flash hazard distance and how much incident energy employees might be exposed to when they work on or near electrical equipment. These calculations form the basis for re-engineering systems to reduce incident energy to manageable levels or to provide guidance for the appropriate level of personal protective equipment (PPE) to be worn while working on or near energized equipment.

As stated previously, the NFPA 70E document requires calculation of arc fault incident energy but neither provides or specifies any one method of determining this value. Several methods of determining arc fault incident energy have been proposed and are acceptable methods, as defined by the NFPA. These methods include the IEEE 1584, NFPA 70E, Lee's Calculation, ARCPRO by Kinetrics of Toronto, and the Duke Heat Flux Calculator, by Duke Energy. The IEEE Standard, Duke Heat Flux, and NFPA 70E use equations developed from empirical testing, while the Lee paper and ARCPRO use equations based on theoretical analysis.

Article 130 of the NFPA 70E document, incorporated herein by reference, details the requirements for establishment of boundaries for safe working under live circuit conditions.

The IEEE 1584 standard is only one of several methods of calculating potential arc fault incident energy, but is widely used in the industry. The variables used in the IEEE calculations can be readily obtained with some knowledge of enclosure geometry, wire spacing, and fault duty; also, the IEEE standard has been tested and validated for a wide range of conditions. It specifies that the Lee equations should be used for voltages above 15 kV. The calculations consider three-phase arcs in enclosures and in air. The standard is applicable for input ranges for voltage of 208 to 15,000 volts, bolted fault current of 700 A to 106 kA, equipment enclosures of commonly available sizes, and gaps between conductors of 13 mm to 152 mm (0.5 to 6 inches). The equations were developed from curve fitting of results of values measured from testing performed by the standard's working group. Several general conclusions resulting from their testing were found. System X/R (reactance/resistance) ratio, system frequency, and electrode material had little or no effect. Instead, the incident energy depends primarily on arc current. The buss gap (arc length) is only a small factor in the final result.

The IEEE 1584 standard outlines nine procedural steps in determining arc fault incident energy:

1. Collect the system and installation data
2. Determine the system modes of operation
3. Determine the bolted fault currents
4. Determine the arc fault currents
5. Find the protective device characteristics and duration of the arcs
6. Document the system voltages and classes of equipment
7. Select the working distances
8. Determine the incident energy for all equipment
9. Determine the flash-protection boundary for all equipment The document states that by far, the majority of the work in completing an arc flash assessment is in the collection of system and installation data (step 1). This singular step is expected to account for fully one-half of all the effort in performing such a study. Obtaining the fault duty at a particular electric node can be difficult to determine. Often, wiring diagrams for electrical installations are outdated or lacking necessary information, such as wire size or feeder length, or the drawings may be incorrect all together. Rotating loads and varying generation, particularly near the node of interest can also have major effects on fault duty and is time varying in nature. The majority of remaining analytical work is contained in steps 2 and 3.

Many entities are currently not compliant with OSHA regulations concerning arc-flash assessments and documentation. Previously, OSHA has taken a lenient stand on this issue because methods for determining boundaries as defined the NFPA have only recently been developed. However, now that the IEEE 1584 standard has been accepted as a viable method of performing these assessments, OSHA has begun vigorously enforcing these requirements to better protect workers from this hazard.

By effectively skipping steps one and two of the nine step procedure outlined by the IEEE, a significant source of manpower, time and money can be eliminated from an arc flash assessment. The development of a method to reduce the effort required to reach these end results could radically impact the compliance issues now being faced by most industrial and commercial customers.

OSHA requires all electrical panels under its jurisdiction to be labeled to indicate the appropriate amount of PPE required while working inside of the panel with it energized. Currently, OSHA code requires that all employers make an effort to investigate the potential for injury due to arc flash; noncompliance with this directive may result in monetary penalties and liability in the event of an accident. This new requirement has prompted an influx in the awareness of the potential damage as a result of arc flash and consequently is forcing engineers to find ways to determine the appropriate level of protection required in each case. Companies may spend millions of dollars on arc flash assessment surveys and currently only a very limited number of entities are providing these assessments because of the high cost in manpower and time.

There exist few methods for establishing the potential for exposure to arc flash energy that are currently available. The classical method of obtaining fault current is to determine fault current capacity from information based on power system information.

$$I_{Fault\text{-}duty} = \frac{V_{Nominal}}{Z_{Service\text{-}Impedance}}$$

Typically the electric utility company that supplies a site with electrical power can give service impedance based on fault duty calculations and system models. IEEE 1584 specifies that "available fault data must be realistic; not conservatively high." The document goes further to offer the following reasons for this requirement:

"Available bolted fault currents should be determined at the point of each potential fault. Do not use overly conservative bolted fault current values. A conservatively high value may result in lower calculated incident energy than may actually be possible depending on the protective device's time-current curves. The lower results would be caused by using a faster time-current response value from the protective device's time-current curve."

Overestimating fault current can be dangerous for the simple reason that protective devices often have an inverse or extremely inverse time curve. This means that the length of time before operation is inversely proportional to the amount of current flowing through the fuse. For example, using a fuse with a current rating of 200 A and an arc of 1 kA would blow in 0.5 seconds whereas an arc of 500 A would blow in 9 seconds. The first condition results in a delivery of 500 A-s (coulombs) of electric charge and the second results in an exposure of 4500 A-s of electric charge. Therefore, the likelihood of significant bodily injury due to incident energy exposure may be greater under the lower arc fault condition. Following this reasoning, conservatively high arc fault duty estimations may result in underestimating the potential for exposure to incident energy if protection curves are taken into account; protection data is one of the parameters taken into account in the IEEE 1584 calculations.

Another method of performing arc fault assessment include a detailed analysis of the system in conjunction with specialized computer software to simulate and make determinations of arc flash incident energy potential. To adequately complete such an analysis, an effective power system impedance is once again assumed at the service to the site of interest. This type of analysis goes a step further to include all wires sizes and lengths, protection equipment, and enclosure types for the system. This data can then be entered into the appropriate analysis program and results obtained. While this method is valid and has a high degree of accuracy, it tends to be time and labor intensive, leading to large costs for compliance. Also, in many cases, one-line diagrams for an industrial site are out-dated and do not contain modifications that have been completed over the years. Incorrect drawings may result in incorrect estimates on arc-fault potential due to errors in fault duty.

One recent paper has been presented in the IEEE Transactions on Power Systems that suggests an alternate method of obtaining bolted arc fault potential. "Using a Microprocessor-Based Instrument to Predict the Incident Energy From Arc-Flash Hazards" by Baldwin, Hittel, Saunders, and Renovich, suggests the application of current injection at varying frequencies to obtain impedance values; frequency modulation of the current signal quite accurately yields an X/R ratio and application of Ohm's Law will yield the impedance modulus. To obtain accurate results, current levels in the 30 amp range are specified to mitigate the effects of power system noise. This implies that a significant amount of power may be required, particularly on higher voltage systems.

Therefore, what is needed is a device and method that overcomes many of the challenges in the art, some of which are presented above.

SUMMARY

Provided herein are embodiments of a device and method that can accurately and correctly predict the expected bolted fault current at the test location of interest. Embodiments of the device and method apply a known load and measure the change in RMS and instantaneous voltage due to the step increase in loading conditions and the phase shift in the voltage waveform as a result of the change in loading conditions at the test node. Subsequently, the load current is measured to more accurately determine the real time load imposed upon the system. With knowledge of the load impedance, an accurate equivalent Thevenin or Norton system along with resistive and reactive parameters and X/R ratio can be derived through a series of mathematical calculations. Then, using the derived equivalent circuit, an accurate estimate of the fault duty can be obtained.

One aspect describes a test device comprised of a load bank; voltage measurement circuitry and devices; current measurement circuitry and devices; relaying and switching devices; and data acquisition, measurement and control devices comprising at least one processor and a memory operably connected with said voltage measurement circuitry and devices, current measurement circuitry and devices, and relaying and switching devices. The test device is configured to determine a first set of results comprised of at least a first voltage and first current and a first phase angle of an electrical node on an electrical power system and store the first set of results in the memory, operably connect the load bank to the electrical power system at the electrical node using said switching devices and determine a second set of results comprised of at least a second voltage, second current and a second phase angle of said electrical power system at said electrical node, and retrieve the first set of results from the memory and compare the first set of results to the second set of results to determine at least one of an effective Thevenin equivalent circuit or Norton equivalent circuit for the electrical power system.

In another aspect the test device is further configured to store the second set of results in the memory; operably disconnect the load bank from the electrical power system at the electrical node using the switching devices and determine a third set of results comprised of at least a third voltage, third current and a third phase angle of said electrical power system at said electrical node, and retrieve either the first set of results or the second set of results from the memory and compare the third set of results to either the first set of results or the second set of results to determine an effective Thevenin equivalent circuit or Norton equivalent circuit for the electrical power system.

In another aspect, the test device further configured to determine a bolted fault current at the electrical node from the effective Thevenin equivalent circuit or Norton equivalent circuit, determine one or more of resistive and reactive parameters, or an X/R ratio at the electrical node from the effective Thevenin equivalent circuit or Norton equivalent circuit, determine fault incident energy available at the electrical node, and assign a hazard risk category based on the fault incident energy available at the electrical node, where the hazard risk category is determined by the National Fire Protection Association (NFPA) 70E standard.

In another aspect, a testing method is disclosed. The testing method comprises determining a first set of results comprised of at least a first voltage, a first current and a first phase angle of an electrical node on an electrical power system; connecting a load to the electrical power system at the electrical node; determining a second set of results comprised of at least a second voltage, a second current and a second phase angle of the electrical power system at the electrical node; disconnecting the load bank from the electrical power system at the electrical node; determining a third set of results comprised of at least a third voltage, a third current and a third phase angle of the electrical power system at the electrical node from the third voltage and third current; and comparing the first set of results to either the second set of results or the third set of results, or comparing the second set of results to the third set of results to determine at least one of an effective Thevenin equivalent circuit or Norton equivalent circuit for the electrical power system.

The testing method can in various embodiments further comprise determining a bolted fault current at the electrical node from the effective Thevenin equivalent circuit or Norton equivalent circuit; determine one or more of resistive and reactive parameters, or an X/R ratio at the electrical node from the effective Thevenin equivalent circuit or Norton equivalent circuit; determining fault incident energy available at the electrical node; assigning a hazard risk category based on the fault incident energy available at the electrical node.

Another aspect according to the present invention comprises a computer program product for determining arc fault energy in an electrical power system. The computer program product comprises at least one computer-readable storage medium having computer-readable program code portions stored therein, the computer-readable program code portions comprising a first executable portion for receiving a first set of results comprised of at least a first voltage, a first current and a first phase angle determined by the first executable portion from the first voltage and first current of an electrical node on an electrical power system; a second executable portion for receiving a second set of results comprised of at least a second voltage, a second current and a second phase angle determined by the second executable portion from the second voltage and second current of the electrical power system at the electrical node after connecting a load to the electrical power system at the electrical node; a third executable portion for receiving a third set of results comprised of at least a third voltage, a third current and a third phase angle determined by the third executable portion from the third voltage and third current of the electrical power system at the electrical node after disconnecting the load to the electrical power system at the electrical node; a fourth executable portion for comparing the first set of results to either the second set of results or the third set of results, or comparing the second set of results to the third set of results to determine at least one of an effective Thevenin equivalent circuit or Norton equivalent circuit for the electrical power system; and a fifth executable portion for determining a bolted fault current at the electrical node from the effective Thevenin equivalent circuit or Norton equivalent circuit and determining fault incident energy available at the electrical node.

In various aspects, the computer program product is further configured to determine one or more of resistive and reactive parameters, or an X/R ratio at the electrical node from the effective Thevenin equivalent circuit or Norton equivalent circuit; and assign a hazard risk category based on the fault incident energy available at the electrical node.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, not drawn to scale, which are incorporated in and constitute a part of this specification, illustrate embodiments and together with the description, serve to explain the principles of the methods and systems:

FIG. 8A shows a DAQ card, which includes the eight independent A/D converters, amplifiers and memory modules and FIG. 8B shows a BNC connection port that takes analog signals from shielded coaxial cables to a data cable that interfaces with the DAQ card;

FIG. 30 is an illustration of an exemplary algorithm to select values for variable x based on equipment type;

FIG. 31 is an illustration of an exemplary algorithm to determine NFPA rating category based on calculated incident energy;

FIGS. 34A, 34B, 34C, 34D depict the neutral shift caused in the load resistance due to imbalance, for four possible scenarios of 0, 9.69%, 30%, and 17.79% load phase-to-neutral voltage imbalance, respectively.

FIG. 35 depicts the phase A condition where neutral shift plays a factor in the overall determination of calculated phase shift as determined by the IADD;

DETAILED DESCRIPTION

Figure 1A:
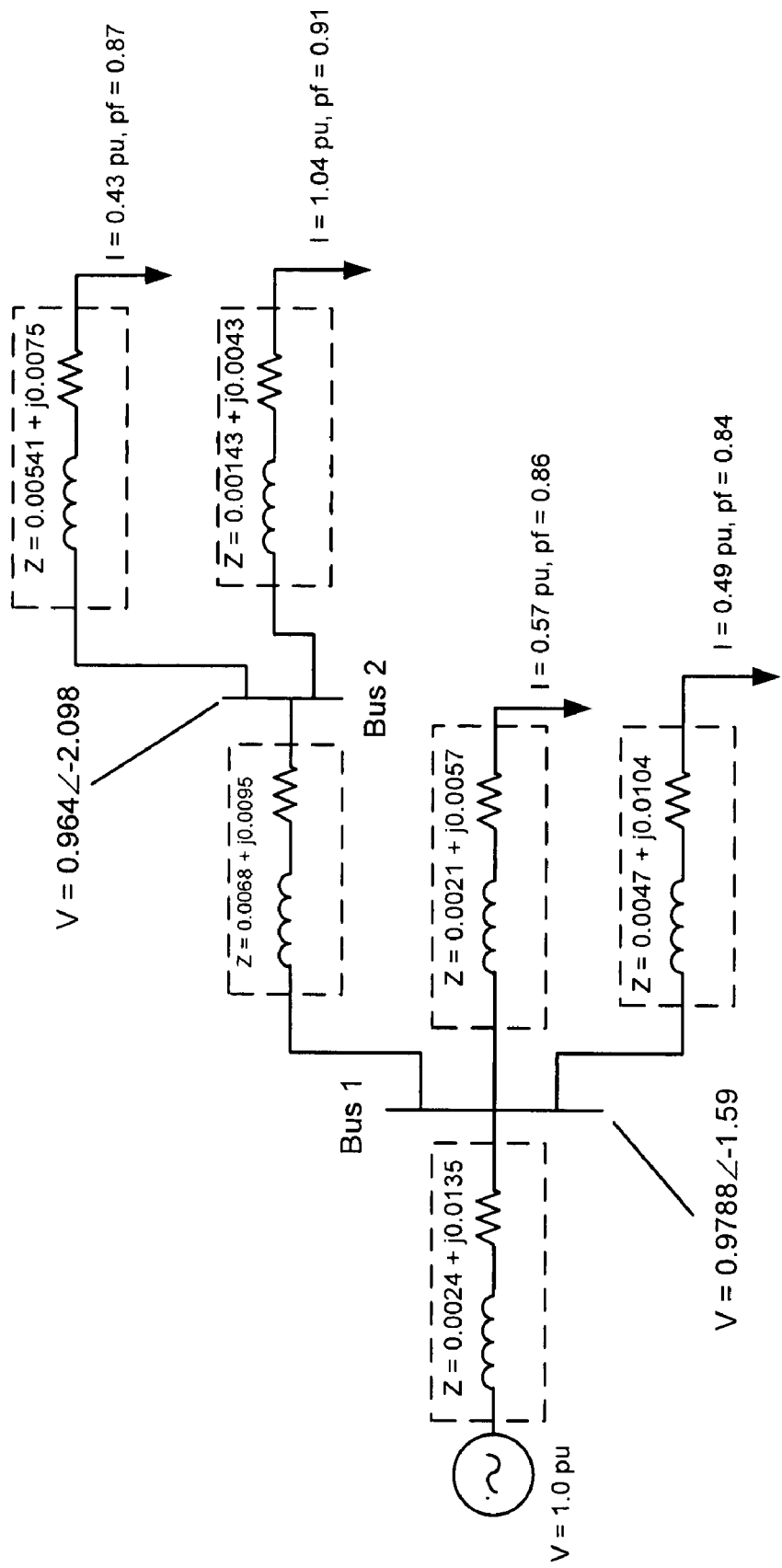
FIG. 1A shows a typical electrical system with a single point of generation and four loads drawing current with specified magnitude and power factor, and computed voltages at Busses 1 and 2.

Before the present methods and systems are disclosed and described, it is to be understood that the methods and systems are not limited to specific synthetic methods, specific components, or to particular compositions, as such may, of course, vary. It is also to be understood that the terminology used herein is for the purpose of describing particular embodiments only and is not intended to be limiting.

Definitions

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

"Exemplary" means "an example of" and is not intended to convey an indication of a preferred or ideal embodiment.

Arc Fault Incident Exposure Energy: The amount of energy received at a surface, as a direct result of an electrical arc, as measured by the temperature rise on copper calorimeters.

Calorie: An energy measurement used to characterize the amount of arc flash energy which is required to cause a second degree (blister burn) on human skin. Without protection, according to the Stoll Curve, it takes about 1.2 cal/cm$^2$ to cause a second degree burn.

Bolted Fault Current: The condition that exists when maximum energy transfer occurs between two points of differing voltage, having little or no arcing resistance.

Equivalent Generation: Combining all points of electric generation into one Thevenin voltage source.

Frequency Bin: A band of frequencies of a specific width. This term is most often applied to signals processed by a Fast Fourier Transform (FFT) because frequency bands of equal width are partitioned by the FFT algorithm.

Hall Effect: The Hall Effect refers to the potential difference (Hall voltage) on opposite sides of a thin sheet of conducting or semiconducting material in the form of a 'Hall bar' (or a van der Pauw element) through which an electric current is flowing, created by a magnetic field applied perpendicular to the Hall element. Edwin Hall discovered this effect in 1879.

In-Test Mode: A mode of operation for the IADD. In-Test Mode refers to the test step in which current is flowing through the load bank and the IADD induced voltage drop and phase angle shift on the measured buss.

Pre-Test Mode: A mode of operation for the IADD. Pre-Test Mode refers to the test step in which the Thevenin voltage value is determined and a reference phase angle is established.

Stoll Curve: This is a standard curve, based on heat and time, used by the American Society for Testing Materials (ASTM) to predict the onset of second-degree burn injury. Energies above the Stoll curve would normally produce a second-degree burn. Those below the Stoll curve would normally not produce a second-degree burn.

Triplen Harmonics: Odd Harmonics divisible by three (e.g. 3, 9, 15, 21, 27, 33 . . . ). These harmonics are particularly troublesome in three phase power systems because they remain in phase with one another in each of the three phases, possibly causing resonant coupling between phases and are additive in the neutral or cause circulating currents in the case of a delta configuration.

Introduction

The present methods and systems may be understood more readily by reference to the following detailed description of embodiments and the examples included therein and to the Figures and their previous and following description.

The underlying principle for arc fault detection and the operation of embodiments of the IADD is the ability to determine the Thevenin or Norton equivalent circuit as seen "looking" into the buss at the test location. This equivalent circuit would include the effect of all series and parallel devices connected to the buss, including switchgear, cables, transformers, etc. as well as the networked sources. In general, the Thevenin equivalent impedance can be determined from two conditions: (a) the open circuit voltage, which is the Thevenin voltage source; and (b) the short circuit current in a zero impedance fault at the test location bus. Alternatively, embodiments of the IADD can compute the dual of the Thevenin equivalent circuit, called the Norton equivalent circuit. The Norton equivalent circuit comprises a parallel ideal current source and impedance. The Norton current source is equal to the short circuit current into a zero impedance fault (the so-called "bolted fault current") and the Norton impedance is equal to the Thevenin equivalent impedance.

Defining these values from an intrinsic sense can be challenging. Due to the dynamic nature of the power system, the voltage at any given location in the power grid is always in a state of flux, both in magnitude and phase angle. There are several reasons for voltage fluctuation on the power system including, but not limited to, the amount of generation present on the system as well as voltage regulation devices such as switching power factor correcting capacitors and tap changing transformers. A significant source of voltage variation is the constant changes in loading conditions, particularly large load changes such as motor starting that may cause momentary changes in the RMS voltage. Several strategies can be employed to mitigate the likelihood of error due to voltage/load variation. To minimize the likelihood of error due to voltage variation and changes in loading conditions, the time of a complete test should be minimized such that establishment of baseline voltage data is not skewed when the test load is applied.

The theory of voltage division states that the voltage across any series element is distributed according to the ratio of total series impedance to the impedance of measurement. Therefore, any change in the system results in a change in the observed voltage at any given point, except at the point of equivalent generation, where voltage is assumed to be regulated and constant. This idea is illustrated in FIGS. 1A and 1B.

FIG. 1A shows a typical electrical system with a single point of generation and four loads drawing current with specified magnitude and power factor. Voltages at busses one and two are also displayed in per unit magnitude and phase angle with respect to a reference angle of zero at the generator. FIG. 1B shows the addition of another load, in this case the addition of the IADD device during the in-test mode, according to an embodiment of the present invention, that draws current at a unity power factor and effects both the voltage magnitude and phase angle at buss two.

Figure 1B:
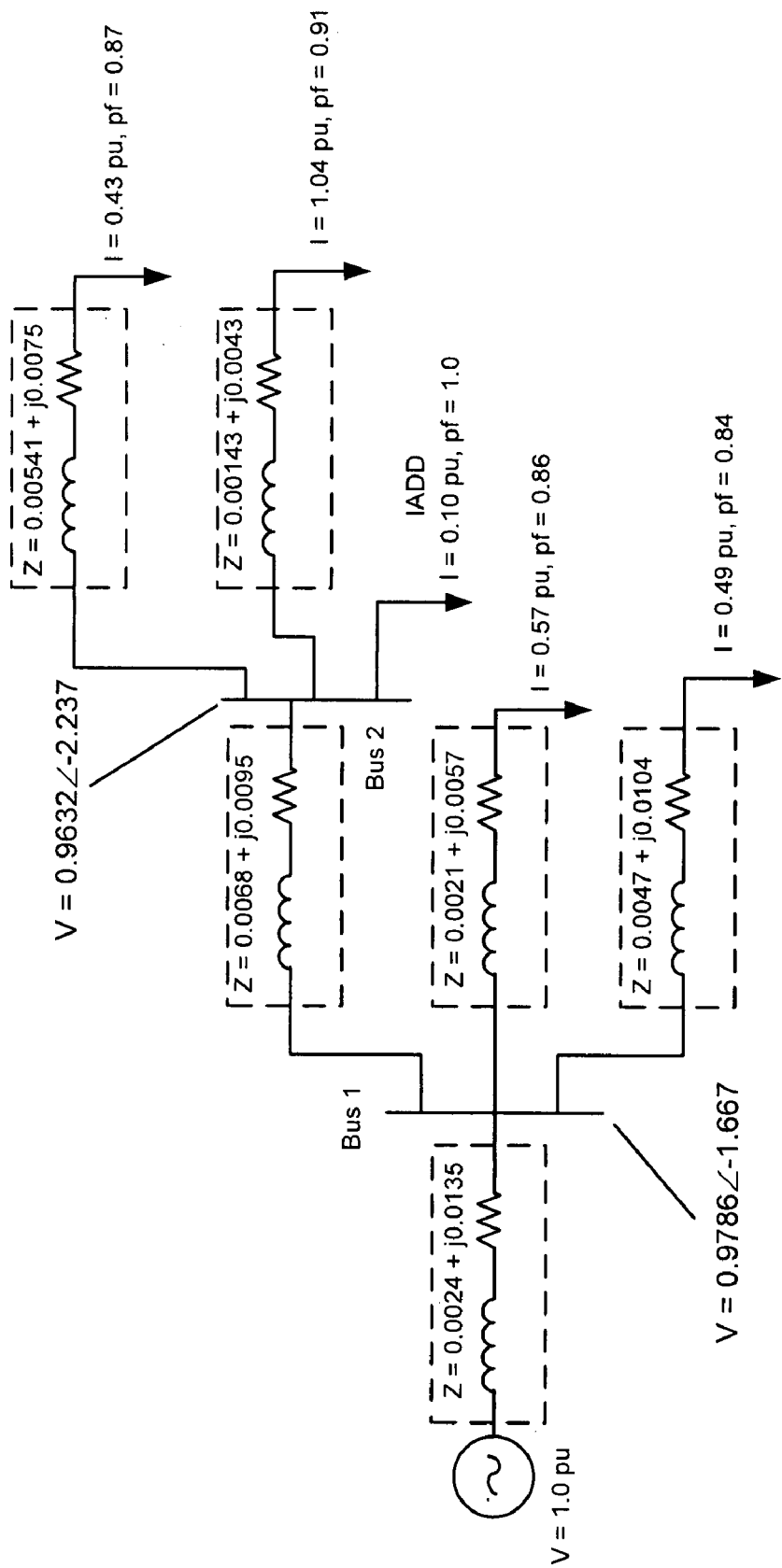
FIG. 1B shows the addition of another load to FIG. 1A, in this case the addition of the IADD device at Buss 2, according to an embodiment of the present invention, that draws current at a unity power factor and effects both the voltage magnitude and phase angle at Busses 1 and 2.

FIGS. 1A and 1B illustrate the small variations in voltage and phase angle that occur when a step change in loading condition is made on a system. If these variables, voltage magnitude change and phase angle change, can be measured then a determination of the impedance between the test node and the equivalent source can be made. With this information, the bolted fault current at the test node becomes apparent. An embodiment of a device according to the present invention provides for capture of waveforms that can be analyzed for voltage change and phase shift.

Figure 2:
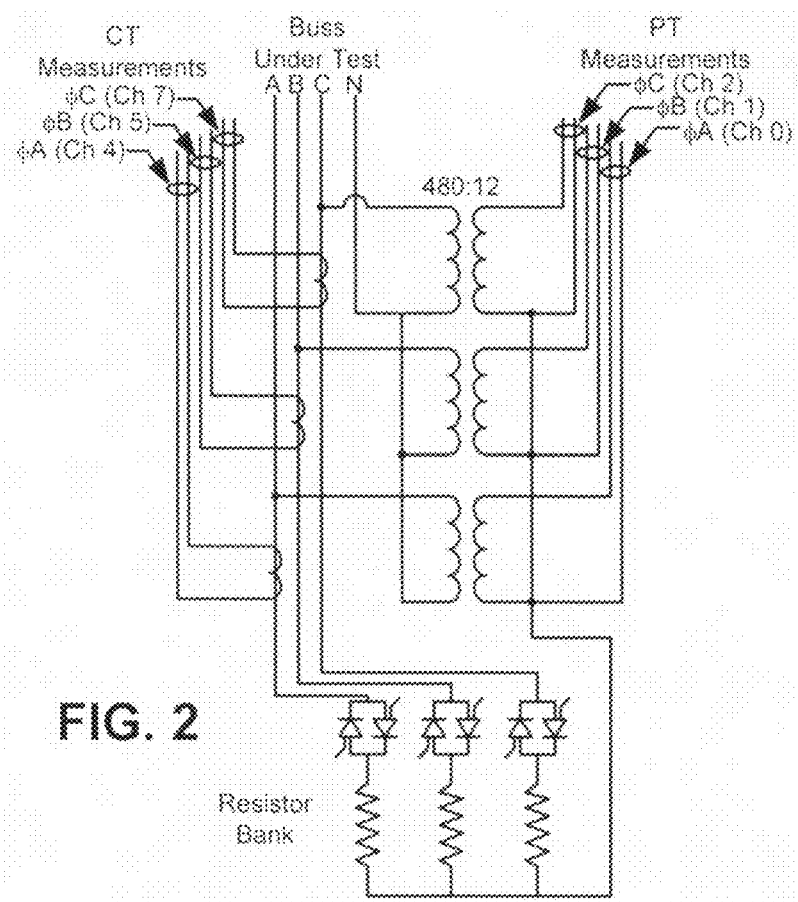
FIG. 2 schematically illustrates an embodiment according to the present invention.

By non-limiting example, FIG. 2 schematically illustrates one embodiment according to the present invention. In the embodiment of FIG. 2, three phase, real-time, voltage and current measurement through magnetically isolated potential transformers (PTs) and current transformers (CT), though other embodiments, for example, may use different components such as optically isolated differential voltage probes. The current transformers are Hall Effect type CTs that have the ability to measure DC offsets present during most transient events. The resistor bank is a modified dynamic braking resistor bank commonly used in adjustable speed motor drives for dissipating energy from a regenerating or overhauling rotating load or other energy source. The resistors are switched in and out of the circuit through three solid state voltage controlled relays with a gate signal provided by the control unit; these are modeled here as two thyristors with bipolar operation. Other embodiments according to the present invention double the current-drawing capacity by adding a second set of solid state relays in parallel with the three shown in FIG. 2 and use a separate digital gating signal that may be selected on demand via user control input, though other switching and/or relaying schemes and devices are contemplated within the scope of the invention. A control system (not shown in FIG. 2) can comprise a personal computer (PC) running, for example, LabView™ development software and integrating an eight channel simultaneously sampling data acquisition (DAQ) card as the principal method of both gathering measurement data and outputting control signals to solid-state relays. LabView™ is a graphical development environment for creating flexible and scalable design, control, and test applications rapidly and at minimal cost as available from National Instruments Corporation (Austin, Tex.). LabView™, is configured to allow users to interface with signals; analyze data for meaningful information; and share results through intuitive displays, reports, and the web, though other software packages or custom-developed software for implementing the algorithms described herein are contemplated within the scope of the embodiments of the present invention.

IADD

Figure 3:
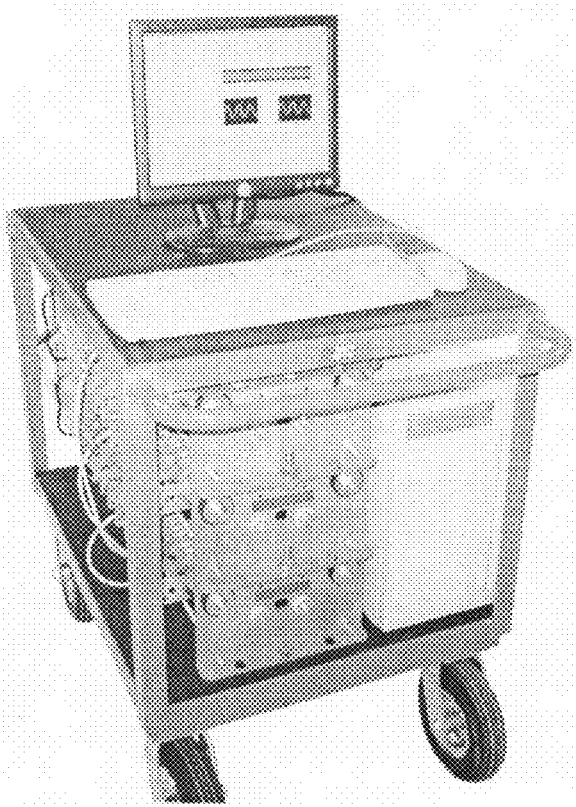
FIG. 3 illustrates an exemplary embodiment of an IADD.

FIG. 3 illustrates an exemplary embodiment of an IADD. The embodiment of FIG. 3 is comprised of a load bank, voltage measurement circuitry and devices, current measurement circuitry and devices, relaying and switching, and data acquisition, measurement and control.

A. Load Bank

Figure 4A:
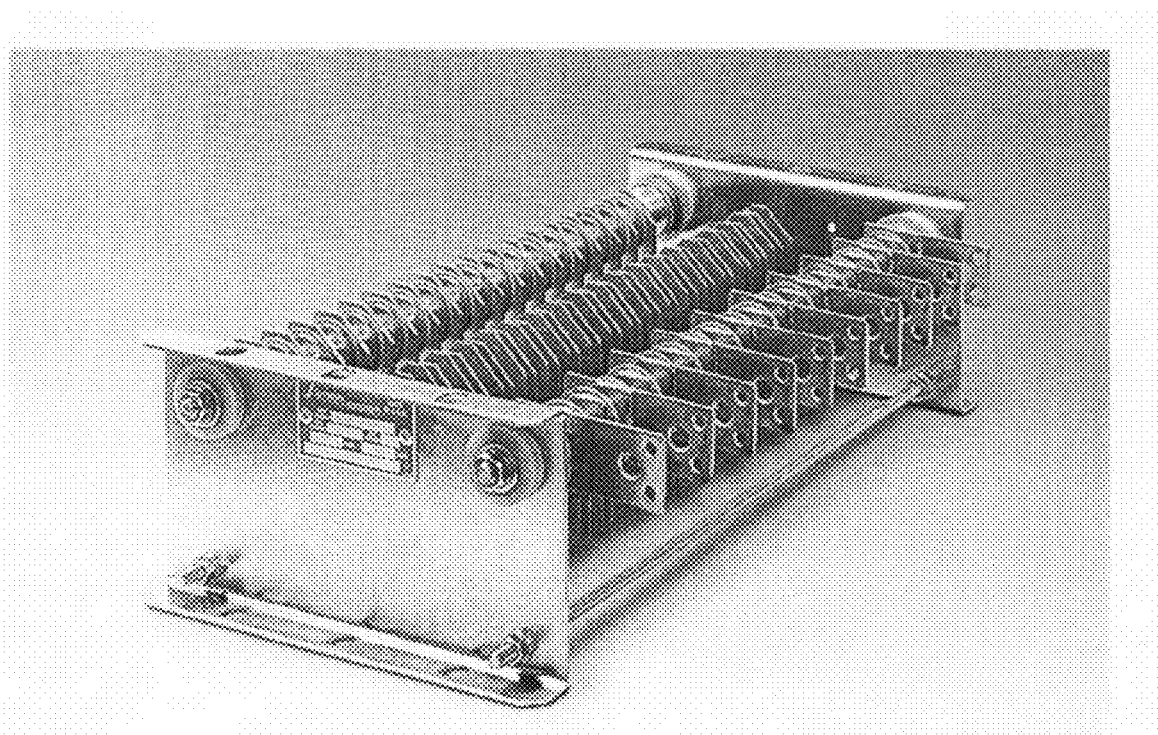
FIGS. 4A and 4B illustrate an exemplary resistive load bank that can be used in embodiments according to the present invention.
Figure 4B:
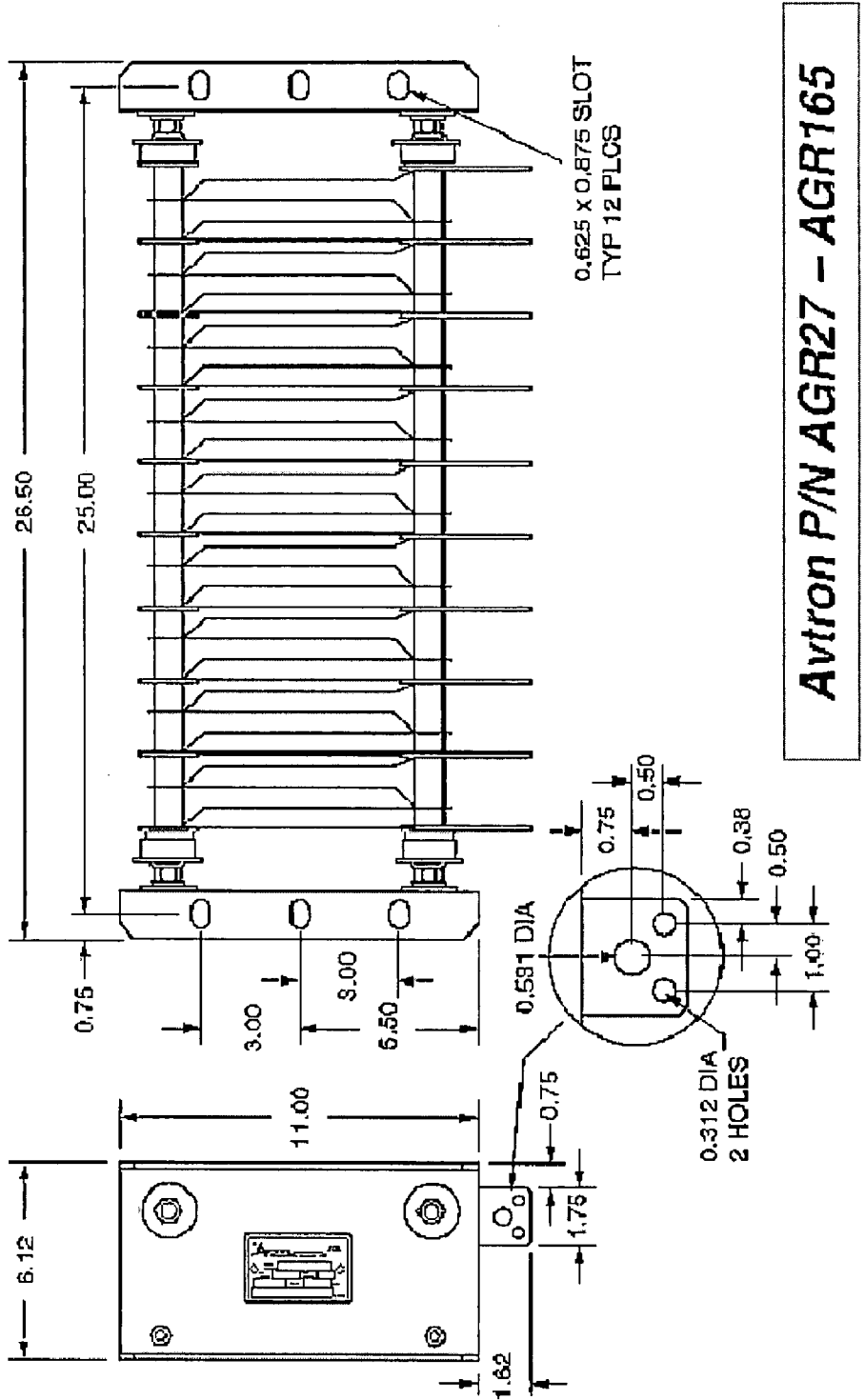

FIGS. 4A and 4B illustrate an exemplary resistive load bank that can be used in embodiments according to the present invention. In one aspect according to the present invention an AGR41 dynamic braking resistor, as available from Avtron Manufacturing, based in Cleveland Ohio, is used. The AGR41 dynamic braking resistor is a tapped resistor, capable of handling 8.3 kW of power continuously, and has a maximum resistance of 5.1 ohms, which allow the resistive load to be used on systems of varying voltage levels. A relatively heavy load can be created by appropriate selection of one of eleven taps on the resistor for the desired load. For instance, on a 600 $V_{l-l}$ system, the phase voltage is approximately 380 $V_{rms}$. A resistance between three or four ohms might be chosen to draw currents of approximately 100 $A_{rms}$. On a 208 V system, a resistance closer to one ohm might be chosen to draw the same amount of current.

The amount of current to be drawn depends on how "stiff" this system is, that is, how much impedance is between the test location and the Thevenin equivalent voltage source. Field tests have shown that, in some instances, the current drawn during testing should be increased based on the parameters of the system and how immune the system is to transient load changes. Generally, the accuracy of the results improves with increases in loading. However, increases in loading cause increases in voltage drop. It is undesirable to cause a voltage drop (a so-called voltage "dip" or "sag") deep enough that either equipment in the facility misoperates or that an undesired power system dynamic results. Voltage drop at or below 5% can be well-tolerated in most situations. A qualitative analysis examining the impact of current drawn to detection accuracy is also examined herein.

Of course, each electrical power system differs resulting in different optimum amounts of current to draw in order to create a measurable change in voltage sag and phase shift. Other embodiments can include a switching scheme that automatically selects the appropriate resistance level based on measured voltage prior to testing.

Figure 5:
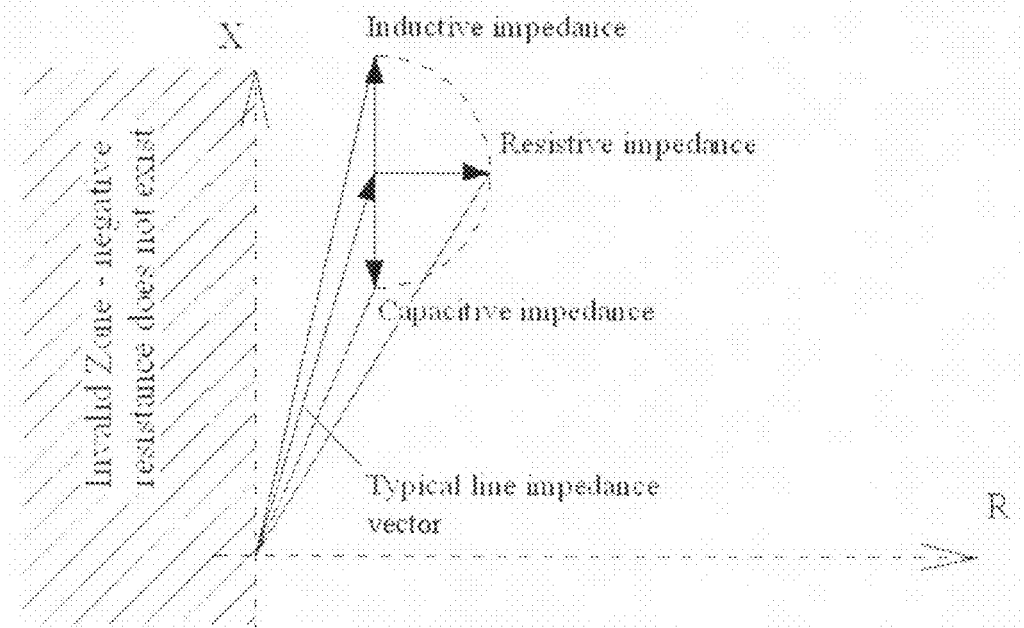
FIG. 5 is an impedance diagram illustrating the effect of various loading conditions on the resultant impedance vector.

Other loads that can be used in various embodiments according to the present invention include inductors, capacitors, and combinations of RL and RC circuits or an induction motor starting (especially one with a high inertia mechanical load). An examination of phasor diagrams is used to illustrate the potential advantages and disadvantages of using such loads. FIG. 5 is an impedance diagram illustrating the effect of various loading conditions on resultant impedance phasor. In FIG. 5, each loading condition offers different results in terms of changes in magnitude and phase angle of the resultant impedance phasor. For instance, both the inductive and capacitive loads offer large changes in impedance magnitude, but only a marginal change in impedance angle. The resistive load, however, changes both the magnitude and phase angle of the resultant phasor significantly. Therefore, in most practical situations, the resistive load facilitates effecting both voltage magnitude and phase angle of the electrical system simultaneously to successfully measure changes in both magnitude and phase angle.

There are some challenges with using a capacitive load due to the potential for exciting resonances between capacitance and natural inductance present in the system. These transient over-voltages can sometimes result in voltage magnitudes twice that of system steady state voltage. Overvoltages may cause measurement error due to A/D saturation, can pose threats to the test equipment as it is rated for 600 $V_{rms}$ as well as for the system itself under certain conditions. Adjustable speed drives might also trip due to over voltage transients and the IADD needs to be able to conduct testing without disturbing a facility's loads.

Since most electrical power system equivalents are dominated with inductive reactance, using a purely inductive load will also be problematic. Although the voltage drop magnitude can be significantly affected, since the drop is closely in-phase with system impedance the changes in phase shift during testing are likely to be small.

It is to be appreciated that any combination of resistance, inductance, and capacitance used as loads is possible, spanning the entire right half side of the impedance domain, and is contemplated within the scope of the present invention. This includes loads such as induction motors which look like a series connected resistance and inductance during starting. This is illustrated by the semi-circle surrounding the impedance fundamental vector in FIG. 5.

B. Voltage Measurement Circuitry

Figure 6:
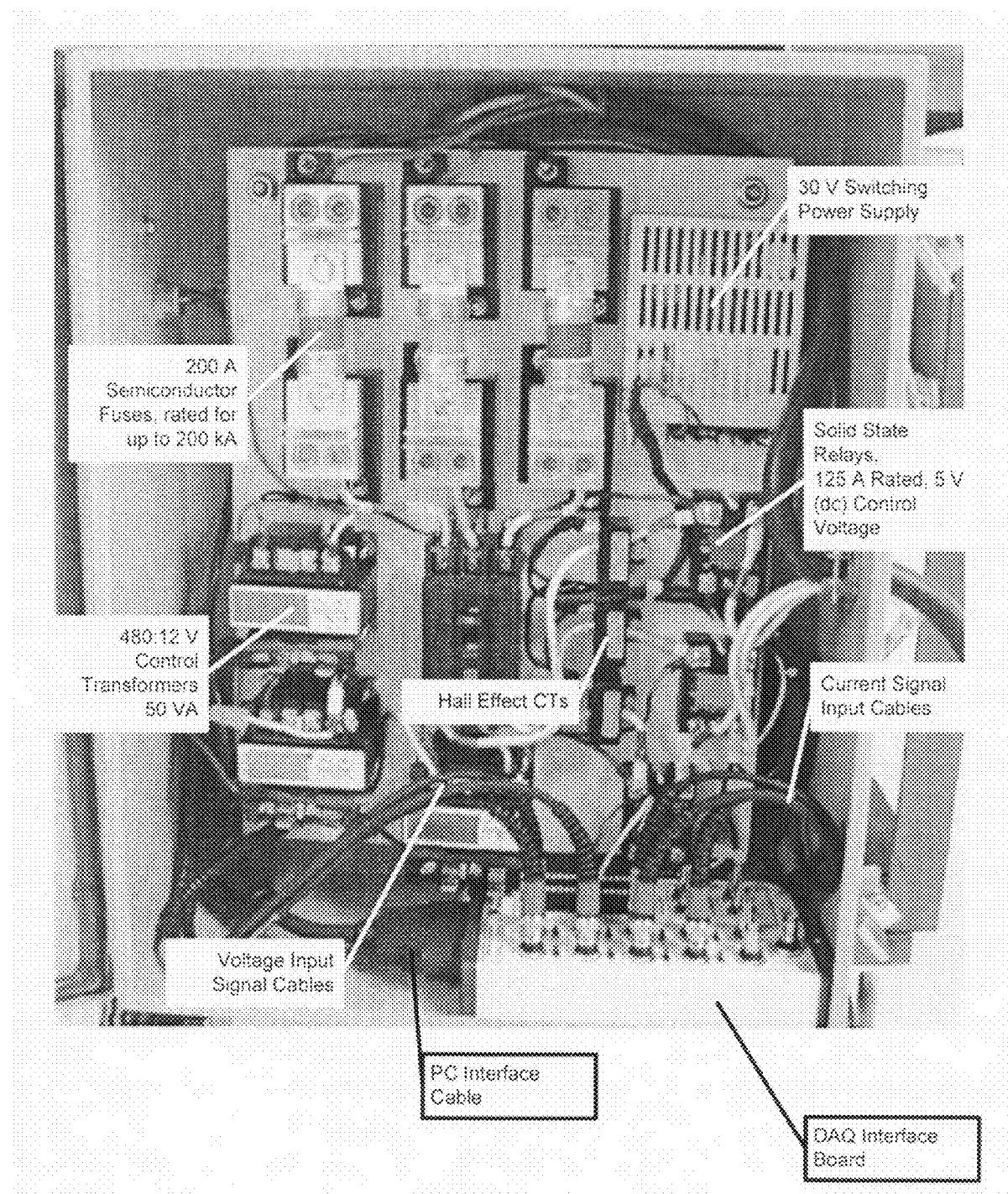
FIG. 6 illustrates an exemplary control cabinet according to an embodiment of the present invention.

In one aspect, voltage waveform information can be obtained through the use of, for example, optically isolated voltage though other voltage detection devices (such as PTs) are contemplated within the scope of this invention, though they may operate in non-linear regions and be susceptible to saturation. FIG. 6 illustrates an exemplary control cabinet according to an embodiment of the present invention.

Figure 7A:
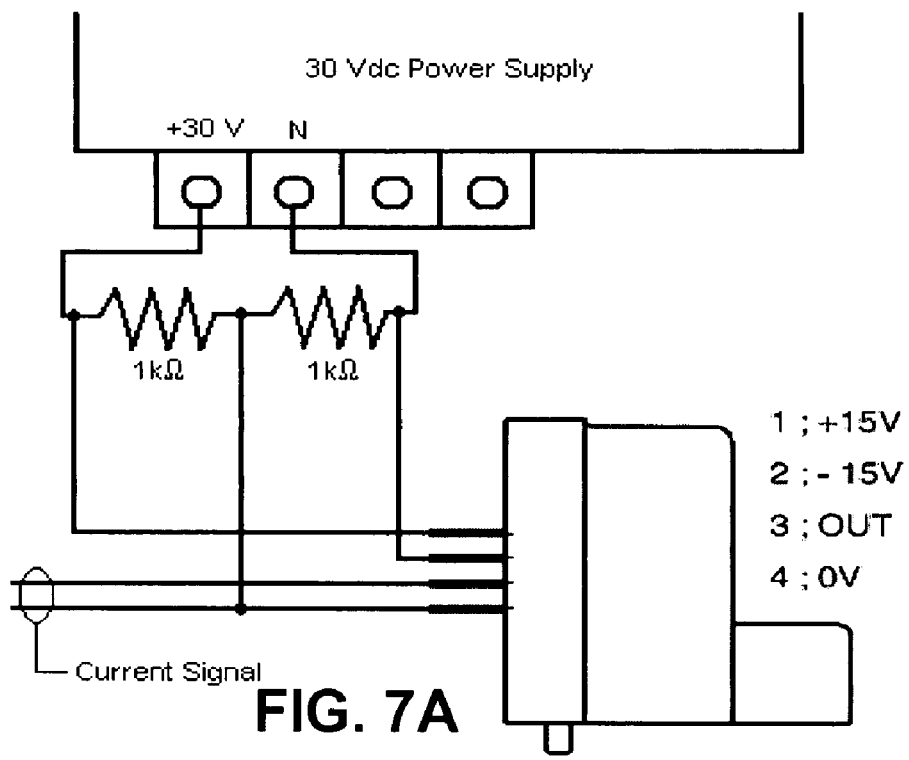
FIG. 7A illustrates two-watt, 1000 Ohm resistors can be placed in series across the output of the power supply and wired to each CT using standard 4-pin connectors.
Figure 7B:
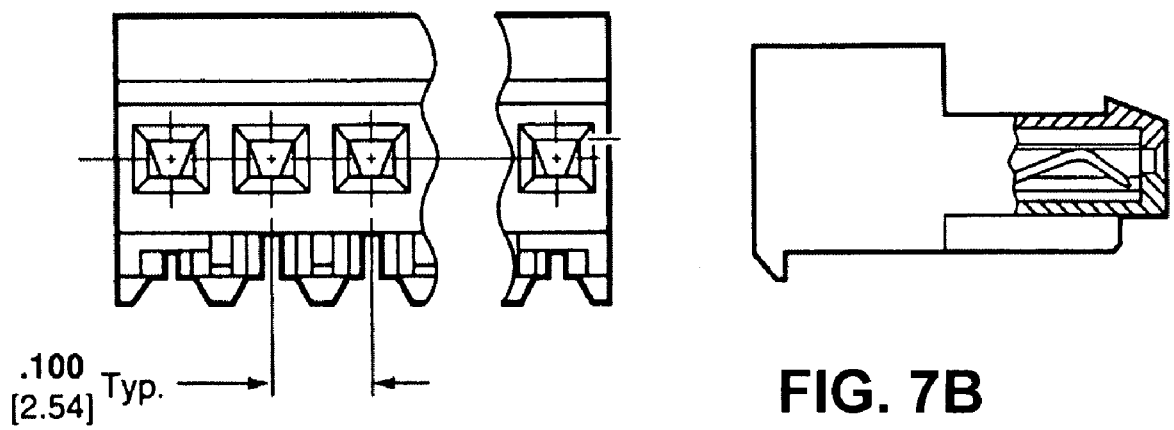
FIG. 7B illustrates wiring diagrams of the CT.

Voltage can be measured in single and poly-phase systems as line-to-line, line-to-neutral, and in a three-phase system, for example, the voltage can be measured either in delta (line to line voltage) or wye (line to neutral voltage) configuration C. Current Measurement Circuitry In one aspect, current measurements are made through the use of three externally powered Hall-effect current transformers (CT) (refer to FIG. 6). For example, a Hall-effect current sensor manufactured by Tamura Corporation (Temecula, Calif.) can be used for this application, though others are also contemplated within the scope of the invention. In one aspect, the CT can be rated for a nominal current of 250 $A_{rms}$, 4 V output, which are linear over the range of anticipated currents and the desired bandwidth. In one aspect, the CTs have good frequency response at 60 Hz, with a −3 dB frequency response at 10 kHz. Current transformers designed for both ac and dc signals measure transverse force on moving charge carriers, typically referred to as the Hall Effect, to measure any variations in DC current. Hall Effect sensors require an external power supply to measure transverse forces. The Tamura CTs utilize positive and negative 15 $V_{dc}$ power to operate. In one aspect, the power requirements can be satisfied by using a single 30 $V_{dc}$ switching power supply that operates on 120 $V_{rms}$. Building a resistive divider creates a phantom neutral that can be used as the reference on all CTs. Two watt, 1000 Ohm resistors can be placed in series across the output of the power supply and wired to each CT using standard 4-pin connectors as shown in FIG. 7A. Wiring diagrams are also shown in FIG. 7B.

D. Relaying and Switching

In one aspect, a Crydom HD60125-10 series solid state relay (SSR) can be used to serve as switches for transferring load during the testing sequence as available from Crydom, Inc. (San Diego, Calif.), though other relays are contemplated within the scope of this invention. These relays have a load current rating of 125 amperes per device and are controlled by a five volt DC signal supplied by the DAQ card. These relays also have a random turn-on feature, which is useful for this application, as all three relays generally turn on at relatively the same point to minimize any transient reaction and provide a balanced load to all three phases whenever possible. The devices can be paralleled, two per phase, to double the ampacity of the device. The added capacity allows for greater latitude in measuring at high power locations. Electromechanical relays are also contemplated within the scope of this invention.

Voltage drop across the solid state relays represents a measurable impedance that would require compensation if voltage measurements were taken downstream of this device. However, by taking voltage measurements upstream of this device, it becomes part of the steady state load. Furthermore, because the voltage distortion is cyclic and consistent in magnitude from cycle to cycle, it does not skew phase angle measurement in a steady state condition. Based on these considerations, there is no need for additional compensation due to the effects of crossover distortion or gated voltage drop are required.

E. Data Acquisition, Measurement and Control

In one aspect, a National Instruments PCI-6123 data acquisition card can be used to sample and capture data (National Instruments Corporation, Austin, Tex.), though other data acquisition cards are contemplated within the scope of this invention. Criteria for selection of a data acquisition card include: simultaneous sampling is desired to minimize phase shift due multiplexing of voltage and current signals on different channels since final calculations are highly susceptible to phase shift; 16-bit precision on sampled values versus 12 or 14 bit options increases the accuracy of readings by a factor of 4 to 16 times; and a sampling frequency sufficiently high to capture all spectral data of interest and further minimize error due to phase shift and quantization error.

Figure 8A:
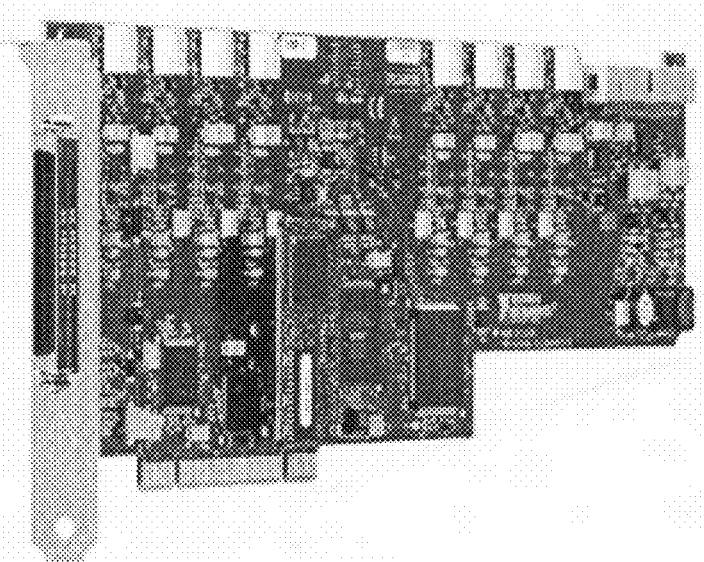
FIGS. 8A and 8B depict images of exemplary data acquisition components.
Figure 8B:
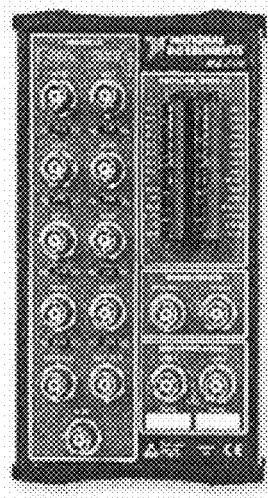

FIGS. 8A and 8B depict images of exemplary data acquisition components. FIG. 8A shows a DAQ card, which includes the eight independent A/D converters, amplifiers and memory modules. FIG. 8B shows a BNC connection port that takes analog signals from shielded coaxial cables to a data cable that interfaces with the DAQ card. In one aspect the data cable can be, for example, a proprietary data cable as available from National Instruments, Inc. Preferably, coaxial cables and BNC connectors are selected for performance in electrically noisy environments; electromagnetic fields that typically couple to signal wires are shielded due to the large current and voltage levels present in the proximity of the measurement devices.

Software for the IADD

In one aspect, development of software for the IADD was accomplished using National Instruments' LabView™ software, though other software packages or custom-developed software are contemplated within the scope of the present invention. In conjunction with the DAQ, signals are processed and analyzed to determine the bolted fault current at the buss of interest. Several components are required to accomplish this task and are discussed in sequence.

In one aspect, the PC can be custom-built to be able to handle large amounts of incoming data efficiently while still having enough processor power to send control signals to switching elements at the proper time. In one aspect, the computer is comprised of a 3.2 GHz dual core Intel™ processor and has a data bus speed of 800 MHz, though other computers are contemplated within the scope of this invention. Other computer aspects are described herein in reference to FIG. 38. In one embodiment, software based timers are used to create control signals that gate the solid state relays and the computer should have sufficient processing capability to implement these timers.

A. GUI

The front panel refers to the Graphical User Interface (GUI) that users see initially when the application is started. Several screens described below present the user with as much information about testing as possible, though it is to be appreciated that these are non-limiting examples of screens that can be used and more, fewer or different screens are contemplated within the scope of the invention.

1. Incident Energy

Figure 9:
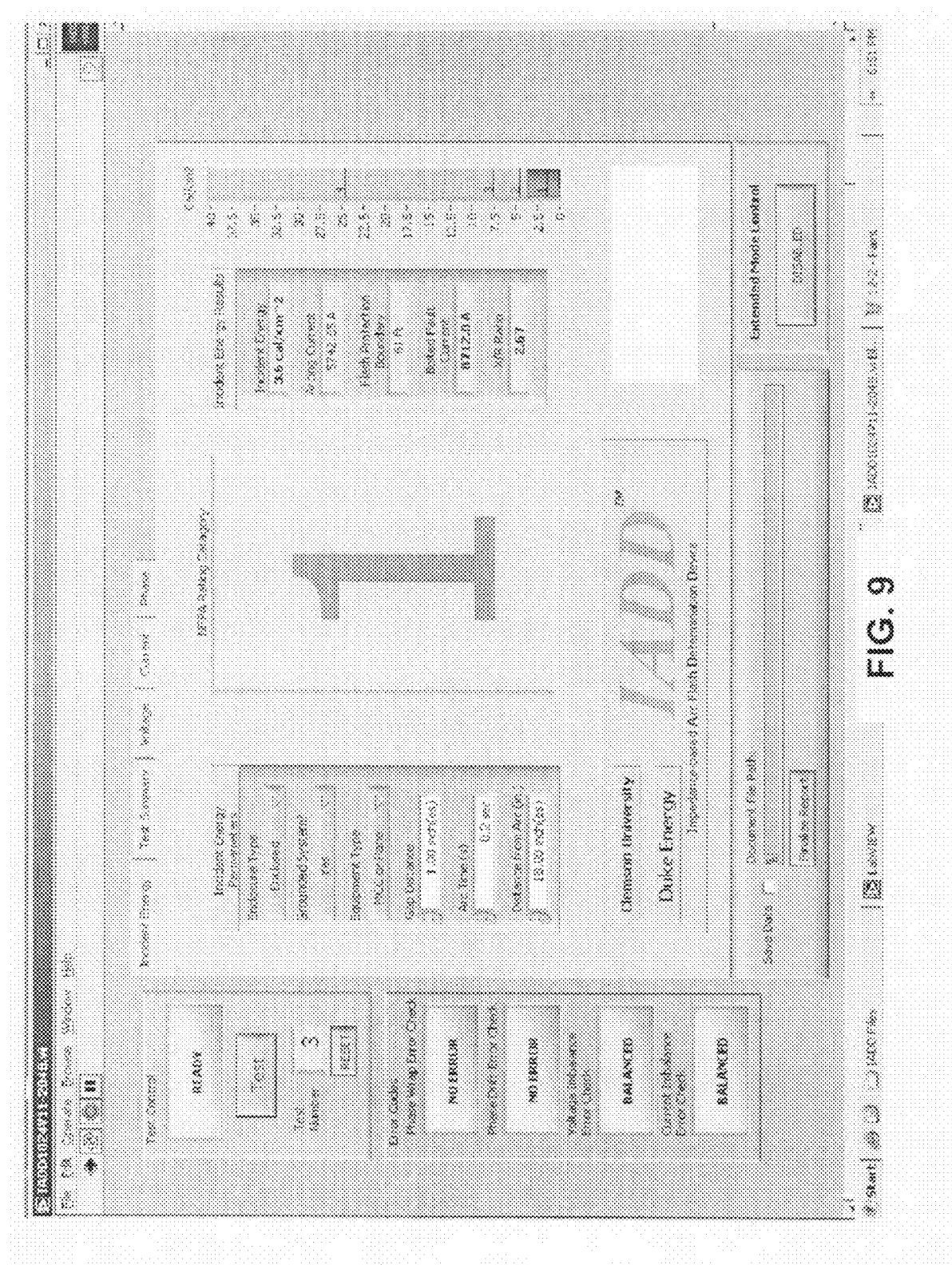
FIG. 9 shows an exemplary Incident Energy screen of the front panel GUI used in an embodiment of the IADD system.

FIG. 9 shows an exemplary screen of the front panel GUI used in an embodiment of the IADD system. The main panel that opens when the program is executed features a large number, centrally located, that represents the NFPA category number previously discussed herein. This number is based on the cal/cm$^2$ found in NFPA 70E, Table 3-3.9.3 for determining personal protective equipment (PPE) hazard risk category, or any replacements thereof, as shown below.

TABLE 3-3.9.3

| | NFPA 70E | |
|---|---|---|
| Category | Cal/cm$^2$ | Clothing |
| 0 | 1.2 | Untreated cotton |
| 1 | 5 | Flame retardant (FR) shirt and FR pants |
| 2 | 8 | Cotton underwear, FR shirt, and FR pants |
| 3 | 25 | Cotton underwear, FR shirt, FR pants, and FR coverall |
| 4 | 40 | Cotton underwear, FR shirt, FR pants, and double-layer switching coat and pants. |

The incident energy exposure in cal/cm$^2$ is given in the upper right hand corner of the screen of FIG. 9 and a graphic representation of this data with respect to category level is given on the right hand side.

By using the equations developed in, for example, IEEE 1584, the category rating is calculated based on bolted fault current and several other variables. These variables are listed under the Incident Energy Parameters menu to the left of the large rating number of FIG. 9. Changing any of these values changes the calculated incident energy and may change the rating category. Additional fields illustrated on FIG. 9 include:

Enclosure Type is a variable used in the incident energy calculations. The user can select either an enclosed or non-enclosed panel configuration. Enclosed Panels can reflect energy off of their surfaces and increase exposure to radiating energy.

Grounded System is a yes or no variable used in arcing current calculations to categorize the system connection type.

Equipment Type is a variable used to categorize the type of system being tested. Certain types of equipment are more robustly constructed and provide lower fault resistance, such as MCCs when compared to an arc occurring in a cable.

Gap Distance is user specified in inches based on the distance between conductors with potential to arc. The arcing distance has a small effect on both arcing current and the amount of energy radiated during an arc.

Arc Time is user specified in seconds based on the type of protection present in the vicinity of test location. As discussed, protection plays a key role in reducing energy exposure levels by reducing the arcing time.

Distance from Arc is user specified in inches based on the type of equipment, voltage level and standard practices used at a test location. For example closer working distances are expected at voltage levels below 600 V when compared to voltages of 4.16 kV.

To the left of the main page of FIG. 9 are the Test Control and Error Codes dialog boxes. Generally, these are always visible while the program is running and allows the user to initiate a test at any time. The large button labeled Test initiates the IADD program and a test is performed. A numeric indicator below the test button indicates what test number has just been performed and serves as a marker if tracking of data is being performed. The test counter can be reset by pressing the button below the counter number. Also, the test number is automatically reset every time the program is terminated or started. The test status indicator as shown in FIG. 9 can be color-coded (e.g., green) and displays "Ready" indicating that the system is ready to test the connected buss. The indicator turns, for example, yellow and display the message "Test in Progress" while the IADD is performing the test and making result calculations. A test typically takes about 3 seconds to complete.

The Error Codes dialog box can be displayed below the Test Control box previously described. This dialog allows the user to determine the validity of the most recent test. The Phase Wrap Error Check determines if an error has occurred due to phase wrap phenomenon, described in more depth herein. If significant voltage or current imbalance is observed during a test sequence, the appropriate indicator changes to, for example, red and messages such as "Voltage Imbalance" or "Check Connection" can be displayed based on the type of error detected. Voltage imbalance errors are triggered by the voltage imbalance calculation discussed in greater detail herein. In the case of current imbalance in the presence of balanced phase voltage, the connections and load taps should be examined and confirmed prior to additional testing.

Capturing data can be accomplished through the dialog box at the bottom of the screen. To save test data, the user checks the box next to 'Save Data'. After the first test is complete, the user is prompted to save the file in a specified location on, for example, the hard drive. Once this location is established, the data capture process is automated. When all tests in a series have been completed, the user has the option to finalize testing, writing all the selected incident energy parameters to the file for later reference. After finalizing the test series, the user is then prompted to start a new test or end the session.

The selection button in the lower left-hand corner of the screen is user selectable and determines whether the IADD will operate in standard or extended mode. In one aspect, the resistor bank can be segregated into two effective load banks by creating a neutral at the center tap of each phase of the resistor bank. Standard mode uses one half of the resistor bank as a load resistor to draw current. When the IADD is used in extended mode, both sides of the load are energizes and current flow is doubled. When operating the IADD in extended mode, it is suggested that cycle time between subsequent tests be increased to allow time for the solid state relay's semiconductor material to cool properly prior to additional test runs. In one aspect, the suggested cycle time for standard mode is one (1) test every thirty (30) seconds. The suggested cycle time for extended mode is one (1) test every sixty (60) seconds.

2. Test Results

Figure 10:
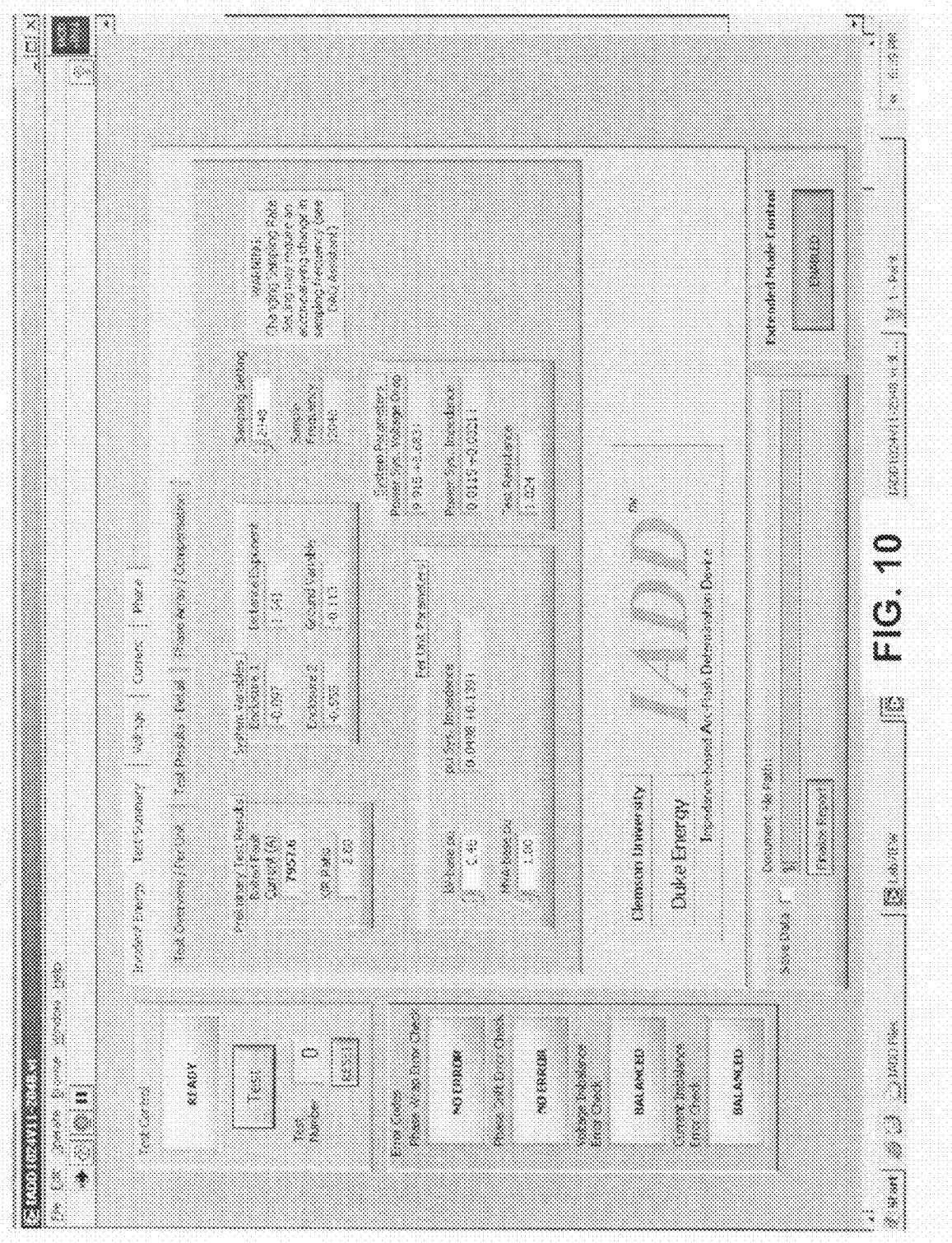
FIG. 10 shown an exemplary Test Summary—Test Overview/Per Unit screen.

An exemplary Test Summary screen as shown in FIG. 10 gives numerical information about the last test conducted. 'Test Overview/Per Unit' is displayed in FIG. 10 and additional test information is provided in Test Results—Detail tab in FIG. 11A and Phase Array/Compensation tab in FIG. 11B.

The Preliminary Test Results box shown in FIG. 10 contains two numeric indicators that present intermediate results of the test, also displayed on the Incident Energy Tab. These indicators display estimated bolted fault current in amps and reactance-resistance ratio (X/R ratio) of the system's Thevenin impedance. Calculations and algorithms used in calculating these values are discussed in detail in the forthcoming subsection.

In the lower left-hand corner of the box titled Per Unit Parameters of FIG. 10, additional calculations are incorporated to determine the per-unit system impedance based on user input values. To obtain these values, the user manually enters the system per-unit voltage base ($V_{base}$) and per-unit power base ($S_{base}$).

In the lower center of the exemplary screen of FIG. 10 is an additional informational box, titled System Parameters. This box provides data about the system that is used in calculating intermediate results: bolted fault current and X/R ratio. Power System Voltage Drop is a complex numeric value that estimates the voltage drop in the power system due to the change in loading conditions. This value is derived from measured values of voltage drop across a known load and observed phase shift of the voltage fundamental. Power System Impedance is a complex numeric value that estimates the power system impedance in terms of resistance and reactance on a 60 Hz base. This value is used to compute the bolted fault current that is possible at the test site. Test Resistance gives information on the resistance calculated by taking a ratio of averaged load voltage to averaged load current during the test. This value should remain relatively constant since the load is resistive; however, some variation may be observed due to heating of the resistor coils and is a function of the duration and frequency of testing.

Some compensation is provided to these values based on the cable leads used to connect the test buss to the IADD. Two modes or time periods are commonly referred to herein Pre-Test mode is the time period prior to switching of the resistive load bank into the circuit while In-Test mode is the time period in which current is flowing through the load bank.

Figure 11A:
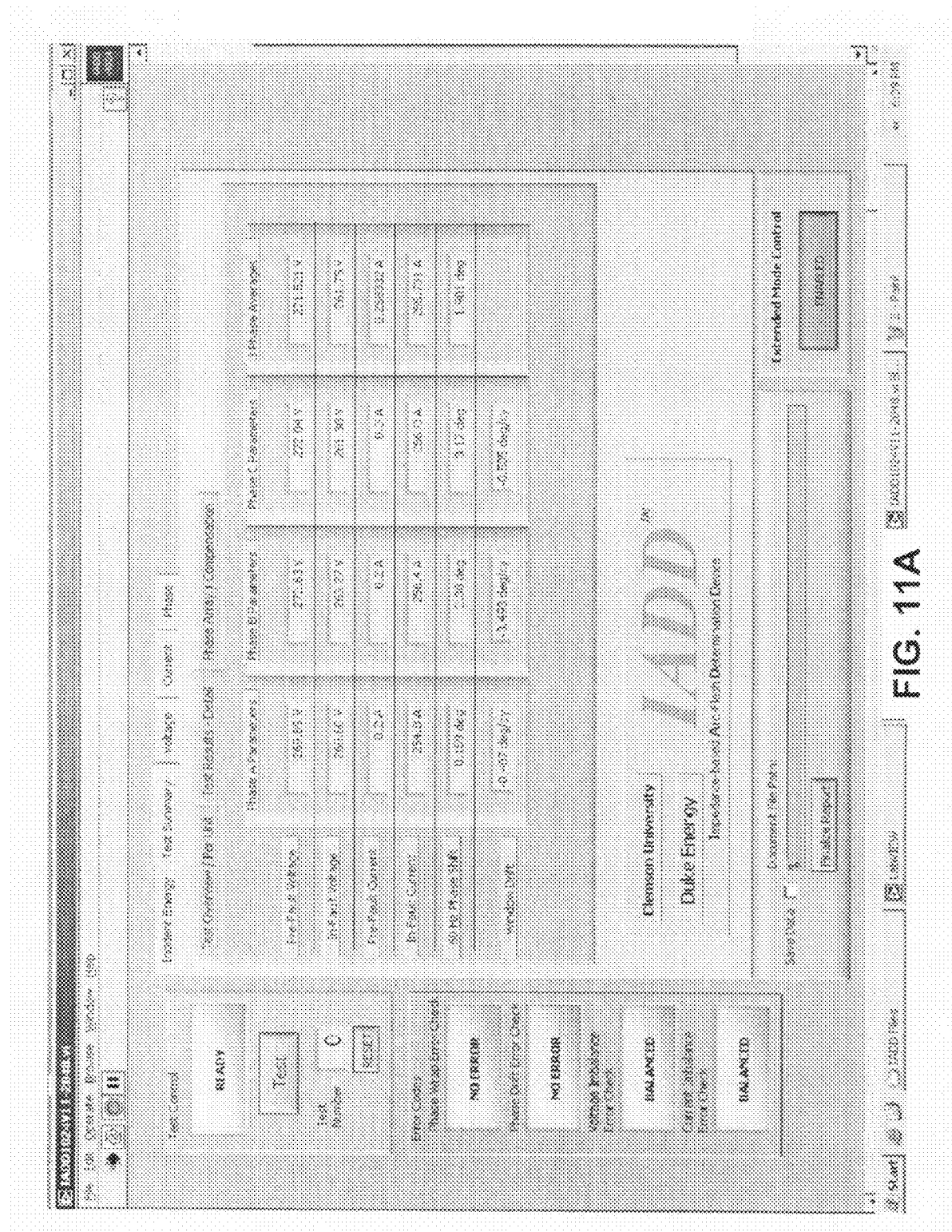
FIG. 11A is an exemplary Test Summary—Test Results—Detail tab screen.

The Test Results—Details tab, depicted in FIG. 11A, displays all measured values taken from each phase of the system. The three phase values are averaged and the calculated value is displayed in the fourth column of the display. Several frequency based measurements are made on the incoming voltage waveforms.

Pre-Test Voltage parameter measures and displays the three phase voltages prior to switching in the resistive load bank. The RMS measurement is made over approximately thirty (30) cycles just before switching in the load in an attempt to mitigate the facility's load switching or cycling on the power system as a source of error due a test sequence. The three phases are then averaged and displayed in the first row, fourth column of FIG. 11A.

In-Test Voltage parameter measures and displays the three phase voltages after switching in the resistive load bank. The RMS measurement is made over a few cycles (e.g., 4-5) after switching for the same reasons applied to Pre-Test Voltage RMS measurements. The three phases are then averaged and displayed in the second row, fourth column of FIG. 11A.

Pre-Fault Current parameter is displayed for test validation purposes and is measured over the same time interval as Pre-Test Voltage parameter.

These values should always be approximately zero, though some variation (less than one-half of an amp) is often observed due to noise inherent in the system and the large gain factor used in signal processing.

In-Fault Current parameter measures and displays the three phase currents after switching in the resistive load bank. The RMS measurement is made over the same time interval as In-Test Voltage parameter. The three phases are then averaged and displayed in the fourth row, fourth column of FIG. 11A.

60 Hz Phase Shift parameter is a measure of the change in phase shift, based on calculations including Window Drift compensation (see below). Accurate phase shift detection is extremely critical in estimating system parameters, particularly X/R Ratio. The method and means of compensation are discussed in detail herein.

Window Drift displays the estimated shift in voltage from the reference phase angle due to sampling frequency imposed during test conditions. Optimal sampling frequency was determined by applying guidelines from National Instruments related to sampling and also by observing the phase shift on a cycle by cycle basis and minimizing this value, resulting in a sampling frequency that most closely coincides with the 60 Hz fundamental to be measured. Because the DAQ system is not synchronized with the power system frequency and is clocked internally, frequency drift may vary with changes in ambient temperature inside of the computer chassis. The Phase Drift Error Check indicator light alters the user if phase drift exceeds, for example, one (1) degree per cycle.

Figure 11B:
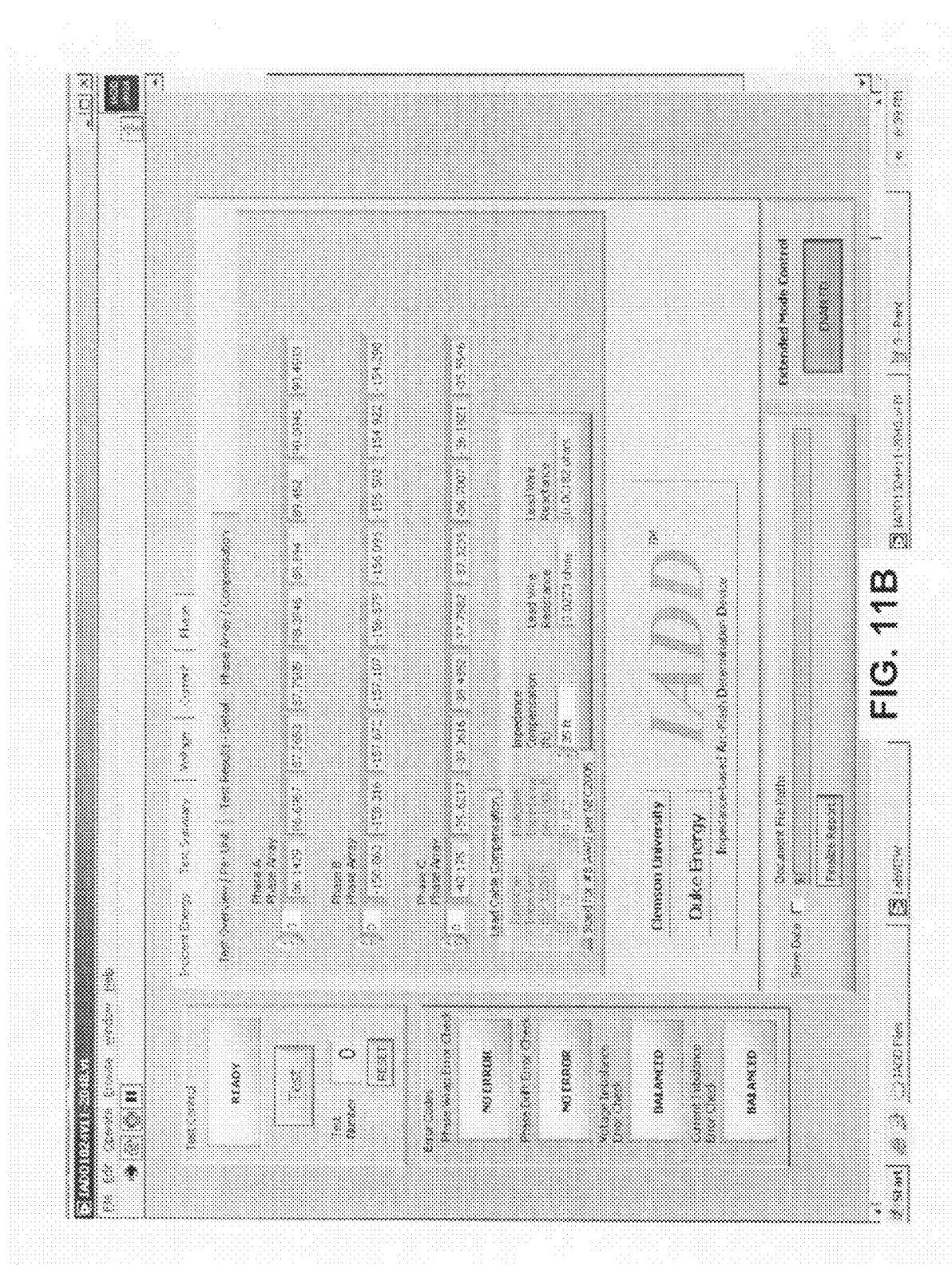
FIG. 11B is an exemplary Voltage—Phase Array/Compensation tab screen.

The exemplary Phase Array/Compensation tab screen, depicted in FIG. 11B, displays information about phase angle changes on a cycle by cycle basis and allows the user to compensate for wire lead impedance that may otherwise skew final bolted fault current calculations.

The three arrays displayed on this tab give information on phase angle as it is output by the FFT calculation used to track phase shift. Each number represents a fundamental phase angle unique to each cycle of the phase voltage waveform for each phase measured during the entire duration of the test. Ideally, the value should not vary under steady state conditions from cycle to cycle, except when there is a change in the system, such as the moment that the resistive load bank is switched into the circuit. However, due to slight differences in sampling frequency with respect to the 60 Hz input waveform, there is some drift noted from cycle to cycle. The program has been optimized with respect to sampling frequency to minimize the amount of variation due to sampling frequency and additional compensation is made as part of the window drift parameter previously discussed herein.

Compensation for connection cable length has been implemented to take into account additional impedance of the lead wires that would not be present should a fault occur at a buss under test. In one embodiment of the current version of the IADD, the impedance values are selected for #8 AWG wire because this is the size wire used for testing. Other embodiments can include a user selection for wire size and type of wire-way used in connection the IADD to the measurement point implemented as a lookup table that selects values as they are given in National Electric Code (NEC), or other appropriate documents. The user can select the length of the wire connection and a calculation is made based on the expected additional impedance input to the system as a result of this wire length. Additional compensation is made internally for the line-side fuses used to protect the system and is generally not a user defined variable.

3. Voltage

The exemplary Voltage display screens give graphical information about the last test conducted. The Overview tab is displayed in FIG. 12 and additional test information is provided in Gate On tab in FIG. 13A and Commutation OFF tab in FIG. 13B.

Figure 12:
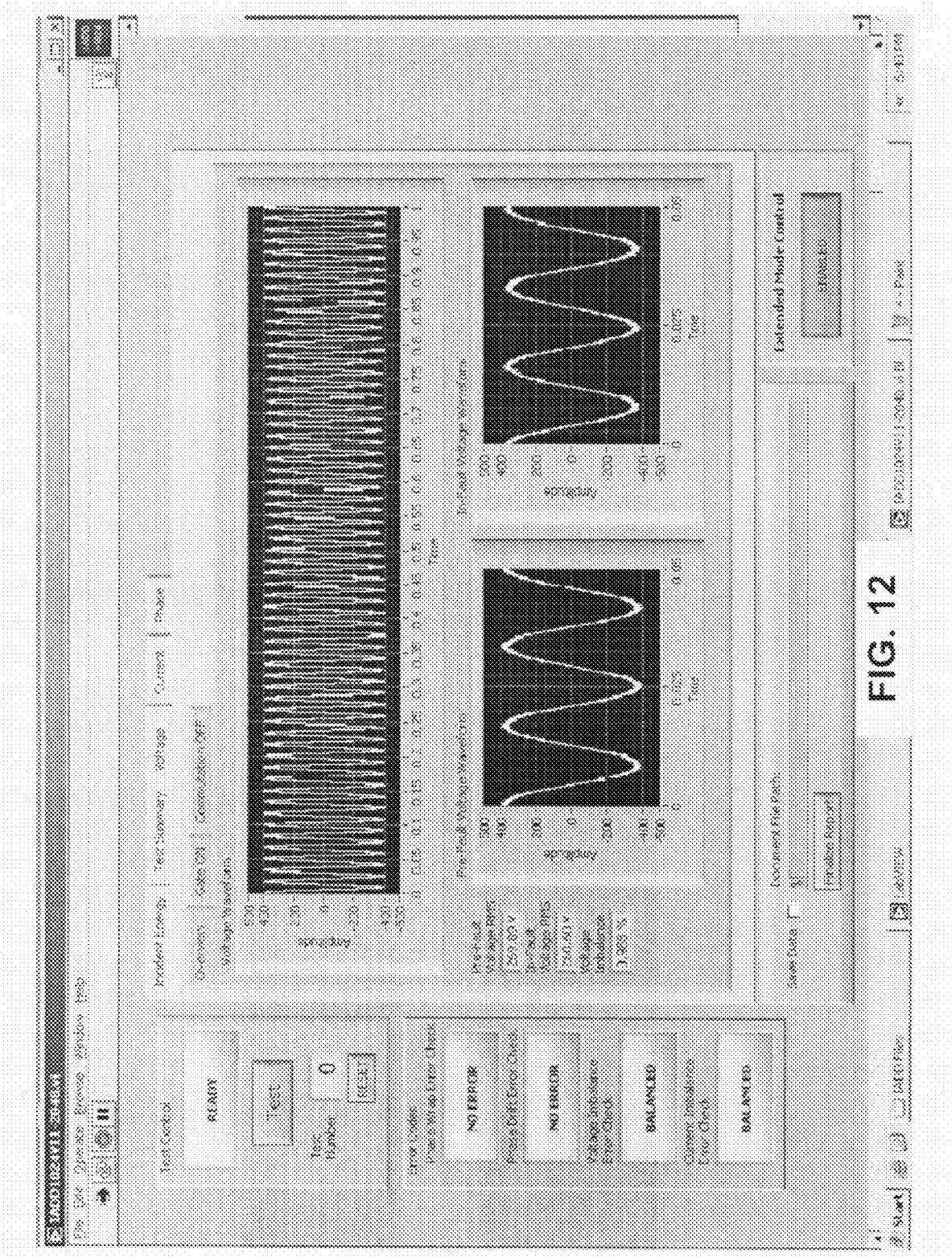
FIG. 12 is an exemplary Voltage—Overview screen.

The Voltage—Overview tab, shown in FIG. 12, displays detailed Pre-Test and In-Test voltage waveforms (approximately three cycles each) in the two smaller waveform graphs at the bottom. The top graph shows the total observed waveform for the duration of the test. This is useful for quickly evaluating the validity of test results since the user can view voltage waveforms to verify that no unexpected transient condition was present during the test. To the left of the detailed Pre-Test and In-Test graphs are RMS calculations and approximate voltage imbalance.

Because the system measures voltage on a per phase basis, the voltage imbalance equation has been modified from the standard accepted NEMA voltage imbalance equation. The calculation assumes that phase voltages are reasonably balanced and the following formula is applied:

$$V_{Imbalance} = \frac{(V_{\theta\text{-Max}} - V_{3\theta\text{-Average}})}{V_{3\theta\text{-Average}}} \tag{1}$$

Care should be taken when applying this equation since its use is for ascertaining that the system unbalance within acceptable levels. In other embodiments, other accepted unbalance formulas could be used, such as the one found in NEMA/ANSI C84.1.

Figure 13A:
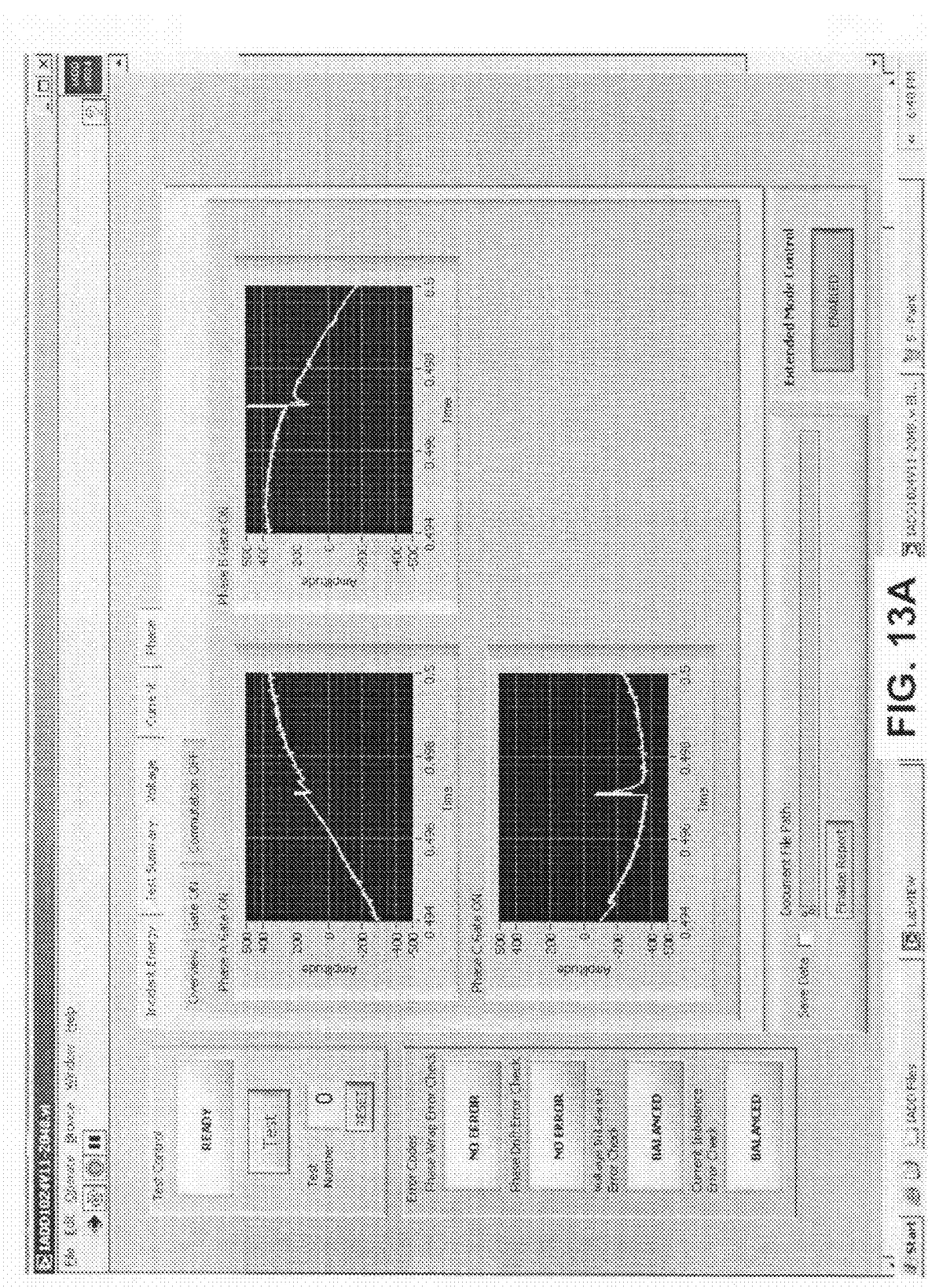
FIG. 13A is an exemplary Voltage—Gate On tab screen.

FIG. 13A illustrates an exemplary Voltage—Gate ON tab, which displays the three phase voltage waveforms at the moment of switching. No calculations are associated with this tab and the waveforms are presented for information purposes only.

Figure 13B:
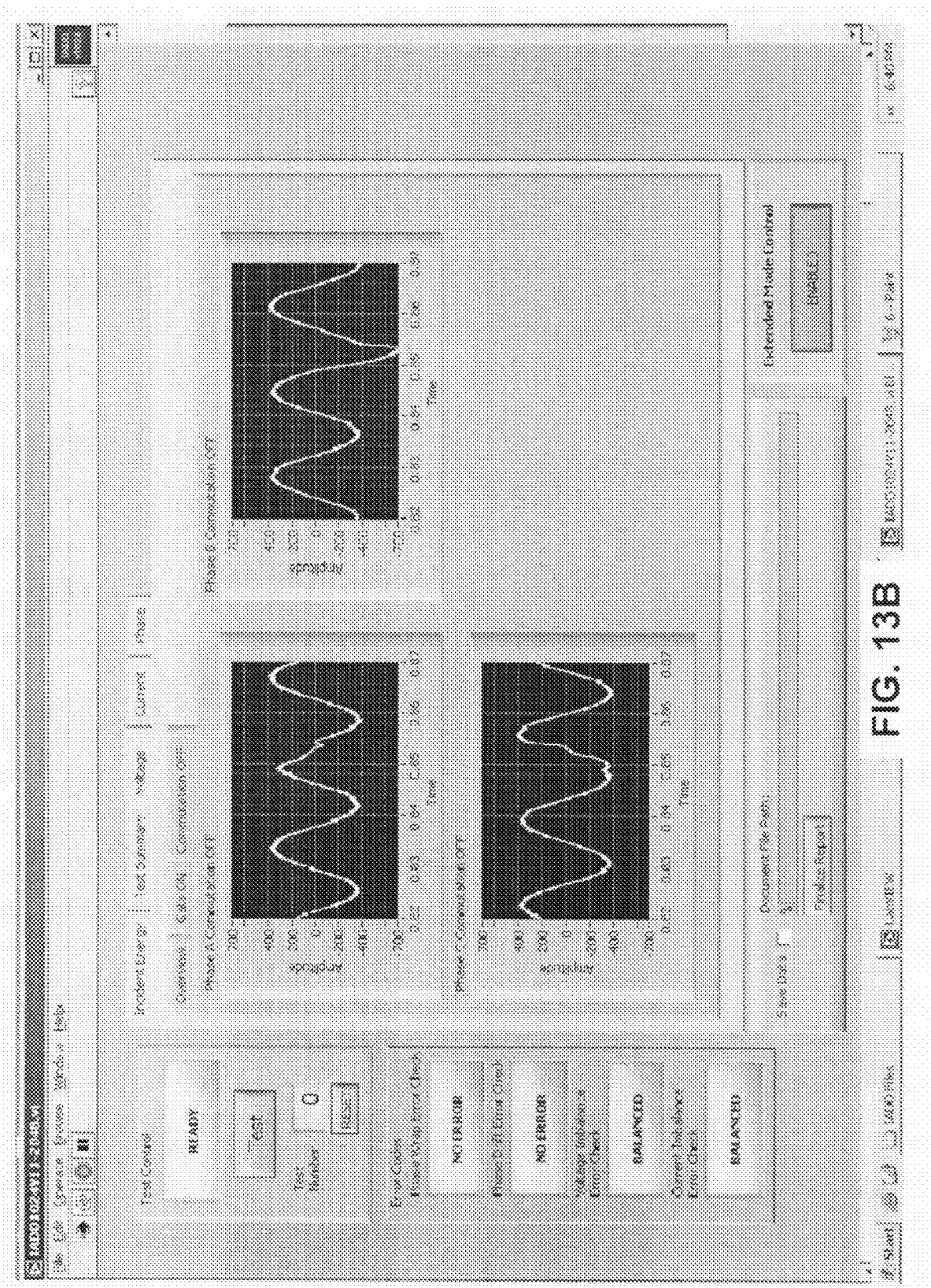
FIG. 13B is an exemplary Voltage—Commutation OFF tab screen.

FIG. 13B illustrates an exemplary Voltage—Commutation OFF tab, which displays the three phase voltage waveforms at the moment of switching. No calculations are associated with this tab and the waveforms are presented for information purposes only.

4. Current

An exemplary Current screen gives graphical information about the last test conducted. The Overview tab is displayed in FIG. 14 and additional test information is provided in Gate On tab in FIG. 15A and Commutation OFF tab in FIG. 15B.

Figure 14:
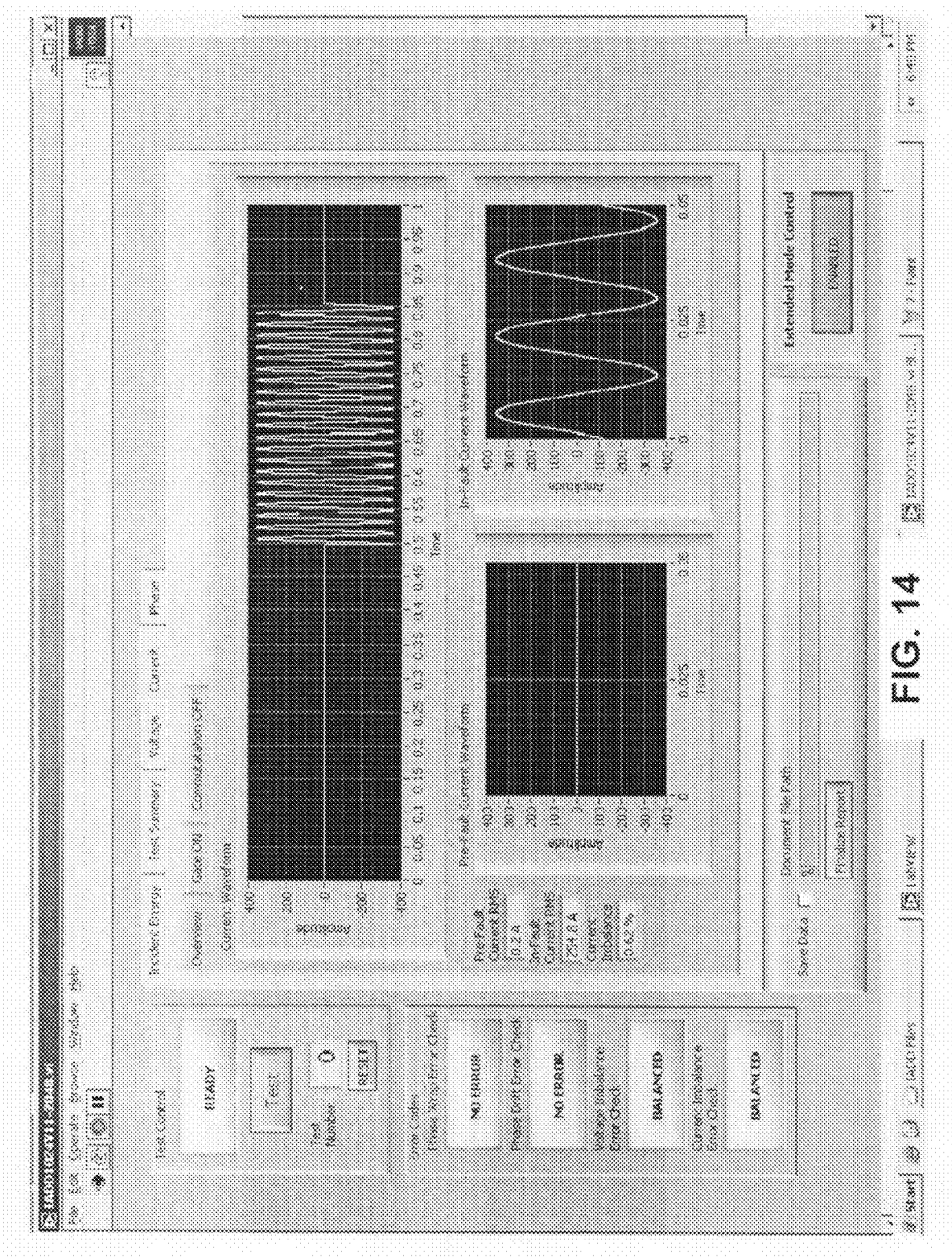
FIG. 14 is an exemplary Current—Overview tab screen.

FIG. 14 shows an exemplary Current—Overview tab, which displays detailed Pre-Test and In-Test current waveforms (approximately three cycles each) in the two smaller waveform graphs at the bottom. The top graph shows the total observed waveform for the duration of the test. This is useful in quickly evaluating the validity of test results since the user can view current waveforms to verify that no unexpected switching within the IADD occurred during the test. To the left of the detailed Pre-Test and In-Test graphs are RMS calculations and approximate current imbalance which are calculated using the same method presented in Equation 1, above.

Figure 15A:
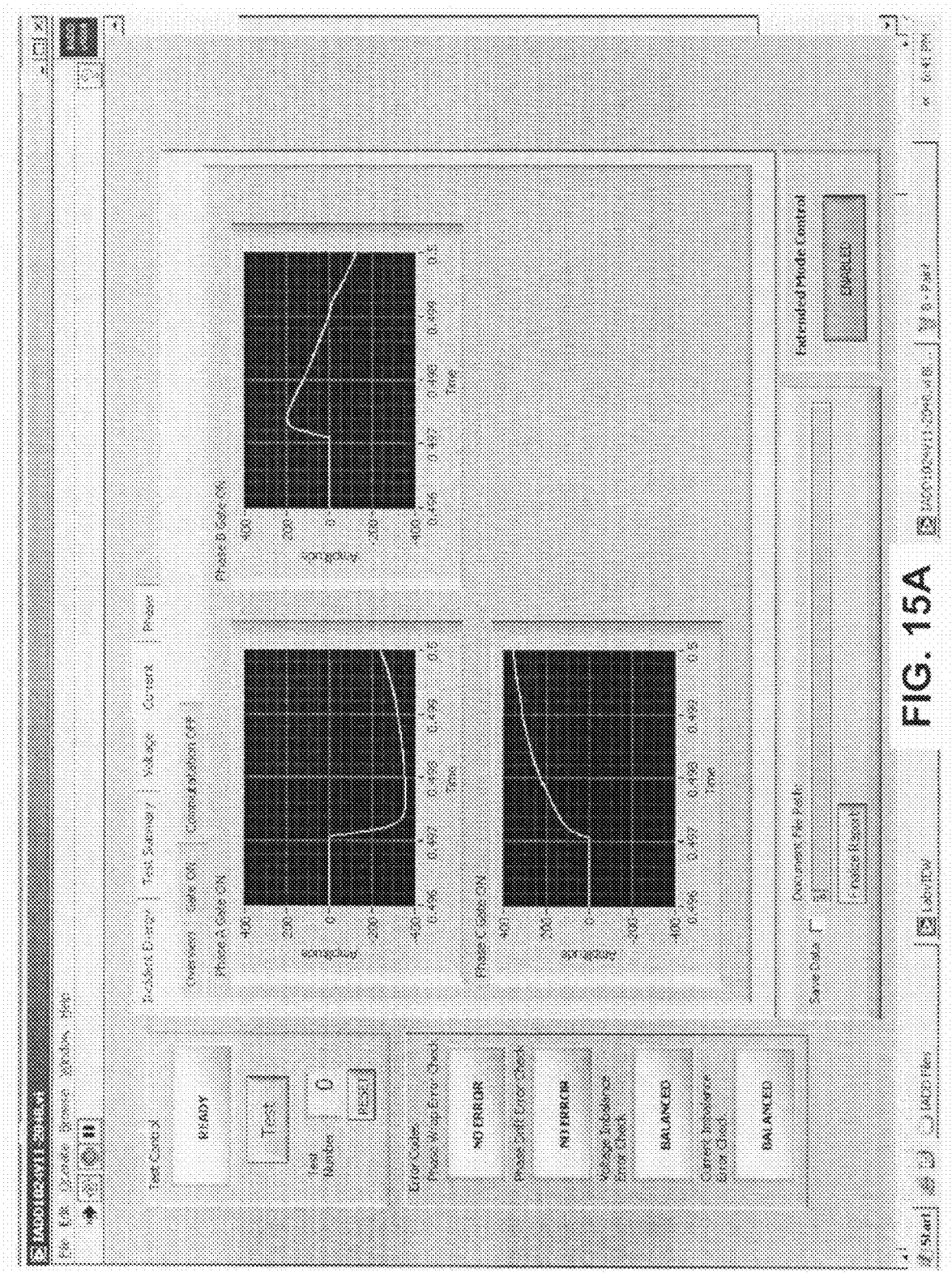
FIG. 15A is an exemplary Current—Gate On tab screen.

The Current—Gate ON tab, shown in FIG. 15A, displays the three line current waveforms at the moment of switching. No calculations are associated with this tab and the waveforms are presented for information purposes only.

Figure 15B:
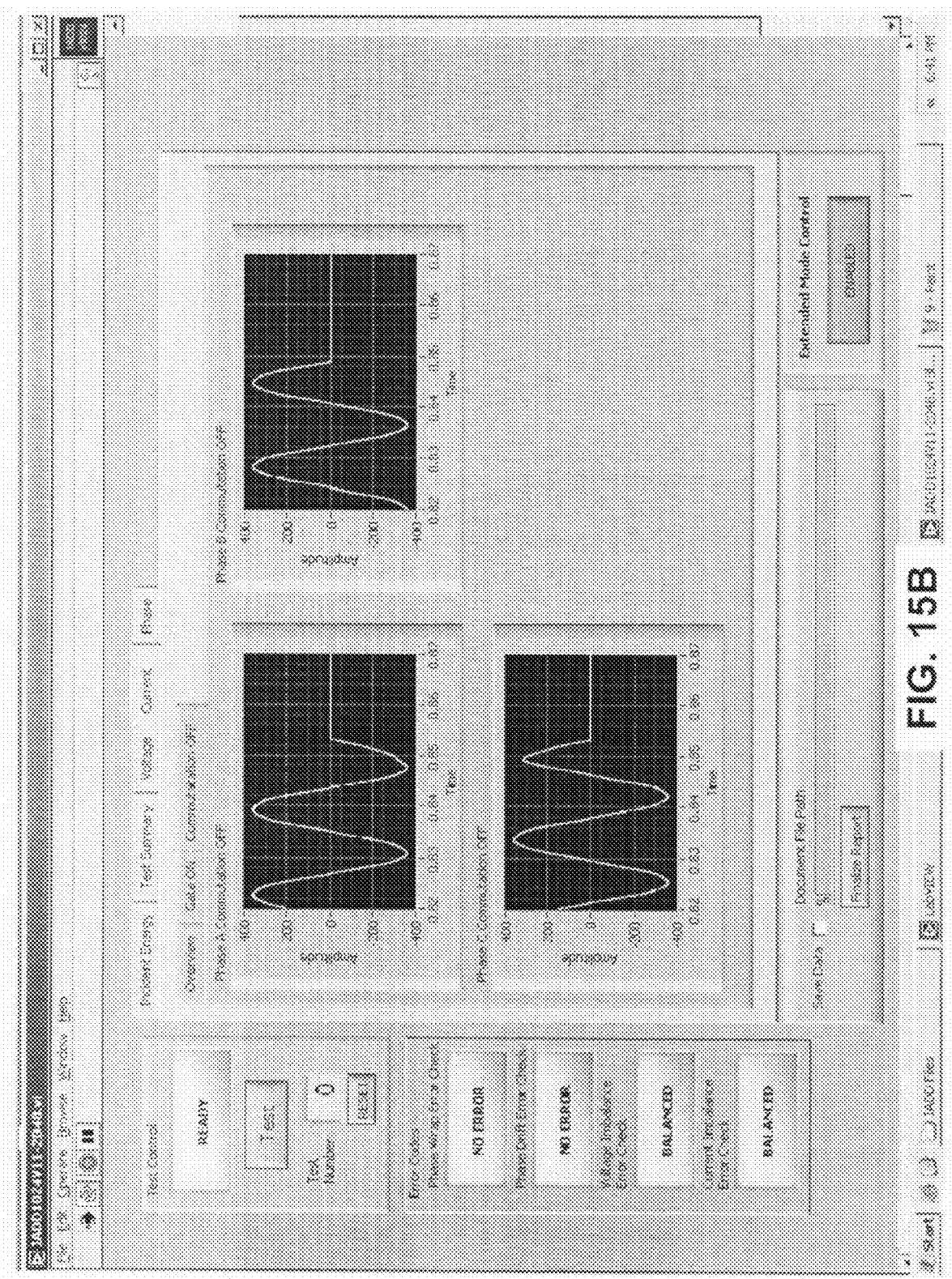
FIG. 15B is an exemplary Current—Commutation OFF tab screen.

The Current—Commutation OFF tab, shown in FIG. 15B, displays the three line current waveforms at the moment of commutation. No calculations are associated with this tab and the waveforms are presented for information purposes only. Because commutation occurs naturally at a zero crossing and can vary between two cycles depending on point in wave when the gating signal is removed from the relays, these views each span several cycles of data. This has an effect on the phase angle during switching that is discussed in the following section.

5. Phase

The Phase page gives graphical information about the last test conducted. The Overview tab is displayed in FIG. 16 and additional test information is provided in the Details tab displayed in FIG. 17.

Figure 16:
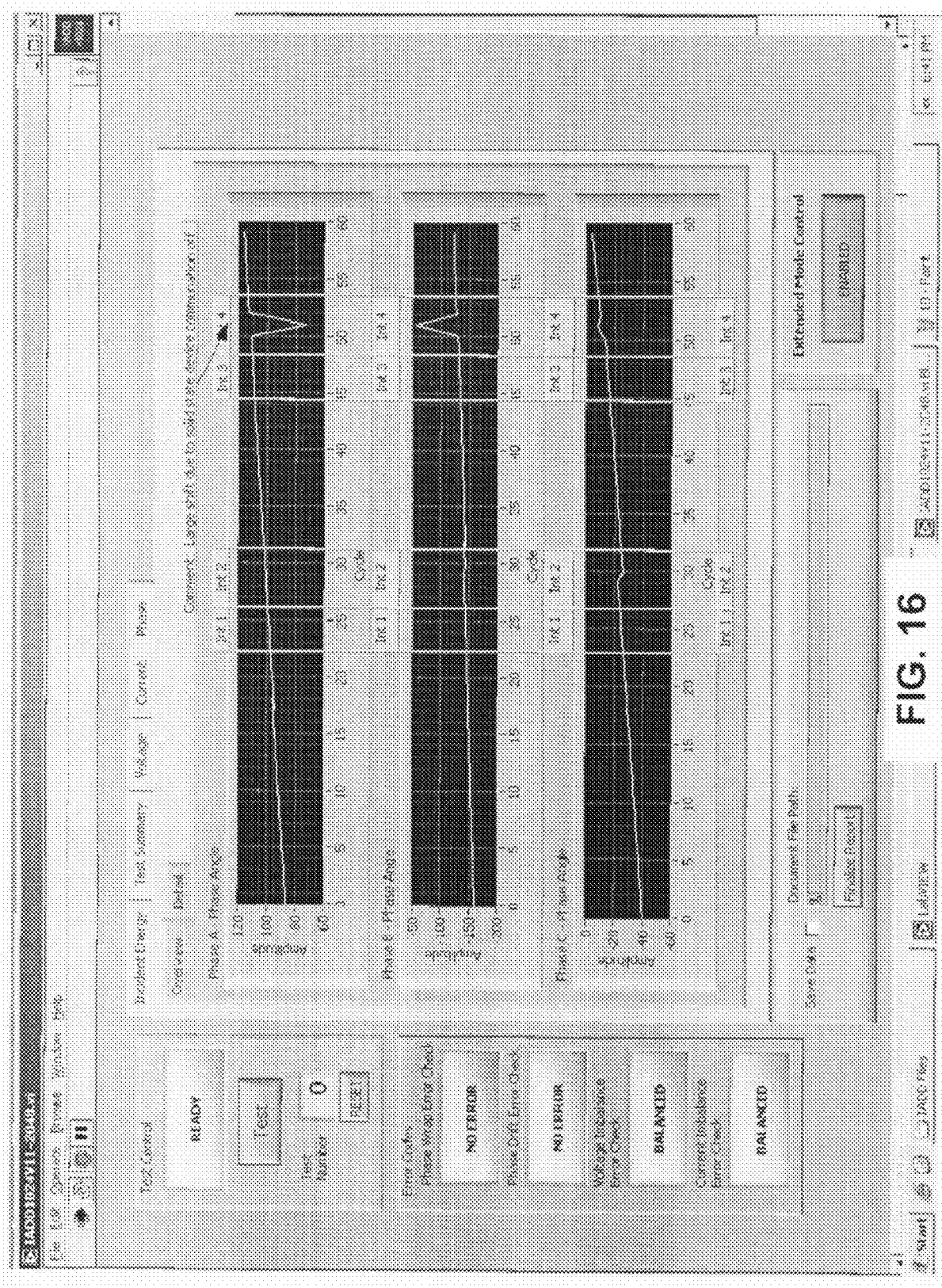
FIG. 16 is an exemplary Phase—Overview tab screen.

The exemplary Phase—Overview tab, shown in FIG. 16, displays a view of phase angles for each phase on a cycle by cycle basis. Because the FFT algorithm produces only one phase data point at the fundamental per cycle, this graph is made up of discrete points connected by straight lines representing the values discussed above. A visual inspection of the phase arrays shows that detection of phase shift by the method described herein is viable. As expected, a phase shift occurs at the point when the load is connected to the system and a nearly identical shift in the opposite direction is observed when the load is disconnected.

The Phase—Overview tab, shown in FIG. 16, shows more clearly how phase angle is affected due to load switching at the test point. Window drift can be apparent and manifests itself in the form of a slope in the phase angle from point to point that remains constant for the entire length of the test. Compensation can be made for this drift due to its constant slope.

Figure 17:
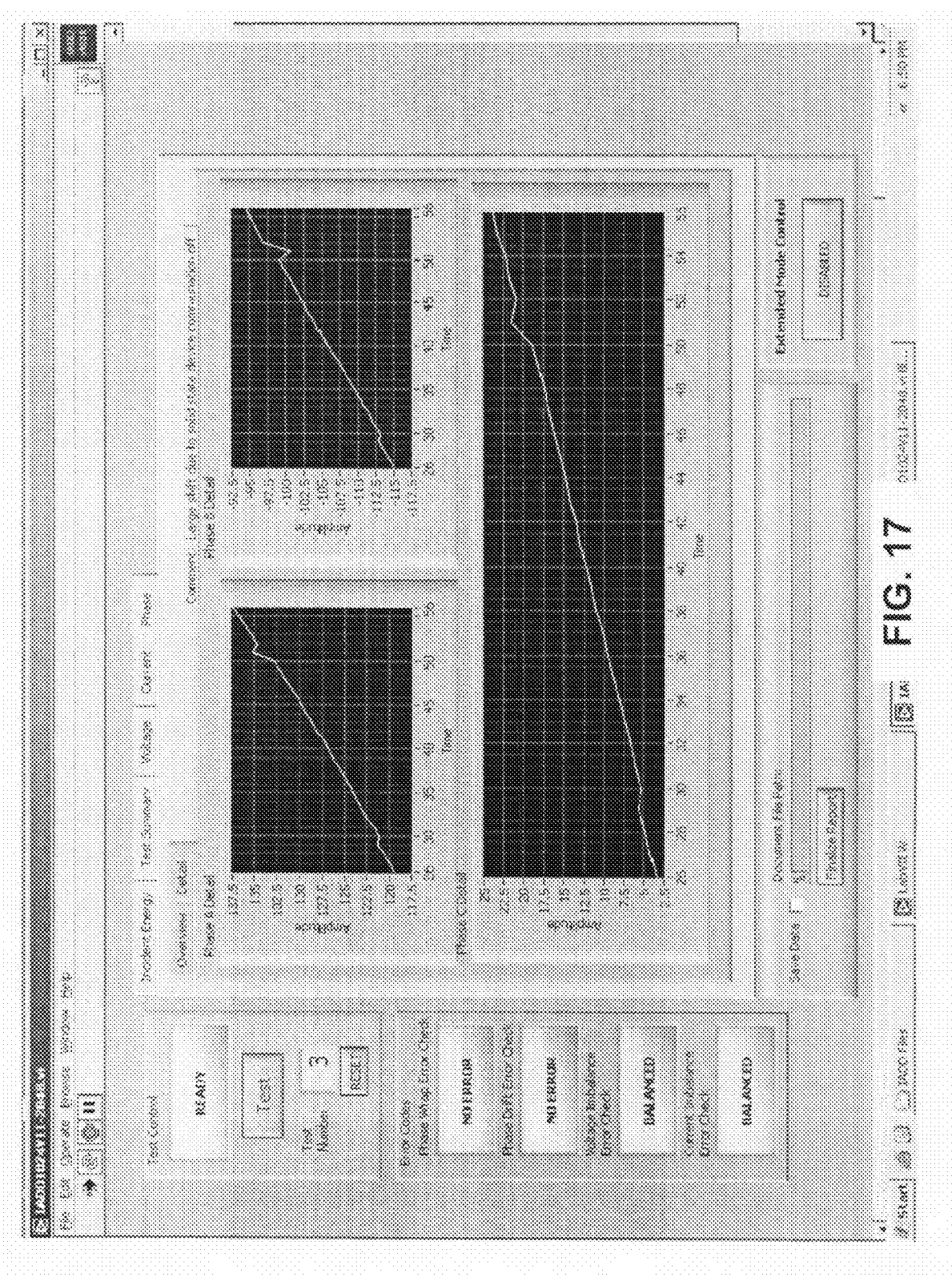
FIG. 17 is an exemplary Phase—Details tab screen.

An additional variation in the phase angle can been seen when the resistive load is disconnected from the source. This variation is due to commutation of the current wave at the zero crossing in each line of the current waveform. One solid state relay commutates off prior to the other two, resulting in a single phase circuit. Current continues to flow through the two remaining conducting phases until their relays also commutate off. This transient condition can manifest itself as a larger than expected change in phase angle during the cycle when the single phase condition exists. As shown in FIG. 17 the phase returns to its steady state pre-test condition after the remaining conduction paths have commutated off and the load is fully disconnected from the source.

Testing Cycle and Back Panel Programming

Calculations used to determine power system impedance, bolted arc-fault current and incident energy are presented herein. The results of these calculations are ultimately applied to assigning an NFPA arc-flash category to the electrical node connected to the IADD.

In one aspect, DAQmx™ Assistant as part of the LabView™ software, allows a user to easily configure a National Instruments DAQ (data acquisition) card to input and output digital and analog signals, though other software packages and custom-developed software are contemplated within the scope of the invention. This module is used to capture voltages and currents during the testing cycle, as well as to output signals to relays using internal computer power. The IADD device is configured, upon initialization, to obtain a predetermined number of samples at a user specified sampling rate. Once a signal has been input into an array, various mathematical operations can be applied to the acquired and stored input signals for post processing.

For an aspect according to the present invention, a test sequence is divided into separate and independent acquisitions. During the first portion of the test, voltage and current are measured on, for example, a three phase basis to obtain a baseline RMS values, though single-phase and other polyphase systems are contemplated within the scope of the embodiments of the present invention. An RMS calculation is performed on each phase of the system using analysis tools that are shipped with the software. The card can sample with, for example, 14 bit accuracy, so there is some quantization error associated with the RMS measurements. This percent error is a function of the voltage being measured, as the bits are distributed evenly over the range zero to ten volts. For example, if voltage of up to 1500 V (line-to-neutral) is read using the previously described voltage isolator, the resolution will be approximately 0.0488 V. With this level of resolution, a $120 V_{rms}$ signal would have a maximum error of 0.04% error and a $330 V_{l-n}$ ($575 V_{l-l}$) signal would have a maximum error of 0.01%.

In an attempt to further reduce error, the RMS values of each phase are averaged in the standard method and the average three phase RMS value is used in final calculations. During this portion of testing, no current flows in the test circuit, therefore no phase shift due to testing occurs.

Figure 18:
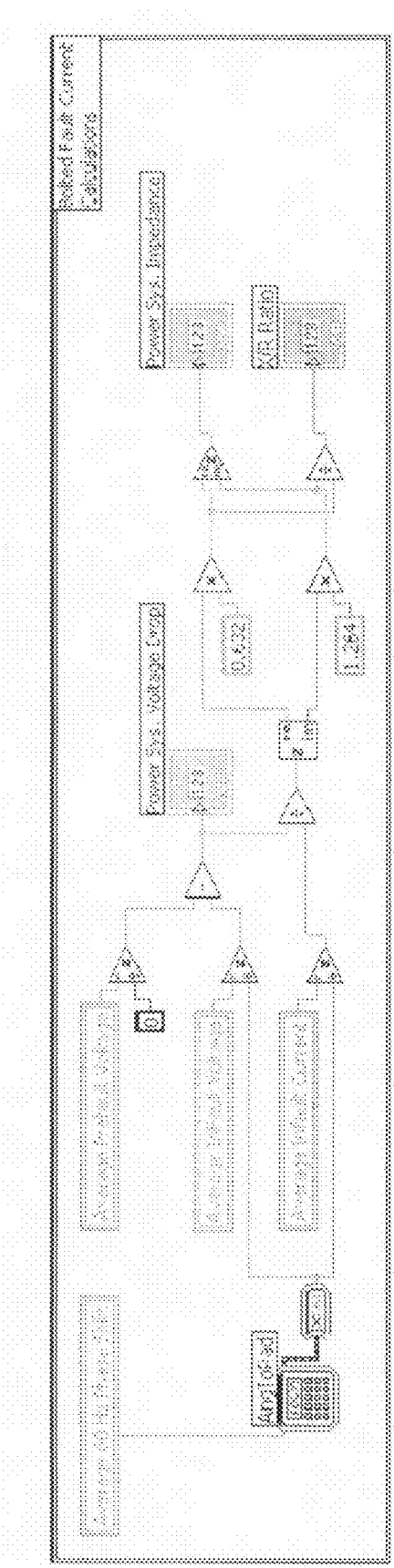
FIG. 18 illustrates an implementation of calculations leading to determination of bolted fault duty, impedance and X/R ratio.
Figure 19:
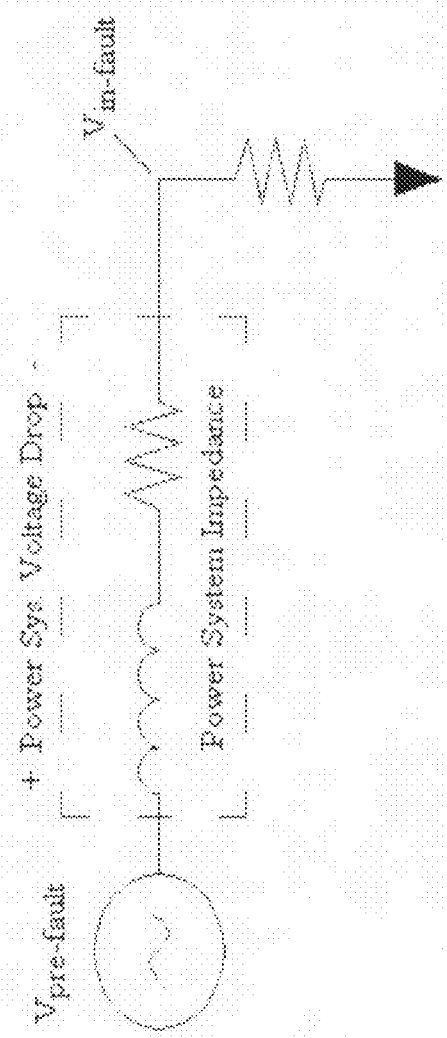
FIG. 19 illustrates an electrical system diagram a portion of the block diagram implementation of FIG. 18.

For instance, FIG. 18 illustrates a LabView software implementation of calculations leading to determination of bolted fault duty. FIG. 19 illustrates a system diagram of the block diagram implementation of FIG. 18. FIG. 19 can be modeled by equation (2), which allows determination of Thevenin impedance. From this value, the bolted fault current, arc-flash incident energy and X/R ratio (ratio of reactance to resistance) can be determined.

$$Z_{Power\ System} = \frac{\overline{V}_{Pre\text{-}Fault} \angle 0^0 - \overline{V}_{In\text{-}Fault} \angle \theta_{PhaseShift}}{I_{In\text{-}Fault} \angle \theta_{PhaseShift}} \quad \text{Power System Impedance or} \quad (2)$$

Therefore, the following values are obtained in order to determine the Thevenin impedance, where the vertical bars indicate the magnitude of the phasor quantity: $|\overline{V}_{Pre\text{-}Fault}|$, $|\overline{V}_{In\text{-}Fault}|$, $|I_{In\text{-}Fault}|$ and $\overline{\theta}_{PhaseShift}$. Note that the phase angle of the pre-test (open circuit) voltage, $\overline{V}_{Pre\text{-}Fault}$, can be set to zero degrees for a convenient (and arbitrary) reference.

In one aspect, two separate calculations are performed approximately simultaneously to find these variables. One algorithm is used to determine voltage and current magnitudes, the other is used to define phase angle. Furthermore, the phase angle algorithm is sub-divided into two parts: (i) forming the phase angle data into a matrix and (ii) performing specific calculations using elements of this matrix.

The testing interval (or fault interval) can, in one aspect, be comprised of a measurement window of approximately one second during which all phases of voltage and current are captured continuously by the data acquisition system. (Note that one second corresponds to 60 cycles for North American terrestrial ac power systems and three phases are typical for commercial and industrial systems. Other frequencies and numbers of phases are also contemplated using the same techniques.) When the test interval is initiated by the user (e.g., by pressing a button on the GUI) or some other system initiates the test, the following steps are generally performed: (1) The data acquisition system begins recording on all three phases of voltage and current using simultaneous sampling at an appropriate sample rate; (2) Approximately 0.5 seconds into the interval, the load bank is switched in (via the solid-state relays); (3) Approximately 0.8 seconds into the interval, the load bank is switched out (via the solid-state relays); (4) At approximately one second, the data acquisition system stops recording, and the acquired data is then processed by the computer as further described herein.

When determining voltage and current magnitude, an algorithm is implemented as described below for each power system phase independently. In a first step, portions of the pre-fault voltage and current waveforms for each phase are isolated and the RMS magnitude of $|V_{pre-fault}|$ and $|I_{pre-fault}|$ are determined. In a second step, portions of the in-test (in-fault) voltage and current waveforms for each phase are isolated and the RMS magnitude of $|V_{in-fault}|$ and $|I_{in-fault}|$ are determined. In a third step, the values of each respective voltage and current quantity obtained in the first and second steps are averaged, giving these quantities:

i. $|\overline{V}_{Pre-fault}|$–3 phase averaged pre-test voltage magnitude
ii. $|\overline{I}_{Pre-fault}|$–3 phase averaged pre-test current magnitude (not currently used in further fault current calculations)
iii. $\overline{V}_{in-fault}|$–3 phase averaged in-test voltage magnitude
iv. $\overline{I}_{in-fault}|$–3 phase averaged in-test current magnitude Phase shift can be important to producing valid, reproducible results when measuring system parameters, particularly when determining X/R ratio. The fundamental power phase angle is obtained prior to applying the test impedance. The phase of this signal is established on a cycle by cycle basis using the Extract Portion of Signal tool in LabView™.

Since the power system frequency (and hence phase angle) is not completely stable at a given measurement bus (electrical node), an embodiment of the IADD uses an alternative to a phase-locked-loop (PLL) for determining the phase angle shift at the bus caused by the insertion of the load bank. This alternative takes advantage of the stable high-speed sampling of the data acquisition card and the fact that this sampling is not synchronized with the power system frequency. To achieve the best accuracy and minimize the possibility of a phase-wrap error, a very high sample rate that is closely an integer multiple of the power system frequency is chosen.

The phase angle capture algorithm is performed by collecting data and forming a matrix as outlined by the following procedure: (1) input voltage waveforms are sampled at the defined sampling frequency; (2) captured data is separated cycle by cycle to analyze each cycle independently; (3) data for the first cycle of each phase in input into an FFT algorithm and the fundamental phase angle is extracted from the resultant FFT vector (this defines a reference angle, set to zero in Equation 2, for subsequent calculations); (4) the phase angle is placed in a matrix array shown below, the subscripts are (θ,n), are the phase and cycle in sequence, respectively; and (5) the matrix is populated until fundamental phase angle of each cycle (typically 60) for each phase have been defined.

The mathematical format for the phase angle array is:

$$\begin{bmatrix} \theta_a \\ \theta_b \\ \theta_c \end{bmatrix} = \begin{bmatrix} \theta_{a,0} & \theta_{a,1} & \cdots & \theta_{a,59} \\ \theta_{b,0} & \theta_{b,1} & \cdots & \theta_{b,59} \\ \theta_{c,0} & \theta_{c,1} & \cdots & \theta_{c,59} \end{bmatrix}$$

Figure 21:
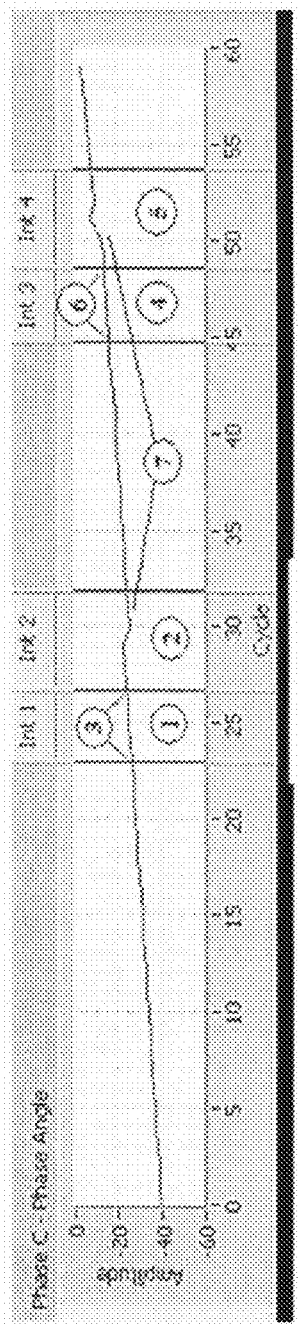
FIG. 21 graphically illustrates an algorithm for determining phase shift in each phase of the incoming voltage waveform.

Data from this matrix is then used to determine the phase angle shift, $\overline{\theta}_{phaseshift}$. This procedure is performed for each phase independently. A graphical representation of the phase angle drift versus cycle number, showing each step, is shown in FIG. 21.

Figure 20:
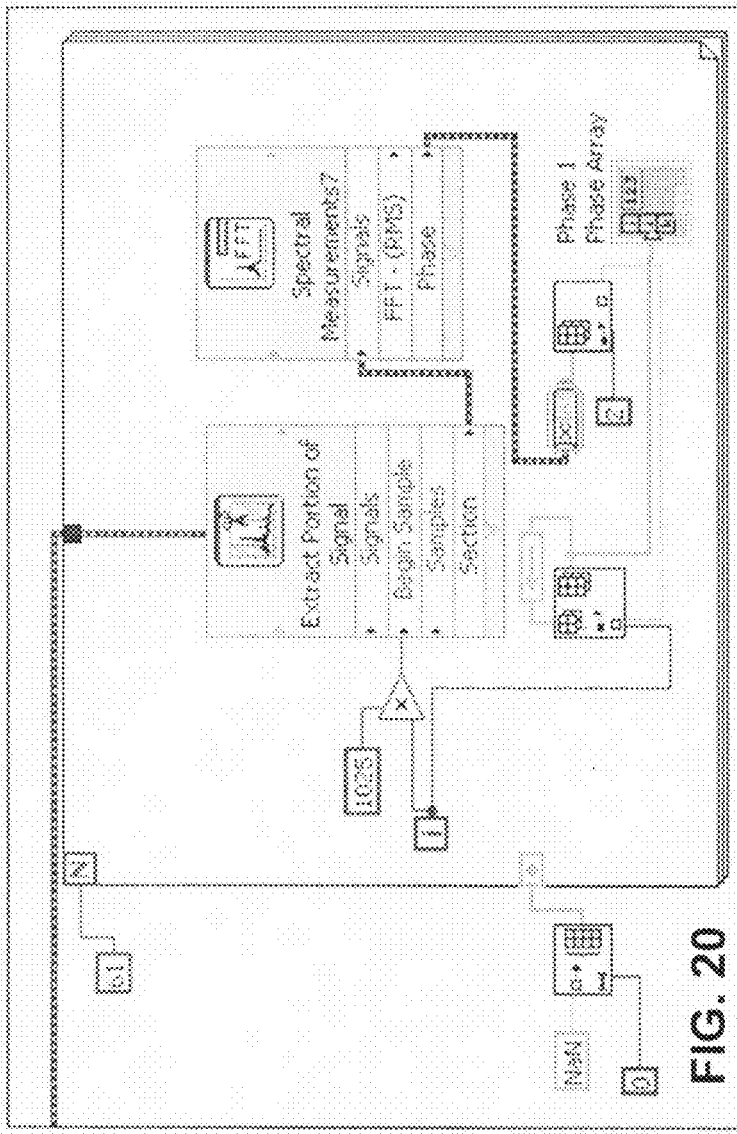
FIG. 20 illustrates a cycle-by-cycle phase extraction algorithm as implemented in software such as, for example, LabView™.

FIG. 20 illustrates a cycle-by-cycle phase extraction algorithm as implemented in software such as, for example, Lab-View™. As shown in FIG. 20, by observing the phase angle of each cycle of the signal, a phase shift differential can be observed prior to and after switching. A similar phase shift of opposite magnitude is observed when the gating signal to the solid state switches is removed and the resistors are switched out of circuit. By collecting the cycle phase angles in a vector form and analyzing the typical cycles of switching, distinct regions of phase shift are identified. The algorithm is performed under the following procedure: (Step 1) 5 Cycles of the pre-switching phase angle are analyzed and the average drift per cycle is determined; (Step 2) 5 Cycles of the waveform during switching in the resistor banks are analyzed and the phase shift between the first and last cycle are determined; (Step 3) Based on the average phase drift determined in step 1, phase drift compensation is introduced, and an observed phase shift is determined; (Step 4) 5 Cycles of waveform while switched are analyzed and the average drift during the switched condition is determined on a per cycle basis; (Step 5) 5 Cycles of the waveform during switching out the resistor banks are analyzed and the phase shift between the first and last cycle are determined; (Step 6) Based on the average phase drift determined in step 4, phase drift compensation is introduced, and an observed phase shift is determined; and (Step 7) Observed phase shift from switching in the resistor banks and switching out the resistor banks is averaged together to yield an average phase shift value for the phase measured. Steps 1 through 7 are repeated for any remaining phases. The seven-step algorithm for determining phase shift in each phase of the incoming current waveform is graphically represented in FIG. 21. The stability of the power system under test during the testing interval can be determined by examining the slope of the line in FIG. 21. Systems with a stable Thevenin impedance will have the extension of the line prior to Int 1 overlay the line that exists after Int 4 in FIG. 21.

Figure 22:
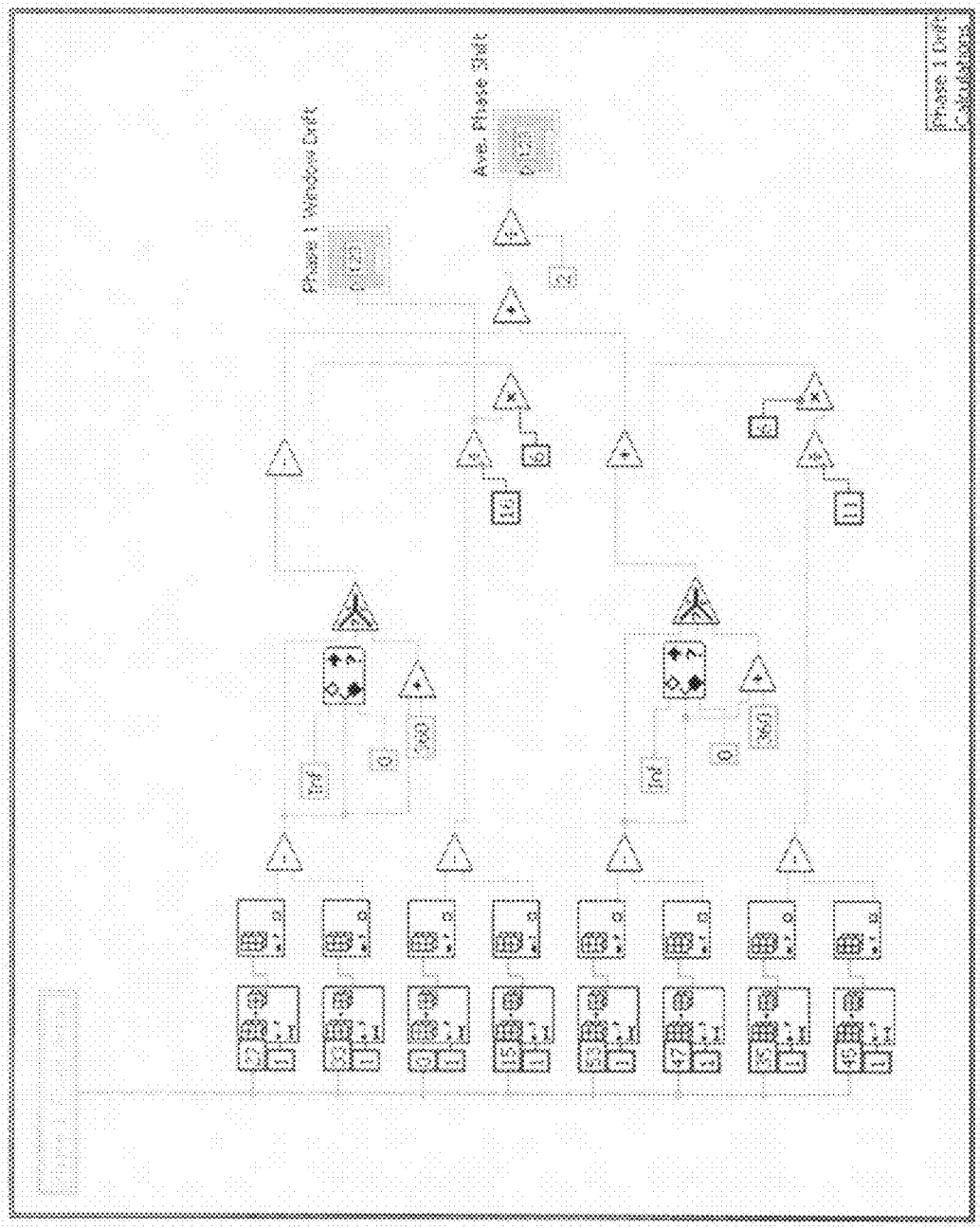
FIG. 22 is a graphical representation of a LabView™ implementation of a phase-detection algorithm.

FIG. 22 is a graphical representation of a LabView™ implementation of a phase-detection algorithm. It is mathematically represented in the equation shown below:

$$\theta_{AVG-Shift} = \frac{1}{6}\left\{\sum_x \left[ \begin{array}{c} (\theta_{x,53} - \theta_{x,48}) + \frac{(\theta_{x,43} - \theta_{x,48})}{5} + \\ (\theta_{x,27} - \theta_{x,32}) + \frac{(\theta_{x,27} - \theta_{x,22})}{5} \end{array} \right]\right\}$$

where x=phases a, b, and c summing the three phases and taking the average.

Figure 23:
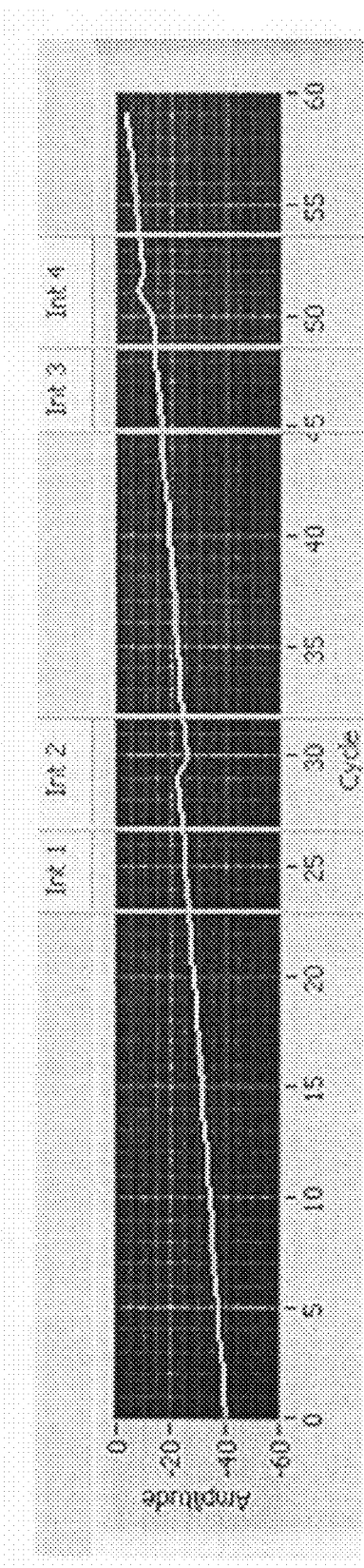
FIG. 23 is a graphical representation of the implementation of the algorithm of FIG. 22.

This algorithm is implemented in LabView using the code performed as shown in FIG. 23. Although embodiments of the IADD incorporate strategies to minimize the chance of phase wrap, it is possible that the phase angle could cross the 360-degree threshold and wrap across to zero. Short intervals are used to minimize the chance of phase wrap error, the average phase shift is averaged over 6 measurements (2 for each phase; 1 shift when current begins to flow and 1 shift when current stops flowing).

Figure 24:
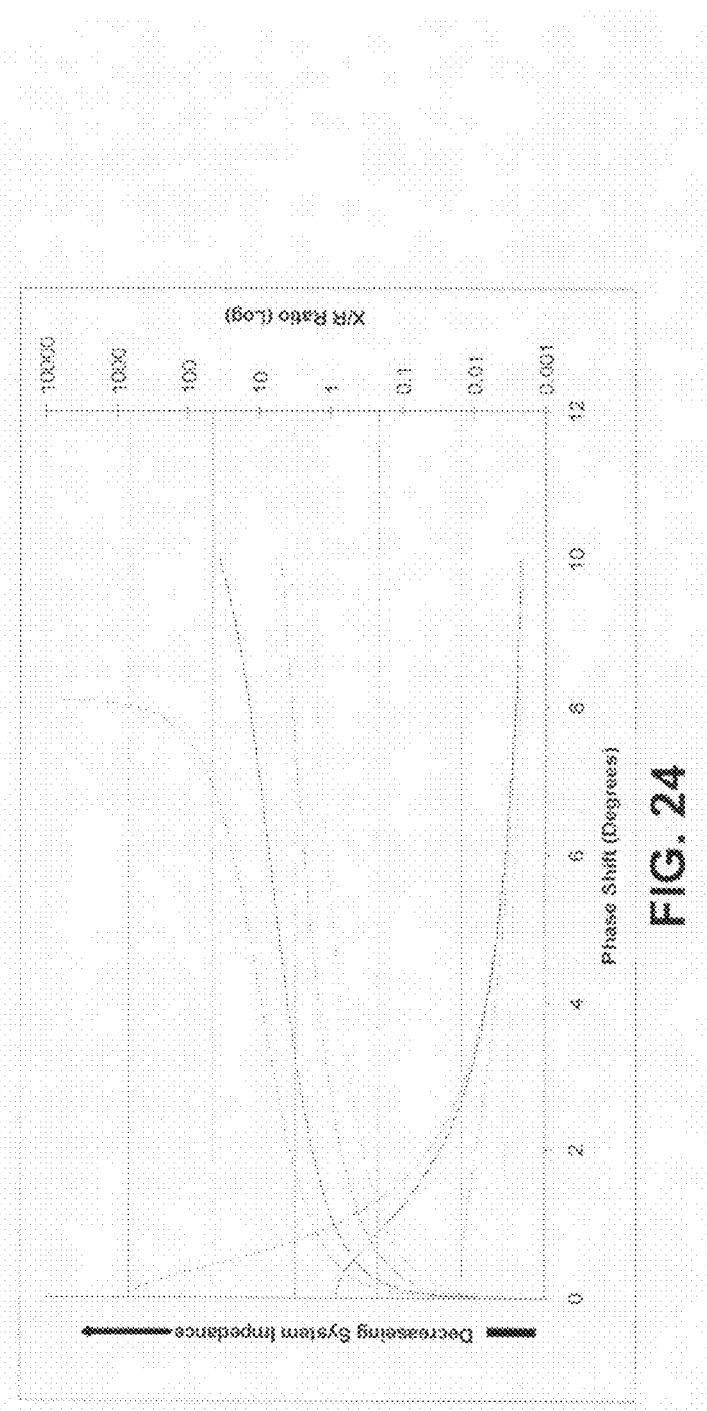
FIG. 24 shows typical relationships between the computed X/R to measured phase shift for varying power system impedances.

Thus, determining phase shift becomes a matter of measuring and compensating for six observed phase shifts. By averaging over the six observable changes in phase angle, the chance of a measurements being effected by changes in load to the system during the test can be reduced. Furthermore, interval in which differential measurement of phase shift and intervals of compensation referred to Int 1, Int 2, Int 3 and Int 4 as in FIG. 24, are minimized, making the calculation substantially immune to relative changes in phase due to changing loading conditions on the system outside of these intervals, where FIG. 24 shows a typical phase shift capture detailing measurement regions.

Therefore, as long as the system does not change significantly with respect to phase during the 10 cycle interval during switching on or off of the IADD resistive load, there will be minimal effect to the calculation of phase shift, even if system phase shift occurs (and transients dissipate) outside of these intervals.

All values required to solve for the per-phase power system impedance have now been found. Equation 2 can now be solved, where $Z_{Power\ System}$ is a complex number comprised of real (resistive) $R_{power\ System}$ and imaginary (reactive) $X_{Power\ System}$ components such that $$Z_{Power\ System} = R_{Power\ System} + jX_{Power\ System}$$

where j is the imaginary number.

One final operation is performed prior to solving for bolted fault current. The user defines additional measurement lead impedance by defining the length and type of conductors connected between the IADD input terminals and the electrical bus (node). In its present embodiment, the input terminals are defined as the line-side connection point of the lead wire fuse block.

$$Z_{Power\ System\ Compensated} = R_{PowerSystem} + jX_{PowerSystem} - \frac{L \times (R_{CableZ/1000\ ft} + jX_{CableZ/1000\ ft})}{1000} - R_{connection}$$

where L is the length of cable in feet. $R_{connection}$ is the contact resistance and user specified. $R_{cableZ/1000ft}$ and $X_{cableZ/1000ft}$ can be found by using NEC table 9, or equivalent.

Note that $Z_{Power\ System\ Compensated}$ is composed of real and reactive terms:

$$Z_{Power\ System\ Compensated} = R_{Power\ System\ Compensated} + jX_{Power\ System\ Compensated}$$

By comparing the phase prior to and after test conditions have been applied, a determination on phase shift can be made. Using calculated phase shift and voltage change, a determination of X/R (reactance over resistance) and power system impedance can be made. The X/R ratio has several effects on how faults behave; a large reactance can make extinguishing an arc more difficult; depending upon the time of fault inception, a decaying DC component can be present in the current waveform with a time constant based on this ratio. The X/R ratio is now calculated from $$\frac{X}{R} \text{Ratio} = \frac{X_{PowerSystemCompensated}}{R_{PowerSystemCompensated}}$$

Figure 25:
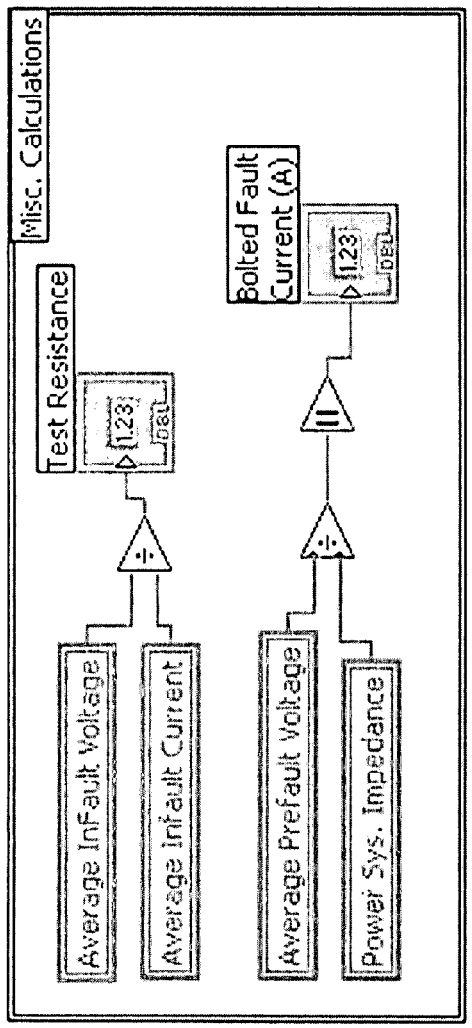
FIG. 25 is an algorithm to determine the load (test) impedance and the bolted fault current, implemented in LabView™.

These calculations are implemented in LabView™ with the algorithm shown in FIG. 25. From the values calculated in FIG. 25, the bolted fault current duty can be determined using the equation shown below. Lead length wire impedance compensation can be integrated into the IADD. The values are calibrated for resistance and reactance of free wire per NEC-2005 Table 9, and may be adjusted by changing values in the back panel program or by selection of the type and condition of wire used for measurement lead. Users specify the wire lead length, this variable is then input into a calculation that subtracts this impedance from the calculated power system impedance. Effectively, this removes error due to impedance introduced by the IADD when measuring the system parameters.

$$I_{BoltedFaultCurrent} = \frac{|V_{Pre-Test}|}{|Z_{PowerSystemCompensated}|}$$

where $I_{Bolted\ Fault\ Current}$ is the magnitude of the bolted fault current.

Figure 26:
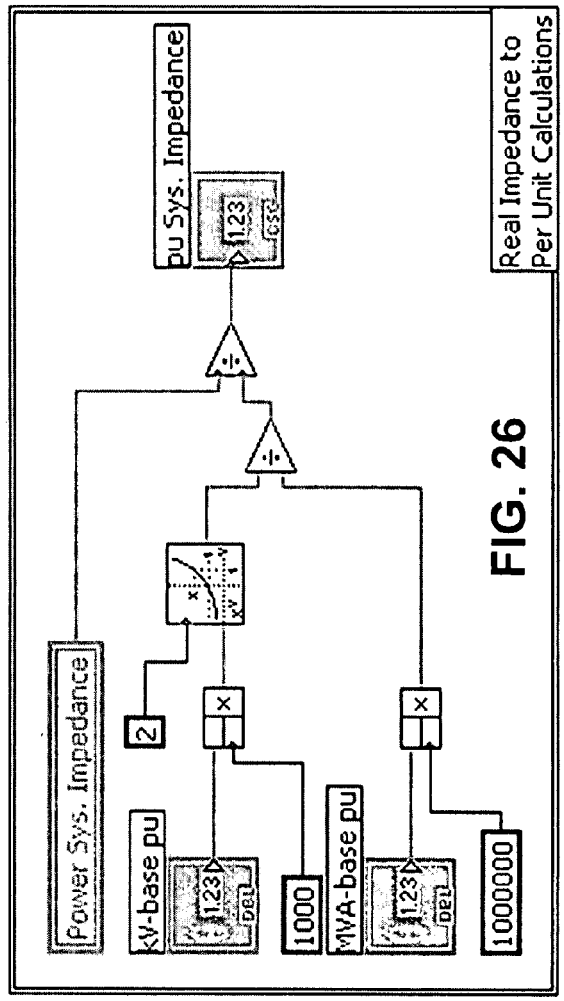
FIG. 26 is an exemplary LabView™ algorithm for calculation of per-unit system impedance.

From these values, the following equation is utilized in LabView™. This equation assumes a balanced voltage on all three phases and the per-unit system impedance is calculated.

$$Z_{base} = \frac{(V_{base})^2}{S_{base}} \tag{3}$$

$$Z_{Per\ Unit} = \frac{Z_{PowerSystem}}{Z_{base}} \tag{3.1}$$

as shown in FIG. 26.

Another step in calculating the NFPA category number is to evaluate a series of equations presented in, for example, the IEEE 1584 standard. These equations are based on empirical studies done by an IEEE working group and are used in this program to determine the incident energy in cal/cm².

Figure 27:
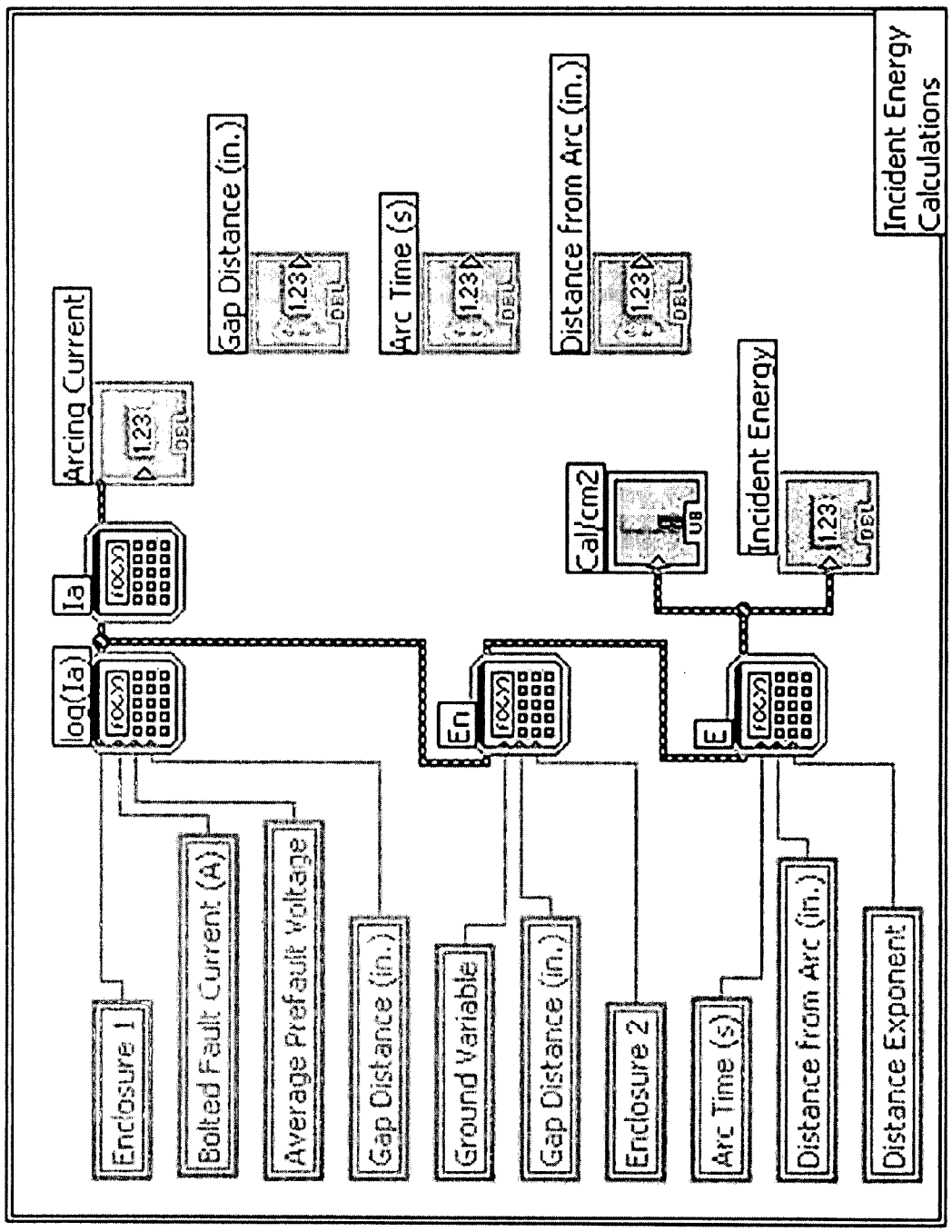
FIG. 27 is an exemplary algorithm to determine arc flash incident energy is presented using LabView™ graphical coding.

In FIG. 27, the algorithm to determine arc flash incident energy is presented using LabView™ graphical coding. This calculation is based on several variables including type of enclosure, working distance from the arc, and distance between conductors also called the gap distance. The formula module that comes standard with LabView™ is used to reduce the complexity of programming.

The following equations were implemented in the programming block of FIG. 27.

$$\log I_a = K + 0.662 \times \log I_{bf} + 0.0966 \times V + 0.000526 \times G + 0.5588 \times V \times \log I_{bf} - 0.00304 \times G \times \log I_{bf} \tag{4}$$

where,
$I_a$ is arcing current (kA)
K is −0.153 for open configurations and is −0.097 for box configurations
$I_{bf}$ is bolted fault current for three-phase faults (symmetrical RMS) (kA)
V is system voltage (kV)
G is the gap between conductors (mm).

$$\log E_n = K_1 + K_2 + 1.081 \times \log I_a + 0.0011 \times G \tag{5}$$

where,
$E_n$ is the incident energy (J/cm²) normalized for time and distance
$K_1$ is −0.792 for open configurations (no enclosure) and is −0.555 for box configurations (enclosed equipment)
$K_2$ is 0 for ungrounded and high-resistance grounded systems and is −0.113 for grounded systems
G is the gap between conductors (mm)

Converting from normalized incident energy:

$$E = C_f E_n \left(\frac{t}{0.2}\right)\left(\frac{610^x}{D^x}\right) \tag{6}$$

where,

E is incident energy (cal/cm$^2$)

$C_f$ is a calculation factor: 1.0 for voltages above 1 kV, and 1.5 for voltages at or below 1 kV t is arcing time (seconds)

D is distance from the possible arc point to the person (mm)

x is the distance exponent from Table 4 of IEEE 1584, or replacements thereof.

Figure 28:
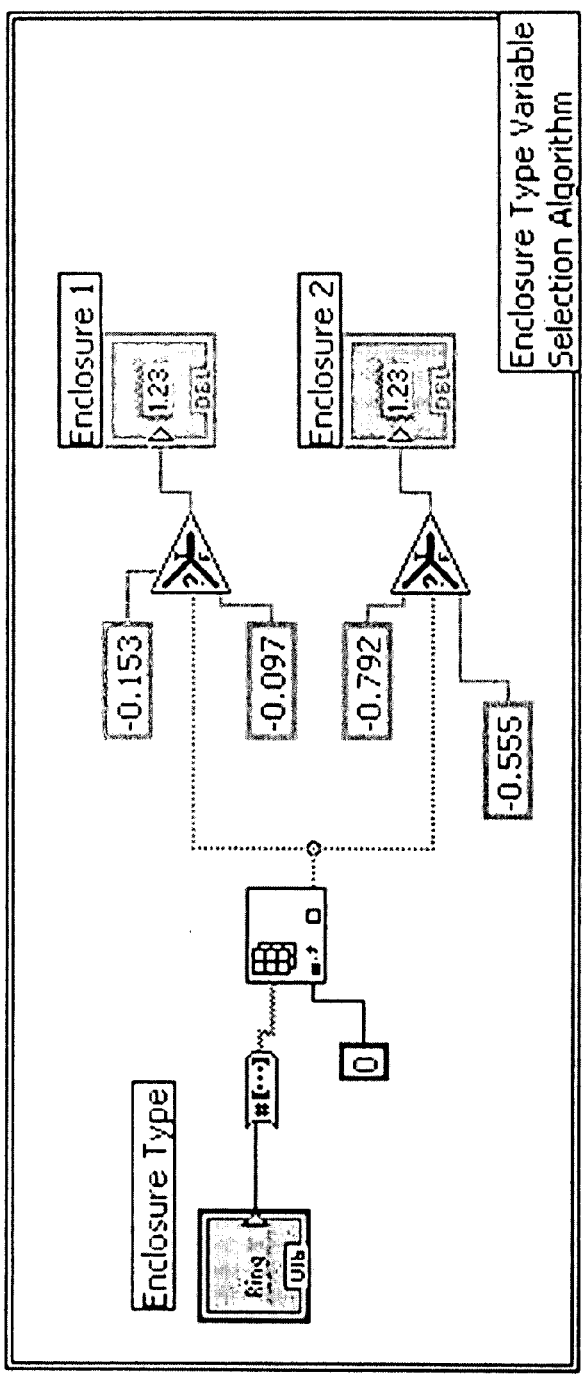
FIG. 28 is an illustration of an exemplary algorithm to select values for variables K and K1 based on enclosure type based on Equations 4 and 5.
Figure 29:
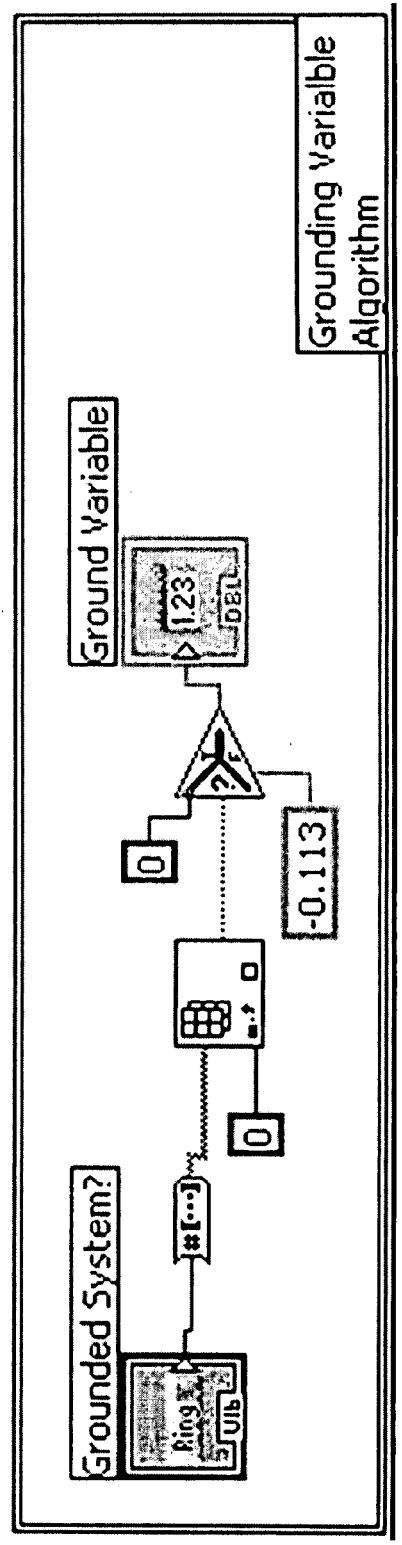
FIG. 29 is an illustration of an exemplary algorithm to select values for variable K2 based on presence or absence of a ground.

As noted in FIG. 9 and in the equations derived above, several selections are made to complete these calculations based on the equations shown above. For instance, selection of an open or closed configuration from the pull-down menu shown in FIG. 9 can result in one of two different values for the variable K in Equation 4. Similar decisions are made for $K_1$, $K_2$ and x. Algorithms to select values for these variables based on user specification are shown in given below in FIG. 28 (selection of variables K and $K_1$ based on enclosure type based on Equations 4 and 5); FIG. 29 (selection of variable K2 based on presence or absence of a ground); and FIG. 30 (selection of variable x based on equipment type).

After determining the incident energy in cal/cm$^2$, an algorithm determines the NFPA category number based on the values specified in NFPA 70E, Table 3-3.9.3, or replacements thereof. This algorithm generates the large number seen in the center of FIG. 9, $N_{NFPA\ Rating}$, and ranges from, for example, zero to four. This algorithm to determine NFPA rating category based on calculated incident energy is illustrated in FIG. 31 and the NFPA category number is based on the following table:

$$N_{NFPA\ Rating} = \begin{cases} 0 \le E_{Incident} < 1.2, & 0 \\ 1.2 \le E_{Incident} < 5, & 1 \\ 5 \le E_{Incident} < 8, & 2 \\ 8 \le E_{Incident} < 25, & 3 \\ 25 \le E_{Incident} < \infty, & 4 \end{cases}$$

Figure 32:
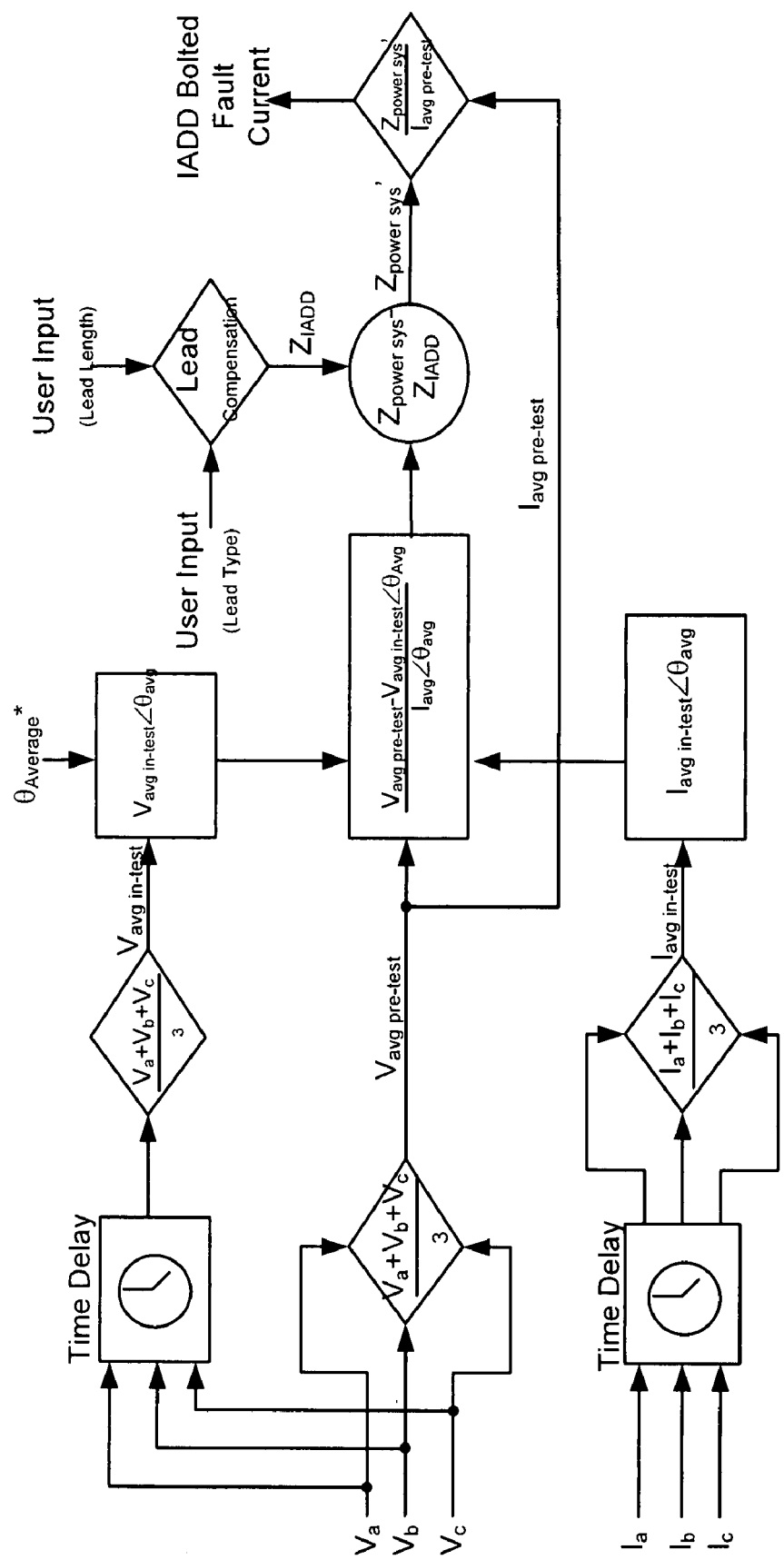
FIG. 32 illustrates a flow diagram for the steps to determine an NFPA category rating.

FIG. 32 illustrates a flow diagram for the steps described above to determine an NFPS category rating.

In one aspect, algorithms can be implemented in the IADD program to collect and store data into a file such as a comma separated variable (*.csv) format file. The algorithm can be executed every time a test is completed and the save data dialog box is marked. The first line written contains descriptive headers, defining what each column of data represents. This line is written once and is followed by data on the following line. Several data points have been selected for data collection including average pre- and In-Test currents and voltages, bolted fault current, X/R ratio and incident energy. Data is written successively after each test is completed. If the Finalize button is pushed, additional information on user settings is written to the file including the variables used in the incident energy calculations.

A. Qualitative Sensitivity Analysis on Phase Shift

Figure 33:
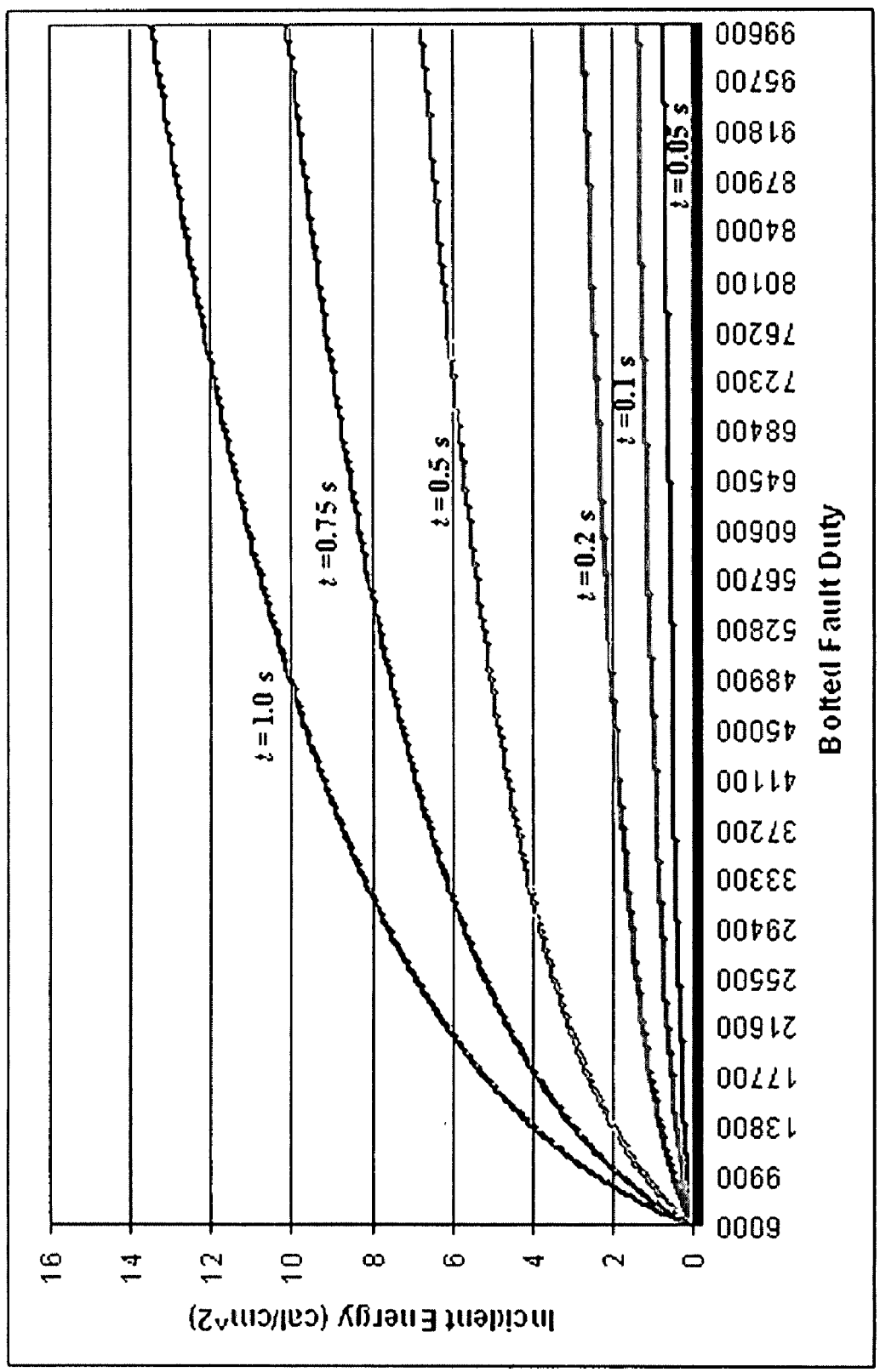
FIG. 33 illustrates incident energy as a function of bolted fault duty and primary protection trip times.

A qualitative analysis of sensitivity of measurement to the resultant fault duty and determined phase angle can be conducted by examining Equation 2, which defines the relationship between measured voltage drop and phase shift to calculated system impedance and X/R ratio. FIG. 33 illustrates the effect of voltage drop and phase shift detection on calculations, fault duty (system impedance) and X/R ratio.

The analysis is conducted by making generalizations of the information provided in FIG. 33 in a qualitative approach. FIG. 33 presents a series of curves that represent varying voltage drop in percent. From the graph, there is a correlation between percent voltage drop in systems with the system X/R ratio. However, in systems with X/R ratios greater than about 1.5, there is a linear region in which variations in detected phase shift do not significantly affect the final results.

If the error in phase detection given by Table II, below, is taken to be approximately the total detection error, then it can be seen that errors have a greater effect with respect to final results on a system with an X/R ratio less than 1.5.

Several other generalizations can be made based on these results. Systems with a high X/R ratio, greater than 10, exhibit invariance with respect to the amount of voltage drop applied to the system during test. This means that less voltage drop needs to be applied to highly inductive systems than those that are principally resistive in nature. Practically and typically, there is a strong correlation with system stiffness and X/R ratio, which means that for systems with a high X/R ratio, relatively large currents must be drawn to see even an incremental depression in voltage. Conversely, weak systems are typically resistive due to the fact that low voltage feeder impedance is typically resistance dominated.

There is also a correlation between current drawn and observed phase shift, this can be seen by evaluating a system with constant impedance. Where drawing sufficient current to result in a 1 percent drop in voltage, the observed phase shift is relatively low. When the voltage drop is increased, more current is drawing through the IADD and the phase shift increases.

When considering these factors, some general statements can be made. Less voltage drop, ergo less current is required to be drawn from the system when the X/R ratio is high to obtain a valid, stable result. More voltage drop is required when the systems X/R ratio is low. Unfortunately, as discussed above, a small drop in voltage on a system with high X/R ratio typically requires drawing significant current due to system stiffness. Obtaining voltage drop on systems with a high X/R ratio should be considered more feasible as these systems are typically considered to be weak as they are typically located well downstream of the source.

B. Qualitative Incident Energy Sensitivity Analysis

Resultant incident energy can be determined as a function of calculated bolted fault current and time to arc extension.

The graph of FIG. 33, incident energy as a function of bolted fault duty and primary protection trip times, shows that the final result is highly dependant upon the type and effectiveness of the protection scheme used in the circuit. For example, an arc extinction time of less than 50 milliseconds always yields a manageable amount of risk, so properly functioning primary protection should not result in serious, life threatening injury. The incident energy is also dependent on bolted fault duty, to a lesser degree, and increases more quickly at lower fault duty than at higher ones. One proper course of action to take, based on these results, would be to implement a Pn+1 technique. That is to obtain the maximum fault duty and specify protective equipment based on secondary protection tripping times in the range of minimum to maximum fault duty expected at the test location.

D. Quantitative Analysis of Error Introduced by Neutral Shift

Additional error can be introduced into calculated phase shift calculated due to the physical construction of the IADD. The IADD was initial built and tested on a grounded wye connected system, but may be applied to delta connected systems as well. If a delta system is not well balanced, the load's neutral point will drift with respect to ground. This shift results in skewed voltage measurements that can cause additional error in the phase shift calculations. This phenomenon was first observed after implementation of the graphs depicted in FIG. 16, which show phase angle variation in all three phases of the input voltage waveforms. It was noted that, when the IADD neutral is not solidly bonded to the power system's system neutral, unbalanced shifts in phase angle were observed. When the neutral was connected to the system neutral, the phase shifts are balanced in all three phases. This variation in phase angle between individual phases is attributed to neutral shift between the floating neutral of the IADD load bank and the actual system neutral. To determine the effect of neutral shift initially, several example cases were examined as shown in FIGS. 34A, 34B, 34C and 34D.

The cases shown in FIGS. 34A, 34B, 34C and 34D depict typical phase shift in the power system that may affect three phase average phase shift. Case 34A depicts the system in a balanced state that can be assumed to be the observed system when the neutral is solidly bonded to the resistive load bank. Under this condition, there should be no perceivable shift in neutral position when a load is imposed on the system. Conversely, cases 34B, 34C and 34D depict cases in which the system is still in a balanced condition, however, due to the floating neutral with respect to the load bank, a perceived shift in neutral is observed when the load is switched into the circuit.

Cases 34B and 34C exhibit no significant change in the three phase averaged phase shift using the equations implemented in the IADD software. Under conditions similar to those depicted in these examples, there would be no discernable difference in final calculations when compared to the system with a bonded neutral. Case 34D, however, would result in an error in measured phase shift by approximately 6% under the loading conditions shown. Based on these results, a more thorough analysis of the effect of neutral shift is presented in FIG. 35.

FIG. 35 depicts the phase A condition where neutral shift plays a factor in the overall determination of calculated phase shift as determined by the IADD. Assuming that at any given point in time, the magnitude of phase A is unity with a phase angle of 0 degrees, and an assumed phase shift of 5 degrees for the sake of simplification of analysis. The above notation is used to develop equations for Beta, the angle of the fundamental phase in the presence of neutral shifting.

$$1\angle 0° = V_{imbalance} \angle t_A + \alpha \angle \beta_A \tag{8}$$

$$1 = V_{imbalance}\cos(t_A) + V_{imbalance}\sin(t_A) + \alpha\cos(\beta_A) + \alpha\sin(\beta_A) \tag{9}$$

Separating sine and cosine terms yield:

$$1 = V_{imbalance}\cos(t_A) + \alpha\cos(\beta_A) \tag{10}$$

$$0 = V_{imbalance}\sin(t_A) + \alpha\sin(\beta_A) \tag{11}$$

From equation 10, solving for $\alpha$:

$$\alpha = \frac{1 - V_{imbalance}\cos(t_A)}{\cos(\beta_A)} \tag{12}$$

Substituting back into equation 9 yields:

$$1 = V_{imbalance}\cos(t_A) + V_{imbalance}\sin(t_A) + 1 - V_{imbalance}\cos(t_A) + [1 - V_{imbalance}\cos(t_A)]\tan(\beta_A) \tag{13}$$

$$0 = V_{imbalance}\sin(t_A) + [1 - V_{imbalance}\cos(t_A)]\tan(\beta_A) \tag{14}$$

Solving for $\beta_A$ yields:

$$\beta_A = \frac{\arctan[V_{imbalance}\sin(t_A)]}{[1 - V_{imbalance}\cos(t_A)]} \tag{15}$$

Making appropriate considerations for phases B and C yield the remaining phase angle functions with respect to time:

$$\beta_B = \frac{\arctan[V_{imbalance}\sin(t_A - 2\pi/3)]}{[1 - V_{imbalance}\cos(t_A - 2\pi/3)]} \tag{16}$$

$$\beta_C = \frac{\arctan[V_{imbalance}\sin(t_A + 2\pi/3)]}{[1 - V_{imbalance}\cos(t_A + 2\pi/3)]} \tag{17}$$

Figure 36A:
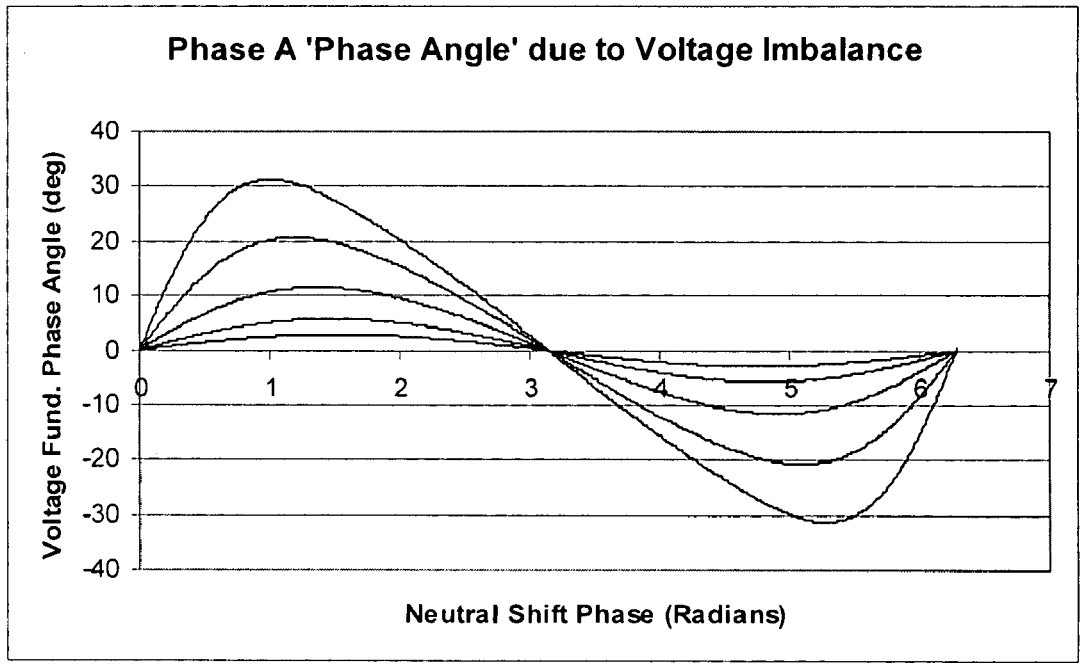
FIGS. 36A, 36B, 36C graphically illustrates non-linear equations that are evaluated below for selected values of $V_{imbalance}$ at 5%, 10%, 20%, 35% and 50% and as can be seen from the graphs of FIGS. 36A, 36B and 36C, the solution is highly sinusoidal when magnitude of imbalance is low (below 20%)
Figure 36B:
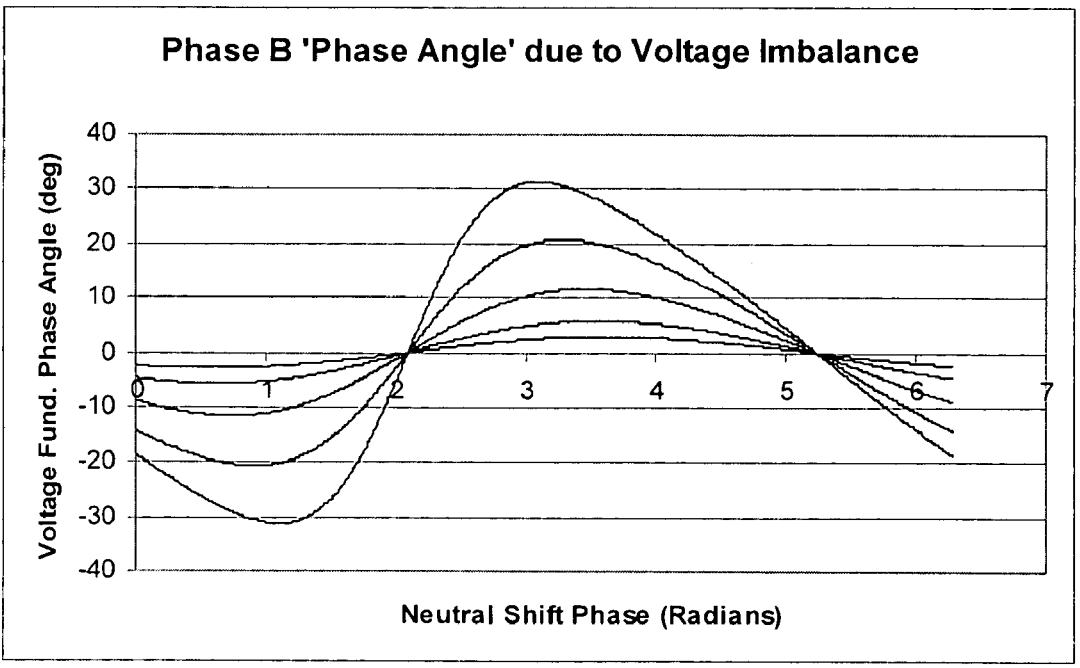
Figure 36C:
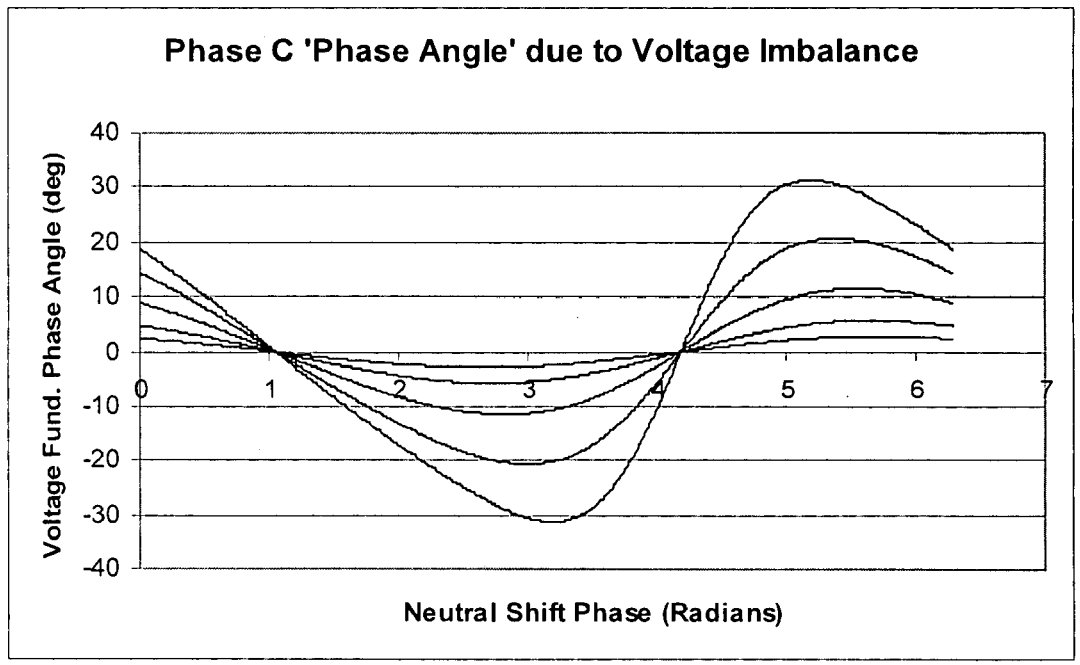

These are non-linear equations that are evaluated below for selected values of $V_{imbalance}$ at 5%, 10%, 20%, 35% and 50%. As can be seen from the graphs of FIGS. 36A, 36B and 36C, the solution is highly sinusoidal when magnitude of imbalance is low (below 20%). However, when the imbalance is high due to neutral shift, the resultant is no longer a sinusoidal wave, instead taking on the characteristics of the tangent function. This is due to the fact that the arctangent function is linear near the zero point and becomes increasingly non-linear with increased magnitude.

The graphs above represent the angle Beta described in FIG. 35. The angle and magnitude of the waveform shifted by IADD is arbitrary in this case because of three phase averaging of the waveforms. As defined by the arctangent forcing function, deviations from a sinusoidal wave are exponential in nature.

Figure 37:
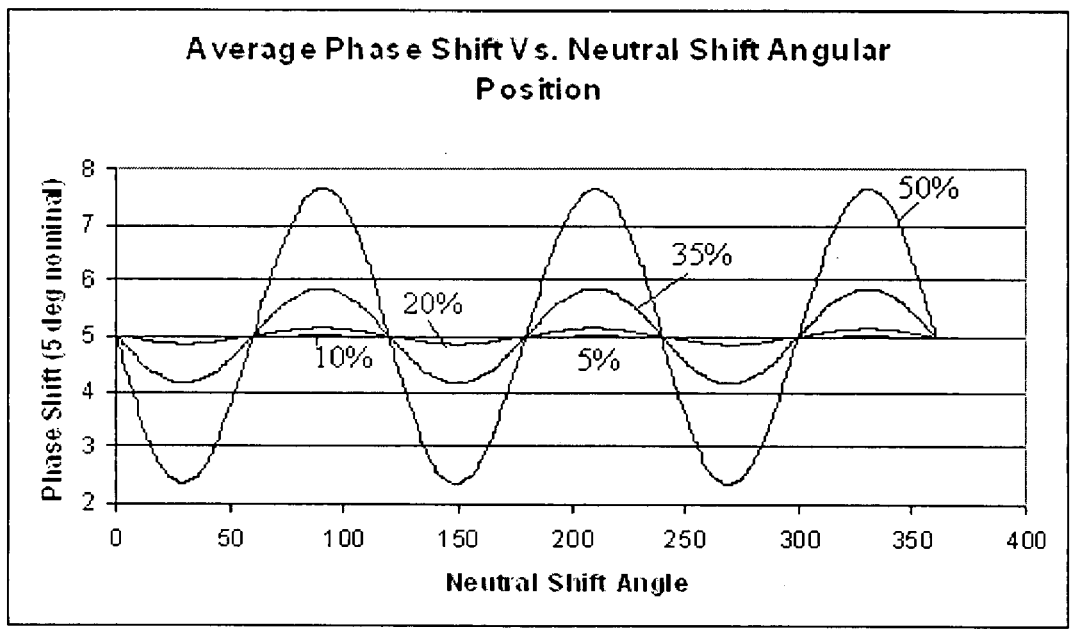
FIG. 37 shows average deviation from the nominal phase shift of 5 degrees.

The graph of FIG. 37 shows average deviation from the nominal phase shift of 5 degrees. The smallest variations about the center line represent the limit defined by the IADD program as voltage imbalance. Variations as much as 20% show variation less than 5 percent under these conditions.

Variation in three phase average phase shift exhibits a third harmonic component as would be expected in a three phase system with non-linear response and is obvious in the graph above. In considering the base case described in FIG. 35, the percent error is given for a 5 degree phase shift in the second column of Table II, below.

In normalizing the final result, the percent error is a function of the phase shift observed during testing. Once again, the magnitude of phase shift determines the accuracy of the IADD when there is no neutral bonding. Thus, the answer could conceivably be related to the percent loading condition previously investigated. Based on the results of this analysis, the error at the assumed limit of acceptable voltage imbalance is defined by the following equation:

$$\varepsilon = \frac{0.24\%}{\text{\# of degrees observed phase shift}} \tag{18}$$

TABLE II

| Percent Imbalance | Maximum Percent Error from Nominal | Maximum Percent Error/ Degrees |
|---|---|---|
| 5% | 0.05% | 0.24% |
| 10% | 0.38% | 1.92% |
| 20% | 3.10% | 15.48% |

TABLE II-continued

| Percent Imbalance | Maximum Percent Error from Nominal | Maximum Percent Error/ Degrees |
|---|---|---|
| 35% | 17.14% | 85.70% |
| 50% | 53.29% | 266.43% |

It is to be appreciated that the delta (line-to-line) voltage measurement described previously, used on ungrounded wye systems, will eliminate the need to consider this error analysis.

Computer Implementation

Figure 38:
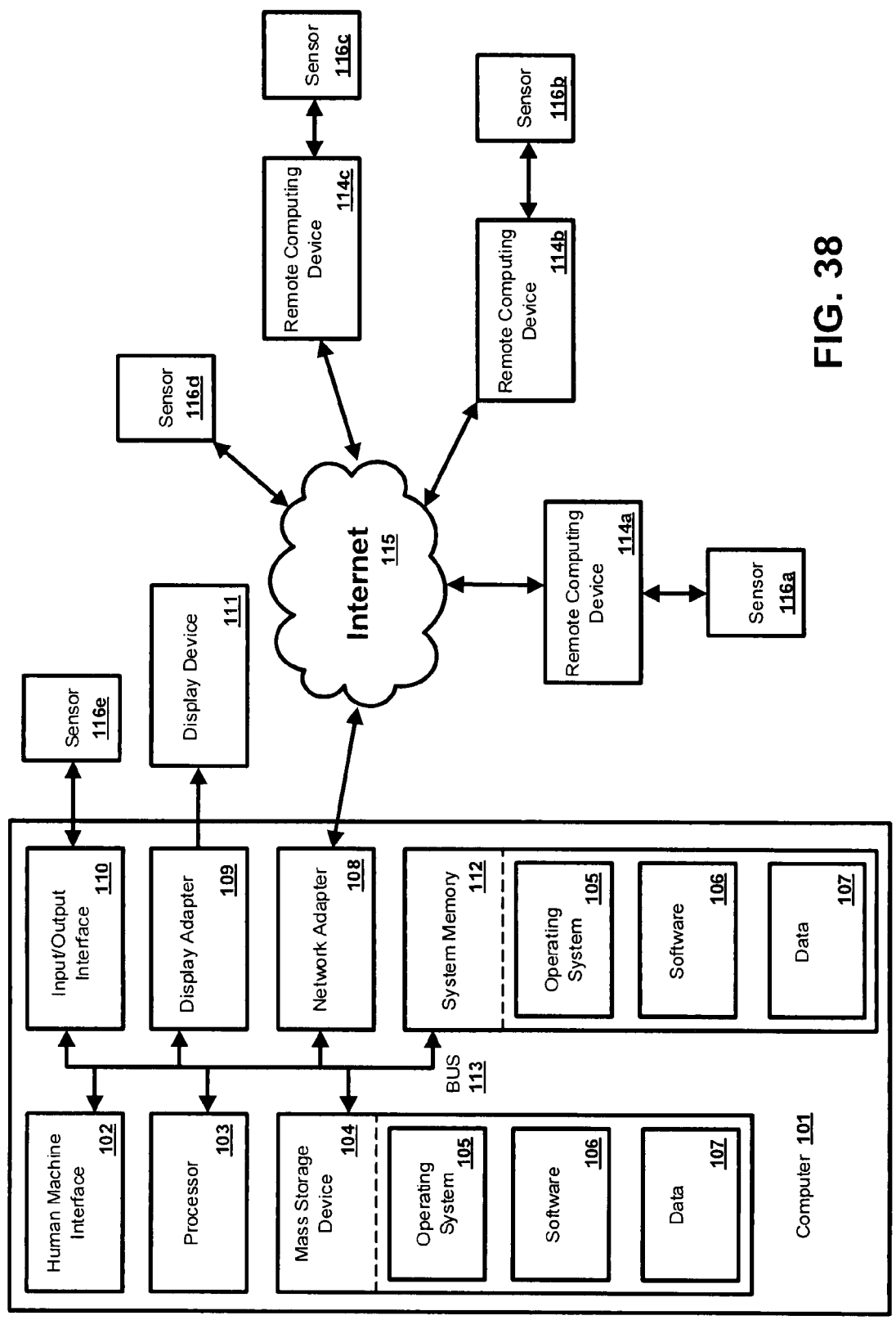
FIG. 38 is a block diagram illustrating an exemplary operating environment for performing the disclosed methods.

The system has been described above as comprised of algorithms and units. One skilled in the art will appreciate that this is a functional description and that the respective functions can be performed by software, hardware, or a combination of software and hardware. A unit can be software, hardware, or a combination of software and hardware and algorithms can be implemented by software, hardware, or a combination of software and hardware. The units can comprise the incident energy software 106 as illustrated in FIG. 38 and described below. In one exemplary aspect, the units can comprise a computer 101 as illustrated in FIG. 38 and described below.

FIG. 38 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the system and method comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed system and method can be described in the general context of computer-executable instructions, such as program modules, being executed by one or more computers or other devices. Generally, program modules comprise computer code, routines, programs, objects, components, data structures, etc. that perform particular tasks or implement particular abstract data types. In one aspect, the disclosed system and method can be implemented using LabView™ software as available from National Instruments Corporation. The disclosed method can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the system and method disclosed herein can be implemented via a general-purpose computing device in the form of a computer 101. The components of the computer 101 can comprise, but are not limited to, one or more processors or processing units 103, a system memory 112, and a system bus 113 that couples various system components including the processor 103 to the system memory 112. In the case of multiple processing units 103, the system can utilize parallel computing.

The system bus 113 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI) bus also known as a Mezzanine bus. The bus 113, and all buses specified in this description can also be implemented over a wired or wireless network connection and each of the subsystems, including the processor 103, a mass storage device 104, an operating system 105, incident energy software 106, fault current data 107, a network adapter 108, system memory 112, an Input/Output Interface 110, a display adapter 109, a display device 111, and a human machine interface 102, can be contained within one or more remote computing devices 114a,b,c at physically separate locations, connected through buses of this form, in effect implementing a fully distributed system.

The computer 101 typically comprises a variety of computer readable media. Exemplary readable media can be any available media that is accessible by the computer 101 and comprises, for example and not meant to be limiting, both volatile and non-volatile media, removable and non-removable media. The system memory 112 comprises computer readable media in the form of volatile memory, such as random access memory (RAM), and/or non-volatile memory, such as read only memory (ROM). The system memory 112 typically contains data such as fault-current data 107 and/or program modules such as operating system 105 and incident energy software 106 that are immediately accessible to and/or are presently operated on by the processing unit 103.

In another aspect, the computer 101 can also comprise other removable/non-removable, volatile/non-volatile computer storage media. By way of example, FIG. 38 illustrates a mass storage device 104 which can provide non-volatile storage of computer code, computer readable instructions, data structures, program modules, and other data for the computer 101. For example and not meant to be limiting, a mass storage device 104 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 104, including by way of example, an operating system 105 and incident energy software 106. Each of the operating system 105 and incident energy software 106 (or some combination thereof) can comprise elements of the programming and the incident energy software 106. Fault-current data 107 can also be stored on the mass storage device 104. Fault-current data 107 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 101 via an input device (not shown). Examples of such input devices comprise, but are not limited to, a keyboard, pointing device (e.g., a "mouse"), a microphone, a joystick, a scanner, tactile input devices such as gloves, and other body coverings, and the like. These and other input devices can be connected to the processing unit 103 via a human machine interface 102 that is coupled to the system bus 113, but can be connected by other interface and bus structures, such as a parallel port, game port, an IEEE 1394 Port (also known as a Firewire port), a serial port, or a universal serial bus (USB).

In yet another aspect, a display device 111 can also be connected to the system bus 113 via an interface, such as a display adapter 109. It is contemplated that the computer 101 can have more than one display adapter 109 and the computer 101 can have more than one display device 111. For example, a display device can be a monitor, an LCD (Liquid Crystal Display), or a projector. In addition to the display device 111, other output peripheral devices can comprise components such as speakers (not shown) and a printer (not shown) which can be connected to the computer 101 via Input/Output Interface 110.

The computer 101 can operate in a networked environment using logical connections to one or more remote computing devices 114a,b,c. By way of example, a remote computing device can be a personal computer, portable computer, a server, a router, a network computer, a peer device or other common network node, and so on. Logical connections between the computer 101 and a remote computing device 114a,b,c can be made via a local area network (LAN) and a general wide area network (WAN). Such network connections can be through a network adapter 108. A network adapter 108 can be implemented in both wired and wireless environments. Such networking environments are conventional and commonplace in offices, enterprise-wide computer networks, intranets, and the Internet 115.

For purposes of illustration, application programs and other executable program components such as the operating system 105 are illustrated herein as discrete blocks, although it is recognized that such programs and components reside at various times in different storage components of the computing device 101, and are executed by the data processor(s) of the computer. An implementation of incident energy software 106 can be stored on or transmitted across some form of computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any method or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1

Riggs Hall Test Site A

Upon completion of initial tests to determine viability of concept, the first IADD prototype was constructed in the PQIA lab. It is important to note here that this test was performed during the early stages of the IADD development, and the phase shift algorithms were less robust and non-linear transformers were used as the method of voltage detection.

The nameplate data on the transformer was given as 500 kVA, 12.47 kV-208/120Y V, with an impedance value of 5.66%. From industry tables for transformers of this type and size, the X/R ratio for this transformer is approximately 3.71. The cable from switchgear to the test panel in the PQIA laboratory was a 100 ft., four-wire run of 4/0 copper insulated conductor in aluminum conduit. From Table 9 of the NEC handbook, partially duplicated below, the impedance for this cable run was computed. The service impedance feeding the transformer was considered negligible because of the extremely high fault duty reported by university officials at the primary side of the transformer. The 12.47 kV fault duty for the transformer was reported as 9,780 A at the high voltage terminals of the transformer.

NEC-2000

TABLE 9

| AWG | Resistance/ 1000 ft | Reactance/ 1000 ft |
|---|---|---|
| 8 | 0.78 | 0.052 |
| 4/0 | 0.067 | 0.041 |

Which leads to the following impedance, reactance, resistance and fault-current calculations for the Riggs Hall system:

$$Z_{base} = \frac{208^2}{500000} = 0.086528 \text{ Ohms}$$

$$|Z_{Transformer}| = Z_{Base} \times 0.0566 = 0.0048975 \text{ Ohms}$$

-continued $$0.0048975 = \sqrt{(3.71 * R_{Trans})^2 + R_{Trans}^2} \rightarrow R_{Trans}$$
$$= 0.0012745 \text{ Ohms}$$

$$X_{Trans} = \sqrt{(0.0048975^2 - 0.0012745^2)} \rightarrow X_{Trans}$$
$$= 0.004728 \text{ Ohms}$$

$$Z_{Transformer} = 0.0012745 + j0.004728 \text{ Ohms}$$

$$Z_{Line} = \frac{120 \text{ ft}}{1000 \text{ ft}} \times (0.067 + j0.041) = 0.00804 + j0.00492 \text{ Ohms}$$

$$Z_{System} = Z_{Transformer} + Z_{Line} = 0.009315 + j0.009648 \text{ Ohms}$$

$$X/R = 1.036$$

$$Z_{Lead} = \frac{15 \text{ ft}}{1000 \text{ ft}} \times (0.78 + j0.052) = 0.0117 + j0.00078 \text{ Ohms}$$

$$Z_{Total} = Z_{System} + Z_{Lead} = 0.0210 + j0.01042 \text{ Ohms}$$

$$I_{bf} = \left| \frac{120}{0.0210 + j0.01042} \right| = 5112 \text{ Amps}$$

where, $I_{bf}$ is bolted fault current for three phase faults (symmetrical RMS) (kA).

A test was conducted at the Riggs Hall test location in which 25 random samples were taken over the course of one hour. The results of the test yielded positive results in terms of approximating the fault current magnitudes expected for a bolted fault. From the tests conducted using the IADD, the average bolted fault current value was 3792 amperes with an error from the expected value of 3.6 percent; the minimum reported value for the population was 2316 A and the maximum reported value for the population was 5022 A. The 95% confidence interval for the mean was 298 or 7.8.

The X/R ratio was calculated to be 1.036 from the above derivations. However, the test-determined average X/R ratio was 0.849, a lower value than expected, due to the wire and breaker impedance.

| Riggs Hall Test Data and Analysis | | |
|---|---|---|
| Test # | Current | X/R Ratio |
| 1 | 3584 | 0.994 |
| 2 | 3930 | 0.759 |
| 3 | 3295 | 1.15 |
| 4 | 3207 | 1.17 |
| 5 | 5022 | 0.212 |
| 6 | 4541 | 0.396 |
| 7 | 4711 | 0.43 |
| 8 | 4470 | 0.366 |
| 9 | 4205 | 0.562 |
| 10 | 2865 | 1.43 |
| 11 | 2316 | 1.9 |
| 12 | 4515 | 0.539 |
| 13 | 2968 | 1.37 |
| 14 | 3733 | 0.791 |
| 15 | 3096 | 1.27 |
| 16 | 4575 | 0.574 |
| 17 | 4125 | 0.689 |
| 18 | 3551 | 0.997 |
| 19 | 2991 | 1.19 |
| 20 | 3135 | 1.16 |
| 21 | 4439 | 0.449 |
| 22 | 4472 | 0.43 |
| 23 | 4231 | 0.482 |

-continued

| Riggs Hall Test Data and Analysis | | |
|---|---|---|
| 24 | 3002 | 1.15 |
| 25 | 3813 | 0.755 |

| Current Statistics | |
|---|---|
| Mean | 3791.6800 |
| Standard Error | 144.2298 |
| Median | 3813 |
| Standard Deviation | 721.1490 |
| Sample Variance | 520055.8933 |
| Kurtosis | −1.0413 |
| Skewness | −0.1844 |
| Range | 2706 |
| Minimum | 2316 |
| Maximum | 5022 |
| Confidence Level(95.0%) | 297.6757 |

| X/R Statistics | |
|---|---|
| Mean | 0.8486 |
| Standard Error | 0.0839 |
| Median | 0.7590 |
| Standard Deviation | 0.4194 |
| Sample Variance | 0.1759 |
| Kurtosis | −0.1609 |
| Skewness | 0.5754 |
| Range | 1.6880 |
| Minimum | 0.2120 |
| Maximum | 1.9000 |
| Confidence Level(95.0%) | 0.1731 |

To complete this study, the incident energy of such an arc is examined. These equations come from IEEE 1584 standard that are presented above. Some assumptions are made in this example to give a final numerical result. These assumptions are stated in IEEE 1584 as standard values and working conditions for typical installations under 1000 V. The typical working distance is 455 mm (18 in.) for panel work. The typical gap spacing between conductors is 25 mm (1 in.). The Riggs Hall test location is considered an enclosed panel or MCC and the nominal system voltage is 208 V.

$$\log I_a = -0.097 + 0.39343 + 0.0201 + 0.01315 + 0.06908 - 0.045167$$
$$= 0.35359$$

$$I_a = 10^{\log I_a} = 2.2573 \text{ kA}$$

$$\log E_n = -0.555 - 0.113 + 1.081 \times 0.35359 + 0.0011 \times 25$$
$$= -0.25827$$

$$E_n = 10^{\log E_n} = 0.551734$$

$$E = (1.5)(0.551734)\left(\frac{0.05}{0.2}\right)\left(\frac{610^{1.641}}{455^{1.641}}\right) = 0.335 \text{ cal/cm}^2$$

From the assumptions made above, a worker would not sustain second degree burns from an arc sustained for 50 ms and standing 18 inches from the electrical panel. This panel would be rated as a category 0 safety hazard as defined by the NFPA 70E document, under these conditions and the worker would be required to wear untreated cotton clothing in addition to any other PPE normally mandated in an industrial environment. Of course, this does not mean that the panel is clear to work in without observing standard safety procedures and injury may still occur to the hands, which will undoubtedly be closer than the specified working distance used in the equations. Sturdy leather or rubber gloves should still be worn to prevent possible injury.

| Factors For Equipment And Voltage Classes. Source: IEEE-1584, Table 4. | | | |
|---|---|---|---|
| System voltage (kV) | Equipment type | Typical gap between conductors (mm) | Distance x factor |
| 0.208-1 | open air | 10-40 | 2.000 |
| | Switchgear | 32 | 1.473 |
| | MCC aad panels | 25 | 1.641 |
| | Cable | 13 | 2.000 |
| >1-5 | Open air | 102 | 2.000 |
| | Switchgear | 13-102 | 0.973 |
| | Cable | 13 | 2.000 |
| >5-15 | Open air | 13-153 | 2.000 |
| | Switchgear | 153 | 0.973 |
| | Cable | 13 | 2.000 |

Example 2

Riggs Hall 500 KVA, 480 V Test Site

This test site is also located in the sub-basement of Riggs Hall. A 500 KVA, 480V transformer is located outside of Riggs Hall and feeds the sub-basement 480V buss exclusively. These facts make this source particularly stable and immune to load variation and harmonic distortion typically seen on the Riggs Hall 208V system.

Figure 39:
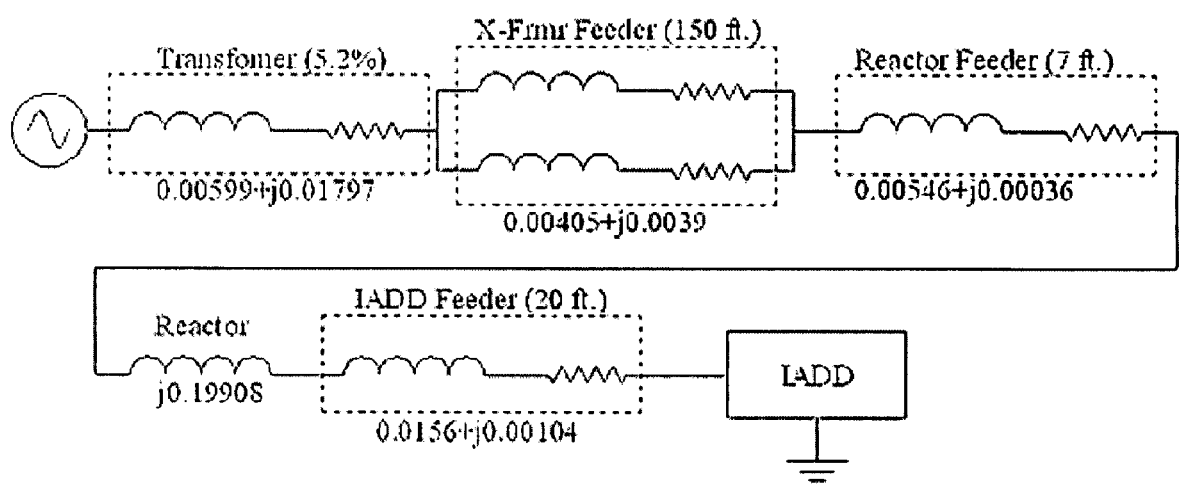
FIG. 39 illustrates the impedances of the system for Example 2.

The transformer feeds the 480V buss via parallel runs of 250 kcmil stranded copper wire estimated at 150 feet in length. The IADD interfaces the buss through a disconnect and runs 7 feet to a line reactor rated at 600V, 87 amperes. An additional 20 foot of 8 gauge wire connected the reactor to the IADD. FIG. 39 illustrates the impedances of the system for this example.

$$Z_{System} = Z_{Transformer} + Z_{T-Feeder} + X_{Reactor} + Z_{IADD-Feeder}$$
$$= 0.0311 + j0.22235$$

$$I_{bf} = \left| \frac{277}{0.0311 + j0.22235} \right| = 1.233 \text{ kA}$$

$$X/R = 7.15$$

Example 2 Results

| Test # | Current | X/R Ratio |
|---|---|---|
| 1 | 959 | 3.182 |
| 2 | 985 | 3.122 |
| 3 | 973 | 3.106 |
| 4 | 945 | 3.189 |
| 5 | 1047 | 2.901 |
| 6 | 936 | 3.221 |
| 7 | 947 | 3.131 |
| 8 | 974 | 3.122 |
| 9 | 1018 | 3.041 |
| 10 | 1007 | 3.032 |
| 11 | 955 | 3.159 |
| 12 | 988 | 3.082 |
| 13 | 977 | 3.076 |
| 14 | 936 | 3.137 |
| 15 | 1004 | 3.050 |
| 16 | 984 | 3.031 |
| 17 | 1011 | 3.068 |
| 18 | 928 | 3.208 |
| 19 | 1018 | 3.026 |
| 20 | 957 | 3.136 |
| 21 | 963 | 3.118 |
| 22 | 1011 | 3.051 |
| 23 | 950 | 3.144 |
| 24 | 995 | 3.081 |
| 25 | 983 | 3.055 |

| Current Statistics | |
|---|---|
| Mean | 978.0046 |
| Standard Error | 6.1201 |
| Median | 976.6590 |
| Standard Deviation | 30.6006 |
| Sample Variance | 936.3965 |
| Kurtosis | −0.5693 |
| Skewness | 0.2902 |
| Range | 118.3430 |
| Minimum | 928.3510 |
| Maximum | 1046.6940 |
| Confidence Level(95.0%) | 12.6313 |
| X/R Statistics | |
| Mean | 3.0988 |
| Standard Error | 0.0140 |
| Median | 3.1060 |
| Standard Deviation | 0.0702 |
| Sample Variance | 0.0049 |
| Kurtosis | 1.2636 |
| Skewness | −0.5688 |
| Range | 0.3200 |
| Minimum | 2.9010 |
| Maximum | 3.2210 |
| Confidence Level(95.0%) | 0.0290 |

This test results in very stable, predictable results, with little variation from test to test. The test was also conducted at two different current levels and similar results were seen in both cases. Discrepancies in results have initially been attributed to unaccounted resistances in the connections and reactor used in the test. Removing the reactor has the expected result of reducing the observed X/R ratio and increasing the fault duty to approximately 5 kA.

Additional testing was conducted at this site in an attempt to gauge the effect of changes to certain parameters commonly configurable in the test system. Three series of tests were conducted to examine three conditions:

Condition 1: IADD connected to the four wire system presented above and tying the neutral of the resistive load bank to the system neutral. This serves as the base case for comparison.

Condition 2: IADD connected to the four wire system without bonding the neutral of the load to the system neutral.

Condition 3: IADD connected to the four wire system with neutral bonding and operating in extended mode.

Statistical Results Of The Three Conditions Described Above

|  | Condition 1 Bonded Load Neutral | | | Condition 2 Unbonded Load Neutral | | | Condition 3 Bonded Neutral Extended Mode Operation | | |
|---|---|---|---|---|---|---|---|---|---|
|  | Bolted Fault Current | X/R Ratio | Incident Energy | Bolted Fault Current | X/R Ratio | Incident Energy | Bolted Fault Current | X/R Ratio | Incident Energy |
| Mean | 8692.80 | 2.47 | 3.64 | 8394.43 | 2.54 | 3.53 | 8691.79 | 2.16 | 3.64 |
| Standard Error | 102.80 | 0.03 | 0.04 | 102.78 | 0.04 | 0.04 | 66.08 | 0.02 | 0.03 |
| Median | 8671.12 | 2.53 | 3.63 | 8537.49 | 2.59 | 3.58 | 8678.11 | 2.15 | 3.63 |
| Standard Deviation | 471.07 | 0.14 | 0.18 | 471.01 | 0.19 | 0.18 | 302.84 | 0.10 | 0.12 |
| Range | 2154.13 | 0.57 | 0.83 | 1676.06 | 0.63 | 0.65 | 985.70 | 0.40 | 0.38 |
| Minimum | 7384.59 | 2.24 | 3.13 | 7375.38 | 2.17 | 3.13 | 8197.65 | 1.96 | 3.45 |
| Maximum | 9538.71 | 2.80 | 3.96 | 9051.44 | 2.80 | 3.78 | 9183.35 | 2.36 | 3.83 |
| Confidence Level(95.0%) | 214.428 | 0.066 | 0.082 | 214.402 | 0.088 | 0.083 | 137.850 | 0.044 | 0.053 |

The above chart presents statistical analysis of the first 21 successful tests obtained using the IADD on the system described in FIG. 40. Two notable differences in the system parameters should be noted, the line reactor used in previous tests was removed during the testing and measurement lead wire compensation was used as described herein.

Using the system presented above and removing the appropriate impedances yields the following calculations:

$$I_{bf} = \frac{277}{0.00599 + j0.01797 + 0.00405 + j0.0039} = 11510 \angle -65.34°$$

$$|I_{bf}| = 11.51 \text{ kA}, \frac{X}{R} = 2.18$$

In this example, the results disagree with this assessment by several thousand kilo-amps availability attributed to some additional information not readily available. The input impedance of the power system behind the transformer is in question. The availability was reported to be over 12 kA on the high voltage side. This value is more than likely an overestimation of system capability to ensure safety regarding protective devices, which explains discrepancies on the 208V system measurements.

A distribution of results shows a high degree of repeatability in the bolted fault current estimation reported by the IADD under all testing conditions.

The largest variation between test conditions is observed in the calculated X/R ratio reported. This calculation is highly sensitive to small variations in detected phase shift as was presented previous. The discrepancies noted between conditions 1, 2 and 3 can result if calculated impedance values differ by one mΩ. The bonded system had an average detected phase shift of 0.8560 degrees, the un-bonded system had an average detected phase shift of 0.8886 degrees and the IADD running in extended mode had an average detected phase shift of 1.6824 degrees. This result is exactly as expected when twice the current is drawn from the system, it should be expected that approximately twice the phase shift is observed.

These results confirm that the system is consistently measuring phase shift from one condition to another.

While the methods and systems have been described in connection with preferred embodiments and specific examples, it is not intended that the scope be limited to the particular embodiments set forth, as the embodiments herein are intended in all respects to be illustrative rather than restrictive. For instance, while generally described herein as a system and method for determining arc energy for safety purposes and classification, other applications include, for example, capacitor/filter Bank studies, motor/drive studies, power quality studies, etc.

Sizing of capacitor banks often requires a site study to find these parameters in an effort to mitigate resonances that may occur and are typical in RLC circuits. Sometimes these studies do not take all factors into account and resonances occur anyway. This situation can result in costly additional expenses to design, build, and install filter units to correct for resonance. The use of the IADD as a device to determine possible resonance issues by examining the effective system impedance at the proposed installation site can help mitigate some of these expenses as well as providing capacitor bank designers with a more accurate model of the effective impedance when designing capacitor banks or filters.

In installations involving large motor/drives, the input impedance can be important for several reasons. Motor starting has an adverse effect on power quality, particularly at sites that are at the end of a long feeder and are considered "weak". Motor starts can cause large dips in the voltage (so called "flicker") because of the reduced impedance of the motor during speed-up. Knowledge of the upstream impedance at a potential installation site would help in designing and sizing the proper protective and compensative equipment to combat this problem.

Using the PCI-6123 data acquisition card, the IADD has the ability to become a high quality power quality (PQ) monitor. By replacing the current inputs with standard clamp-on style CTs, the IADD could be used as a PQ monitor, adding additional functionality to the device.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A test device comprised of:
   a load bank;
   voltage measurement circuitry and devices;
   current measurement circuitry and devices;
   relaying and switching devices; and
   data acquisition, measurement and control devices comprising at least one processor and a memory operably connected with said voltage measurement circuitry and devices, current measurement circuitry and devices, and relaying and switching devices, wherein said test device is configured to
   (i) determine a first set of results comprised of at least a first voltage and first current and a first phase angle of an electrical node on an electrical power system and store the first set of results in the memory,
   (ii) operably connect the load bank to the electrical power system at the electrical node using said switching devices and determine a second set of results comprised of at least a second voltage, second current and a second phase angle of said electrical power system at said electrical node, and
   (iii) retrieve the first set of results from said memory and compare the first set of results to the second set of results to determine at least one of an effective Thevenin equivalent circuit or Norton equivalent circuit for the electrical power system.

2. The test device of claim 1, wherein the test device is further configured to:
   (iv) store said second set of results in the memory;
   (v) operably disconnect the load bank from the electrical power system at the electrical node using said switching devices and determine a third set of results comprised of at least a third voltage, third current and a third phase angle of said electrical power system at said electrical node, and
   (vi) retrieve either the first set of results or the second set of results from said memory and compare the third set of results to either the first set of results or the second set of results to determine an effective Thevenin equivalent circuit or Norton equivalent circuit for the electrical power system.

3. The test device of claim 2, wherein the test system is further configured to determine a bolted fault current at the electrical node from the effective Thevenin equivalent circuit or Norton equivalent circuit.

4. The test device of claim 3, wherein the test system is further configured to determine fault incident energy available at the electrical node.

5. The test device of claim 4, wherein the test system is further configured to assign a hazard risk category based on the fault incident energy available at the electrical node.

6. The test device of claim 5, wherein the hazard risk category is determined by the National Fire Protection Association (NFPA) 70E standard.

7. The test device of claim 4, wherein fault incident energy available at the electrical node is determined using calculations described in Institute of Electrical and Electronic Engineers (IEEE) standard 1584.

8. The test device of claim 2, wherein the test system is further configured to determine one or more of resistive and reactive parameters, or an X/R ratio at the electrical node from the effective Thevenin equivalent circuit or Norton equivalent circuit.

9. The test device of claim 1, wherein the load bank is a resistive load bank.

10. The test device of claim 1, wherein the voltage measurement circuitry and devices comprise optically isolated voltage probes.

11. The test device of claim 1, wherein the current measurement circuitry and devices comprise externally powered Hall-effect current transformers.

12. The test device of claim 1, wherein the data acquisition, measurement and control devices further comprise a data acquisition card operably connected with the processor.

13. The test device of claim 1, wherein the electrical power system comprises a three-phase electrical power system.

14. A testing method comprising:
   determining a first set of results comprised of at least a first voltage, a first current and a first phase angle of an electrical node on an electrical power system;
   connecting a load to the electrical power system at the electrical node;
   determining a second set of results comprised of at least a second voltage, a second current and a second phase angle of the electrical power system at the electrical node;
   disconnecting the load bank from the electrical power system at the electrical node;
   determining a third set of results comprised of at least a third voltage, a third current and a third phase angle of said electrical power system at said electrical node from the third voltage and third current; and
   comparing the first set of results to either the second set of results or the third set of results, or comparing the second set of results to the third set of results to determine at least one of an effective Thevenin equivalent circuit or Norton equivalent circuit for the electrical power system.

15. The method of claim 14, further comprising determining a bolted fault current at the electrical node from the effective Thevenin equivalent circuit or Norton equivalent circuit.

16. The method of claim 15, further comprising determining fault incident energy available at the electrical node.

17. The method of claim 16, further comprising assigning a hazard risk category based on the fault incident energy available at the electrical node.

18. The method of claim 17, wherein the hazard risk category is determined by the National Fire Protection Association (NFPA) 70E standard.

19. The method of claim 16, wherein fault incident energy available at the electrical node is determined using calculations described in Institute of Electrical and Electronic Engineers (IEEE) standard 1584.

20. The method of claim 14, wherein the test system is further configured to determine one or more of resistive and reactive parameters, or an X/R ratio at the electrical node from the effective Thevenin equivalent circuit or Norton equivalent circuit.

21. The method of claim 14, wherein comparing the first set of results to either the second set of results or the third set of results, or comparing the second set of results to the third set of results to determine at least one of an effective Thevenin equivalent circuit or Norton equivalent circuit for the electrical power system comprises comparing the first set of results to the third set of results to assess any changes in system impedance while determining the second set of results.

22. A computer program product for determining arc fault energy in an electrical power system, wherein the computer program product comprises at least one computer-readable storage medium having computer-readable program code portions stored therein, the computer-readable program code portions comprising:

a first executable portion for receiving a first set of results comprised of at least a first voltage, a first current and a first phase angle determined by the first executable portion from the first voltage and first current of an electrical node on an electrical power system;

a second executable portion for receiving a second set of results comprised of at least a second voltage, a second current and a second phase angle determined by the second executable portion from the second voltage and second current of the electrical power system at the electrical node after connecting a load to the electrical power system at the electrical node;

a third executable portion for receiving a third set of results comprised of at least a third voltage, a third current and a third phase angle determined by the third executable portion from the third voltage and third current of the electrical power system at the electrical node after disconnecting the load to the electrical power system at the electrical node;

a fourth executable portion for comparing the first set of results to either the second set of results or the third set of results, or comparing the second set of results to the third set of results to determine at least one of an effective Thevenin equivalent circuit or Norton equivalent circuit for the electrical power system; and a fifth executable portion for determining a bolted fault current at the electrical node from the effective Thevenin equivalent circuit or Norton equivalent circuit and determining fault incident energy available at the electrical node.

23. The computer program product of claim 22, wherein the fifth executable portion is further configured to determine one or more of resistive and reactive parameters, or an X/R ratio at the electrical node from the effective Thevenin equivalent circuit or Norton equivalent circuit.

24. The computer program product of claim 22, wherein the fifth executable portion further comprises assigning a hazard risk category based on the fault incident energy available at the electrical node.

25. The computer program product of claim 24, wherein the fifth executable portion determines the hazard risk category by the National Fire Protection Association (NFPA) 70E standard.

26. The computer program product of claim 22, wherein the fifth executable portion determines fault incident energy available at the electrical node by using calculations described in Institute of Electrical and Electronic Engineers (IEEE) standard 1584.

27. A test device for determining fault incident energy available at an electrical node of an electrical power delivery system comprised of:

means for connecting or disconnecting a load bank to the electrical node;

means for voltage measurement at the electrical node;

means for current measurement at the electrical node; and processor means for data acquisition, measurement and control, wherein said processor means (i) receives a first set of results comprised of at least a first voltage value and a first current value from said voltage and current measurement means and the first set of results further comprised of at least a first phase angle determined by said processor means from the first voltage and the first current of the electrical node, (ii) receives a second set of results comprised of at least a second voltage value and a second current value from said voltage and current measurement means after the load bank has been operably connected to the electrical node by the connecting or disconnecting means and the second set of results further comprised of at least a second phase angle determined by said processor means from the second voltage and the second current of the electrical node, (iii) receives a third set of results comprised of at least a third voltage value and a third current value from said voltage and current measurement means after the load bank has been operably disconnected from the electrical node by the connecting or disconnecting means and the third set of results further comprised of at least a third phase angle determined by said processor means from the third voltage and the third current of the electrical node, (iv) compares the first set of results to either the second set of results or the third set of results, or compares the second set of results to the third set of results to determine at least one of an effective Thevenin equivalent circuit or Norton equivalent circuit for the electrical node, (v) determines a bolted fault current at the electrical node from the effective Thevenin equivalent circuit or Norton equivalent circuit, and (vi) determines fault incident energy available at the electrical node.

28. The test device of claim 27, wherein the processor means is further configured to determine one or more of resistive and reactive parameters, or an X/R ratio at the electrical node from the effective Thevenin equivalent circuit or Norton equivalent circuit.

29. The test device of claim 27, wherein the processor means assigns a hazard risk category based on the fault incident energy available at the electrical node.

30. The test device of claim 29, wherein the hazard risk category is determined by the National Fire Protection Association (NFPA) 70E standard.

31. The test device of claim 27, wherein said processor means determines fault incident energy available at the electrical node by using calculations described in Institute of Electrical and Electronic Engineers (IEEE) standard 1584.

32. The test device of claim 27, wherein the load bank is a resistive load bank.

33. The test device of claim 27, wherein means for voltage measurement at the electrical node comprise optically isolated voltage probes.

34. The test device of claim 27, wherein means for current measurement at the electrical node comprise externally powered Hall-effect current transformers.

35. The test device of claim 27, wherein processor means for data acquisition, measurement and control further comprise a data acquisition card operably connected with the processor means.

36. The test device of claim 27, wherein the electrical power delivery system comprises a three-phase electrical power system.

* * * * *